US006770527B2

(12) United States Patent
Shukuri et al.

(10) Patent No.: US 6,770,527 B2
(45) Date of Patent: Aug. 3, 2004

(54) SEMICONDUCTOR INTEGRATED CIRCUIT DEVICE AND METHOD OF MANUFACTURING THE SAME

(75) Inventors: Shoji Shukuri, Koganei (JP); Kenichi Kuroda, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/294,712

(22) Filed: Nov. 15, 2002

(65) Prior Publication Data

US 2003/0068857 A1 Apr. 10, 2003

Related U.S. Application Data

(63) Continuation of application No. 09/330,198, filed on Jun. 11, 1999, now Pat. No. 6,541,333.

(30) Foreign Application Priority Data

Jun. 12, 1998 (JP) .......................................... 10-164639

(51) Int. Cl.[7] .......................................... H01L 21/8242

(52) U.S. Cl. ........................ 438/243; 438/244; 438/586

(58) Field of Search ......................... 438/239, 243–244, 438/253, 586, 624, 629

(56) References Cited

U.S. PATENT DOCUMENTS

| | | | | |
|---|---|---|---|---|
| 5,721,154 | A | 2/1998 | Jeng | 438/253 |
| 5,780,339 | A | 7/1998 | Liu et al. | 438/253 |
| 5,804,479 | A | 9/1998 | Aoki et al. | 438/253 |
| 5,953,609 | A | 9/1999 | Koyama et al. | 438/253 |
| 5,981,378 | A | 11/1999 | Bothra | 438/637 |
| 6,008,119 | A | 12/1999 | Fournier | 438/633 |
| 6,037,211 | A | 3/2000 | Jeng et al. | 438/253 |
| 6,541,333 | B2 * | 4/2003 | Shukuri et al. | 438/243 |

* cited by examiner

*Primary Examiner*—Phat X. Cao
*Assistant Examiner*—Theresa T. Doan
(74) *Attorney, Agent, or Firm*—Antonelli, Terry, Stout & Kraus, LLP

(57) ABSTRACT

In a DRAM having information storage capacitative elements over their corresponding bit lines BL, wiring grooves are defined in an insulating film for wire or interconnection formation, which are formed over a gage electrode serving as word lines of the DRAM. Sidewall spacers are formed on their corresponding side walls of the wiring grooves. Each bit line BL and a first layer interconnection composed of a tungsten film are formed so as to be embedded in the wiring grooves whose intervals are respectively narrowed by the sidewall spacers. The bit lines BL are respectively connected to a semiconductor substrate through connecting plugs. The bit lines BL and the connecting plugs are respectively connected to one another at the bottoms of the wiring grooves.

7 Claims, 67 Drawing Sheets

SEMICONDUCTOR INTEGRATED CIRCUIT DEVICE AND METHOD OF MANUFACTURING THE SAME

CROSS-REFERENCE TO RELATED APPLICATIONS

This application is a Continuation application of application Ser. No. 09/330,198, filed Jun. 11, 1999, now U.S. Pat. No. 6,541,333.

BACKGROUND OF THE INVENTION

The present invention relates to a semiconductor integrated circuit device and to a technique for the manufacture thereof, and, more particularly, the invention relates to a technique which is effective for application to a dynamic random access memory (DRAM) requiring a storage holding operation, and which is suitable for high integration.

DRAMs are commonly classified as a trench type or a stacked type relative to their basic structures. The trench type is one wherein information storage capacitative elements (capacitors) are formed inside trenches defined in a substrate, whereas the stacked type is one wherein information storage capacitative elements are formed above transfer transistors (memory cell selection MISFETs (Metal Insulator Semiconductor Field Effect Transistors)) on the surface of a substrate. The stacked type is further classified into a CUB (Capacitor Under Bit-line) type wherein information storage capacitative elements are placed below bit lines and a COB Capacitor Over Bit-line) type wherein they are placed thereabove. Products of 64 Mbits or more, which currently are being mass produced, are respectively of the stacked type and are characterized by excellent reduction of the cell area. The COB type is becoming a mainstream device.

A structure of a DRAM having COB type memory cells is as follows.

Namely, the memory cells of the DRAM having the COB type memory cells are respectively placed at points where a plurality of word lines intersect with a plurality of bit lines disposed over a main or principal surface of a semiconductor substrate in matrix form. Each memory cell comprises one memory cell selection MISFET and one information storage capacitative element electrically directly connected to it. The memory cell selection MISFET is formed in an active area or region whose periphery is surrounded by device or element separation regions, and principally comprises a gate oxide film, a gate electrode formed integrally with each word line, and a pair of semiconductor regions constituting a source and a drain. The bit line is placed above the memory cell selection MISFET and is electrically connected to one of a source and drain shared between adjacent memory cell selection MISFETs aligned in the direction in which the memory cell selection MISFET extends. The information storage capacitative element is similarly placed above the memory cell selection MISFET and is electrically connected to the other of the source and drain. In order to replenish a reduction in the stored amount of electrical charge (Cs) of each information storage capacitative element, incident to a micro-fabrication of each memory cell, a lower electrode (storage electrode) of the information storage capacitative element placed above the bit line is processed into cylindrical form to thereby increase its surface area, and a capacitive insulating film and an upper electrode (plate electrode) are formed thereabove.

SUMMARY OF THE INVENTION

If the area of each memory cell of the conventional DRAM is designed so as to take up a minimum space, it is then necessary to form connecting hole (hereinafter called capacitive-electrode connecting hole) patterns for connecting the lower electrodes of the information storage capacitative elements to the active regions or the connecting plugs on the active regions and bit line patterns in minimum processing sizes. However, a large problem occurs in terms of their processing in order to form these patterns in the minimum processing sizes. This will be explained below with reference to the drawings. FIG. 72 is a cross-sectional view for describing the problem on the processing of each capacitive-electrode connecting hole and shows a cross section of a memory cell portion as seen in the direction orthogonal to the direction in which each bit line extends.

Namely, when each memory cell of a DRAM includes an active region 203 surrounded by separation areas or regions 202 of a main or principal surface of a semiconductor substrate 201, a semiconductor region 204 which is formed over the active region 203 and serves as the source and drain of a memory cell selection MISFET, a connecting plug 205 formed over the semiconductor region 204, an information storage capacitative element C formed over the active region 203 and composed of an upper electrode 206, a capacitive insulating film 207 and a lower electrode 208, and a bit line 209 formed between the connecting plug 205 and the information storage capacitative element C as shown in FIG. 72(*a*). It is necessary to form the active region 203, the bit line 209, and the capacitive-electrode connecting hole 210 for connecting the connecting plug 205 and the lower electrode 208 in minimum processing sizes for the purpose of forming each memory cell of the DRAM in a minimum processing size. However, a margin 211 for alignment with the bit line 209 at the processing of the capacitive-electrode connecting hole 210 cannot be ensured sufficiently. Therefore, there is a possibility that the lower electrode 208 and the bit line 209 will be short-circuited due to a displacement in alignment or a variation in processing size. As a result, the probability that a reduction in manufacturing yield will occur, increases.

To avoid such a problem, there is provided a method of effecting the processing of the capacitive-electrode connecting hole 210 on the bit line 209 on a self-alignment basis. This is a method of covering an upper portion of each bit line 209 with a silicon nitride film 212, protecting the sides of the bit line 209 with sidewall spacers 213 composed of the silicon nitride film, controlling or adjusting etching conditions upon etching of silicon oxide films 214 and 215 by patterns for the capacitive-electrode connecting holes 210 to set a selection ratio of the silicon nitride film to each silicon oxide film sufficiently high, thereby etching only the silicon oxide films without cutting away the silicon nitride film so as to prevent the exposure of each bit line 209, as shown in FIG. 72(*b*). According to the method, even if an alignment displacement occurs in the pattern for each capacitive-electrode connecting hole 210, the lower electrode 208 and the bit line 209 can be prevented from being short-circuited.

In the present structure, however, the thickness of the silicon nitride film 212 is required in addition to the thickness of the bit line 209 and the thickness from the connecting plug 205 to the surface of the silicon oxide film 214 increases, as shown in FIG. 72(*b*). Therefore, a new problem arises in that the height 216 up to the information storage capacitative element C increases and hence the height of each cell itself becomes high, thereby increasing a step-like offset between the cell and a peripheral circuit region.

An object of the present invention is to provide a technique which is capable of reducing the width of a bit line beyond a processing limit of photolithography.

Another object of the present invention is to provide a structure of a semiconductor integrated circuit device which is capable of preventing short circuits in a bit line and a lower electrode of an information storage capacitive element without increasing the height of a memory cell, and a method of manufacturing the same.

A further object of the present invention is to provide a technique which is capable of reducing the capacitance of a bit line and to provide a semiconductor integrated circuit device which is high in detection sensitivity and excellent in noise resistance.

A still further object of the present invention is to provide a structure of a semiconductor integrated circuit device, which adopts simple flat or plane patterns suitable for photolithography and a technique capable of improving the processing margin.

A still further object of the present invention is to provide a structure of a semiconductor integrated circuit device which is suitable for high integration of a DRAM and a method of manufacturing the same, and a technique capable of improving the reliability, yields and performance of the semiconductor integrated circuit device.

The above and other objects and novel features of the present invention will become apparent from the following description and the accompanying drawings.

Summaries of typical aspects and features of the present invention as disclosed in the present application will be described briefly as follows:

(1) A semiconductor integrated circuit device according to the present invention is provided which comprises a semiconductor substrate, gate electrodes which are respectively formed on active regions each surrounded by separation regions of a principal surface of the semiconductor substrate through a gate insulating film and serve afford lines of a DRAM, for example, channel regions placed below the gate electrodes respectively, memory cell selection MISFETs including first and second semiconductor regions formed with the each channel region interposed therebetween, metal interconnections which are electrically connected to the first semiconductor region and serve as bit lines, for example, and information storage capacitative elements electrically connected to the second semiconductor region and formed in a layer above the metal interconnections, and wherein wiring grooves are defined in a first insulating film formed over the gate electrodes, and each metal interconnection is formed so as to be embedded in each wiring groove and is located above the gate electrodes in a region defined between the gate electrodes.

According to such a semiconductor integrated circuit device, since the metal interconnection is formed so as to be embedded in the wiring grooves defined in the first insulating film, the width of the metal interconnection can be made thin as compared with the case in which the metal interconnection is formed by patterning. Namely, the formation of the wiring grooves in the first insulating film by patterning facilitates a micro-fabrication, which makes it possible to form the width of the metal interconnection thin as compared with the case in which a metal film is deposited over the first insulating film and subjected to patterning to thereby form each metal interconnection.

As a result, owing to the processing of the capacitive electrode connecting holes defined between the metal interconnections, the metal interconnections are not exposed, and a lower electrode of the information storage capacitative element and each metal interconnection corresponding to the bit line are prevented from being short-circuited, whereby the reliability of the semiconductor integrated circuit device can be improved. Incidentally, there is no need to adopt a self-aligned processing method upon processing of the capacitive electrode connecting holes, and the above-described inconvenience of increasing the height of each memory cell is not developed either.

Further, the width of each metal interconnection can be reduced so that the interval between the metal interconnections can be made long. The capacitance between the metal interconnections, i.e., the capacitance of each bit-line, is reduced to improve the sensitivity of detection of a stored electrical charge. Moreover, the speed of response of a transistor electrically connected to the bit line is improved so that the performance of the semiconductor integrated circuit device can be enhanced. In addition, the metal interconnections are located above the gate electrodes so that the capacitance between the metal interconnection and each gate electrode can be reduced.

(2) The semiconductor integrated circuit device further includes first connecting holes defined in a second-insulating film lying between the metal interconnections and the gate electrodes, and conductive connecting plugs respectively formed within the first connecting holes and electrically connected to the first semiconductor region, which can be constructed so that the bottom of each metal interconnection is electrically connected to an upper portion of each connecting plug at the bottom of the wiring groove. Alternatively, the semiconductor integrated circuit device further includes a third insulating film located below the first insulating film and formed so as to be buried between the gate electrodes, second connecting holes defined in the third insulating film on the first semiconductor region, and a conductive film for covering the second connecting holes, which can be constructed so that the bottom of the metal interconnection is electrically connected to an upper portion of the conductive film at the bottom of each wiring groove.

According to such a semiconductor integrated circuit device, the metal interconnection corresponding to the bit line, and the first semiconductor region can be connected to each other through the connecting plugs or conductive film. Further, patterns for the active regions or metal interconnections can be set to plane or flat patterns having linear configurations, which extend in a first direction. While the need for the formation of the active regions and the metal interconnections in the minimum processing sizes to minimize the area of each memory cell is as described above, the interference of light at the time of exposure during photolithography can be limited to a minimum to increase the processing margin by bringing these patterns to simple linearly-configured flat patterns. It is thus possible to improve the manufacturing yields of the semiconductor integrated circuit device and enhance the reliability of the semiconductor integrated circuit device.

When the metal interconnections and the first semiconductor region are connected to each other through the connecting plugs or conductive film, the patterns for the active regions and metal interconnections are configured as flat patterns having the linear configurations extending in the first direction and configured in such a flat layout as to be inserted between the mutually adjacent patterns as seen in a second direction orthogonal to the first direction. Further, each connecting plug or the conductive film can be placed in a pattern extending from-the first semiconductor region lying in the center of each active region to the metal interconnection portion in the second direction. In such a case, the patterns for the active region and the metal interconnection can be both placed as simple linear patterns to improve the processing margin, and the first semiconductor region and the metal interconnection can be reliably connected to each other by using the connecting plugs or conductive film.

Since, in these cases, the wiring grooves are defined and the metal film is embedded therein to form the metal interconnections, the connecting plugs and the upper portion of the conductive film can be exposed simultaneously upon processing of the wiring grooves. There is also no need to form the connecting holes for connecting to the connecting plugs or the conductive film. As a result, there is no need to form the insulating film for covering the connecting plugs or the conductive film, and the height can be lowered by the thickness of the insulating film. A step for processing the connecting holes for connecting to the connecting plugs or the conductive film is omitted and hence the process can be simplified.

(3) In the semiconductor integrated circuit device, the active regions and the metal interconnection are formed in substantially linear flat patterns extending in the first direction, and one or both of the active regions and the metal interconnection have regions extending in the second direction orthogonal to the first direction. The metal interconnection and the first semiconductor region are directly connected to each other through each of third connecting holes defined in portions below the wiring grooves in the regions.

(4) In the semiconductor integrated circuit devices described in the paragraphs (1) through (3), sidewall spacers corresponding to insulators can be respectively formed over side walls of the wiring grooves or the third connecting holes, and the width of each metal interconnection can be set narrower than the width of each wiring groove by a width corresponding to the thickness of each sidewall spacer.

According to such a semiconductor integrated circuit device, the width of the metal interconnection can be formed thinner as compared with the case in which the metal interconnection is formed so as to be simply embedded in each wiring groove. Thus, the above-described effect (1) can be brought about more reliably and noticeably.

Incidentally, the height of the surface of the metal interconnection in this case can be set lower than that of the surface of the first insulating film. This corresponds to a metal interconnection which is excessively polished where the metal interconnection is formed by a CMP process or method in a process step for forming the metal interconnection, as will be described later. Namely, the sidewall spacers are normally thin in thickness in the vicinity of the upper portion of each wiring groove and thick in thickness at the bottom of the wiring groove. There is a possibility that under such a condition, the effect of reducing the width of the metal interconnection by the sidewall spacers will not be obtained pronouncedly if the metal interconnection is formed up to the upper portion of each wiring groove, i.e, a region in which the thickness of each sidewall spacer is thin. Therefore, excessive polishing is performed upon formation of the metal interconnection to thereby polish the metal interconnection up to a region in which the thickness of the sidewall spacer becomes sufficiently thick.

The sidewall spacers can be composed of silicon oxide film or a silicon nitride film. Since the width of the metal interconnection is made thin by the sidewall spacers employed in the present invention, the need for utilization of the self-aligned processing method upon processing of the capacitive-electrode connecting holes is eliminated as described above. Therefore, the silicon oxide film is used as a material for defining the capacitive-electrode connecting hole, whereas there is no need to use the silicon nitride film for the sidewall spacers. However, when the silicon nitride film is used, the exposure of the metal interconnection can be avoided by the processing of each capacitive-electrode connecting hole even if a large displacement in alignment temporarily occurs and a variation in process conditions occurs. On the other hand, if the silicon oxide film is used for the sidewall spacers, then the capacitance between the metal interconnections serving as the bit lines can be reduced due to a low dielectric constant of the silicon oxide film.

In the semiconductor integrated circuit devices described in the paragraphs (1) through (3), a fourth insulating film having an etching selection ratio with respect to the first insulating film or the sidewall spacers may be formed at the bottom of each wiring groove. In such a case, the fourth insulating film can be utilized as an etching stopper upon definition of the wiring grooves in the first insulating film. Further, the fourth insulating film can be used as an etching stopper upon formation of the sidewall spacers. Incidentally, the first insulating film or the sidewall spacers can be composed of a silicon oxide film, and the fourth insulating film can be composed of a silicon nitride film.

(5) A method of manufacturing a semiconductor integrated circuit device, according to the present invention, comprising a semiconductor substrate, gate electrodes respectively formed on active regions each surrounded by separation regions of a principal surface of the semiconductor substrate through a gate insulating film, channel regions placed below the gate electrodes respectively, first and second semiconductor regions formed with each channel region interposed therebetween, metal interconnections each electrically connected to the first semiconductor region, and information storage capacitative elements electrically connected to the second semiconductor region and formed in a layer above the metal interconnections, comprises the following steps: (a) a step of forming the separation regions over the main surface of the semiconductor substrate, successively forming an insulating film and a conductive film and patterning the conductive film to thereby form the gate electrodes; (b) a step of ion-introducing an impurity into both ends of the gate electrodes to thereby form the first and second semiconductor regions; (c) a step of forming a first insulating film over the entire surface of the semiconductor substrate and defining wiring grooves in the first insulating film; (d) a step of depositing a metal film over the first insulating film including the interior of each wiring groove and removing each metal film lying in a region other than the wiring grooves to thereby form each metal interconnection; and (e) a step of depositing a fifth insulating film for covering the entire surface of the semiconductor substrate and forming each information storage capacitative element over the fifth insulating film, whereby the metal interconnection is positioned above each gate electrode in a region between the gate electrodes.

According to such a manufacturing method, the semiconductor integrated circuit device described in the paragraph (1) can be manufactured. According to such a manufacturing method as well, it is unnecessary to provide the silicon oxide film 215 and the silicon nitride film 212 shown in FIG. 72(*b*), that led up to the increase in the height of each memory cell in the prior art. As a result, the height of the memory cell can be reduced and the step-like offset between the memory cell and the peripheral circuit region can be less reduced so as to increase a photolithography margin at the patterning of the metal interconnection formed above the information storage capacitative element. Further, failures such as a break in the metal interconnection, etc. can be reduced. The positioning of the metal interconnection above the gate electrodes allows a reduction in the capacitance between the metal interconnection and each gate electrode.

The above-described manufacturing method includes, prior to the step (c), a step of forming a second insulating film over the entire surface of the semiconductor substrate so as to fill in between the gate electrodes and defining first connecting holes in the second insulating film on the first and second semiconductor regions, and a step of forming connecting plugs connected to the first and second semiconductor regions so as to be embedded in the first connecting holes respectively. Owing to the formation of the wiring grooves in the step (c), upper portions or upper surfaces of the connecting plugs connected to the first semiconductor region can be exposed at the bottoms of the wiring grooves.

According to such a manufacturing method, a semiconductor integrated circuit device having the connecting plugs for connecting the first semiconductor region and the metal interconnection can be fabricated. Further, portions for connecting to the connecting plugs can be formed simultaneously with the formation of the wiring grooves. Therefore, other process steps used for the formation of the connecting holes for exposing the connecting plugs, etc. can be omitted. Thus, the process of manufacturing the semiconductor integrated circuit device can be simplified.

The above-described manufacturing method further includes, prior to the step (c), a step of depositing a third insulating film for covering the gate electrodes and defining second connecting holes in the third insulating film on the first semiconductor region, and a step of depositing a conductive film over the third insulating film including the interior of each second connecting hole and patterning the conductive film so as to cover the second connecting holes. Owing to the definition of the wiring grooves in the step (c), some of the conductive film can be exposed at the bottoms of the wiring grooves.

According to such a manufacturing method, a semiconductor integrated circuit device having a conductive film for connecting the first semiconductor region and the metal interconnection can be manufactured. Even by the present method, portions for connecting to the conductive film can be formed simultaneously with the definition of the wiring grooves, so that the manufacturing process can be simplified. According to the present method, a flattening process using a CMP method can be performed with a reduced number of steps as compared with the process for forming the connecting plugs. Namely, a method of forming the connecting plugs needs to flatten the insulating film before the connecting holes are defined in which the connecting plugs are to be formed, whereas a method of forming the conductive film according to the present method requires no flattening of the insulating film with the conductive film formed thereon. It is therefore possible to omit a CMP process step in the process of forming the insulating film, antecedent to the patterning of the conductive film. It is necessary to make the insulating film thick in order to ensure a flatness over the entire surface of the substrate in the CMP process step. Since, however, the CMP process step is omitted in the present method, the thickness of the insulating film can be reduced correspondingly, thereby making it possible to limit the height of each memory cell to as low a value as possible.

The above described manufacturing method further includes, after the step (c), a step of defining third connecting holes having flat patterns which overlap with wiring groove regions and expose the first semiconductor region. The metal film can be formed even inside the third insulating film upon deposition of the metal film in the step (d).

According to such a manufacturing method, a semiconductor integrated circuit device constructed so that the metal interconnection and the first semiconductor region are directly connected to each other, can be manufactured. Namely, the metal interconnection can be formed by a so-called dual damascene method.

In the above-described manufacturing method of forming the connecting plugs or the conductive film and exposing the connecting plugs or part of the conductive film simultaneously with the definition of the wiring grooves, the metal interconnection corresponding to each bit line and the connecting plugs or the conductive film are directly connected to each other at the bottom of each wiring groove. Therefore, the insulating film for separating the connecting plugs or conductive film from the metal interconnection becomes unnecessary and the connecting holes defined in the insulating film are also inevitably unnecessary. As a result, the height of a cell can be reduced as a result of the elimination of the need for the insulating film, and the number of masks can be reduced as a result of the lack of any need for the connecting holes.

(6) A method of manufacturing a semiconductor integrated circuit device, according to the present invention includes, prior to the step (d) in the manufacturing method described in the paragraph (5), a step of depositing a sixth insulating film having a thickness which is less than one half the width of each wiring groove over a first insulating film including the interior of wiring grooves or third connecting holes, and subjecting the sixth insulating film to anisotropic etching, thereby forming sidewall spacers on side walls of the wiring grooves or the third connecting holes respectively.

According to such a manufacturing method, the sidewall spacers can be respectively formed on the side walls of the wiring grooves so as to reduce the width of the metal interconnection. Namely, since the wiring grooves are defined by etching processing of the first insulating film using photolithography, they cannot be formed below a processing limit of photolithography. However, if the sidewall spacers are formed on the side walls of the wiring grooves as in the present method, then the interval interposed between the sidewall spacers is below the processing limit of photolithography. Thus, the width of each metal interconnection embedded into the interval is formed below the processing limit. It is therefore possible to ensure a sufficient processing margin upon formation of each capacitive-electrode connecting hole and thereby enhance production yields of the semiconductor integrated circuit device and improve the reliability thereof.

Incidentally, the metal film for forming the metal interconnection is removed by polishing using a CMP process. The polishing is excessively performed to allow the occurrence of dishing in the surface of the metal interconnection lying in each wiring groove. Alternatively, the metal film for forming the metal interconnection is removed by polishing using the CMP process and the polishing is excessively done so that even width-narrow portions of the sidewall spacers above the wiring grooves can be removed together with the metal film. In such a case, the width of the metal interconnection can be effectively made thin without forming the metal interconnection over thickness-reduced portions of the sidewall spacers, which are located above the wiring grooves.

In the above-described manufacturing method, a fourth insulating film having an etching selection ratio with respect to the first insulating film or the sixth insulating film is formed in any layer between the gate electrodes and the first insulating film. The fourth insulating film can be used as an etching stopper upon definition of the wiring grooves in the first insulating film or upon formation of the sidewall spacers by the anisotropic etching of the sixth insulating film. A silicon oxide film can be suggested by way of example for the first and sixth insulating films, and a silicon nitride film can be suggested by way of example for the fourth insulating film.

In the above-described manufacturing method, a step for processing connecting holes for connecting the information storage capacitative elements to the second semiconductor region placed therebelow or the connecting plugs on the second semiconductor region can include a first step of depositing a first coating having an etching selection ratio with respect to the first and fifth insulating films over the fifth insulating film, a second step of defining openings in the first coating on the second semiconductor region, a third step of depositing a second coating having a thickness of less than one half the diameter of each opening and having an etching selection ratio with respect to the first and fifth insulating films, a fourth step of subjecting the second coating to anisotropic etching to thereby form sidewall spacers composed of the second coating on inner walls of the openings, and a fifth step of etching the fifth insulating film and the insulating film lying therebelow with the sidewall spacers of the first and second coatings as hard masks.

According to such a manufacturing method, the information storage capacitative elements can be processed in processing sizes below the processing limit of photolithography. Further, short circuits in the lower electrode of the information storage capacitative element and the metal interconnection (bit line) can be reliably prevented in synergy with the above-described method capable of reducing the width of the metal interconnection.

BRIEF DESCRIPTION OF THE DRAWINGS

While the specification concludes with claims particularly pointing out and distinctly claiming the subject matter which is regarded as the invention, it is believed that the invention, the objects and features of invention, and further objects, features and advantages thereof will be better understood from the following description taken in connection with the accompanying drawings in which:

FIGS. 6(*b*), 7, 8(*b*), 9, 10, 12(*a*), 13(*a*), 14(*a*), 16(*a*), 17(*a*), 18, 19(*a*), 20(*a*), 22(*a*), 23(*a*), 25(*a*), 26(*a*), 27(*a*), 28, 31, 33, 35, 37, 39 and 41 are respectively manufacturing-process cross-sectional views corresponding to FIG. 4;

FIGS. 12(*c*), 13(*c*), 14(*c*), 16(*c*), 17(*c*), 19(*c*), 20(*c*), 22(*c*), 23(*c*), 25(*c*), 26(*c*), 27(*c*), 29(*b*), 32(*b*), 34(*b*), 36(*b*), 38(*b*), 40(*b*) and 42(*b*) are respectively manufacturing-process cross-sectional views corresponding to FIG. 5(*b*);

FIGS. 12(*d*), 13(*d*), 14(*d*), 16(*d*), 17(*d*), 19(*d*), 20(*d*), 22(*d*), 23(*d*), 25(*d*), 26(*d*), 27(*d*), 29(*c*), 32(*c*), 34(*c*), 36(*c*), 38(*c*), 40(*c*) and 42(*c*) are respectively manufacturing-process cross-sectional views corresponding to FIG. 5(*c*);

FIGS. 52(*b*), 54(*b*), 57(*b*), 58(*b*) and 59(*b*) are respectively process-by-process cross-sectional views illustrating the cross section corresponding to FIG. 50(*a*);

FIGS. 52(*c*), 54(*c*), 57(*c*), 58(*c*) and 59(*c*) are respectively process-by-process cross-sectional views depicting the cross section corresponding to FIG. 50(*b*);

FIGS. 52(*d*), 54(*d*), 57(*d*), 58(*d*) and 59(*d*) are respectively process-by-process cross-sectional views depicting the cross section corresponding to FIG. 50(*c*);

FIGS. 65(*b*), 67(*b*), 68(*b*) and 69(*b*) are respectively process-by-process cross-sectional views illustrating the cross section corresponding to FIG. 63(*a*);

FIGS. 65(*c*), 67(*c*), 68(*c*) and 69(*c*) are respectively process-by-process cross-sectional views depicting the cross section corresponding to FIG. 63(*b*);

FIGS. 65(*d*), 67(*d*), 68(*d*) and 69(*d*) are respectively process-by-process cross-sectional views depicting the cross section corresponding to FIG. 63(*c*);

DESCRIPTION OF THE PREFERRED EMBODIMENTS

Figure 1:
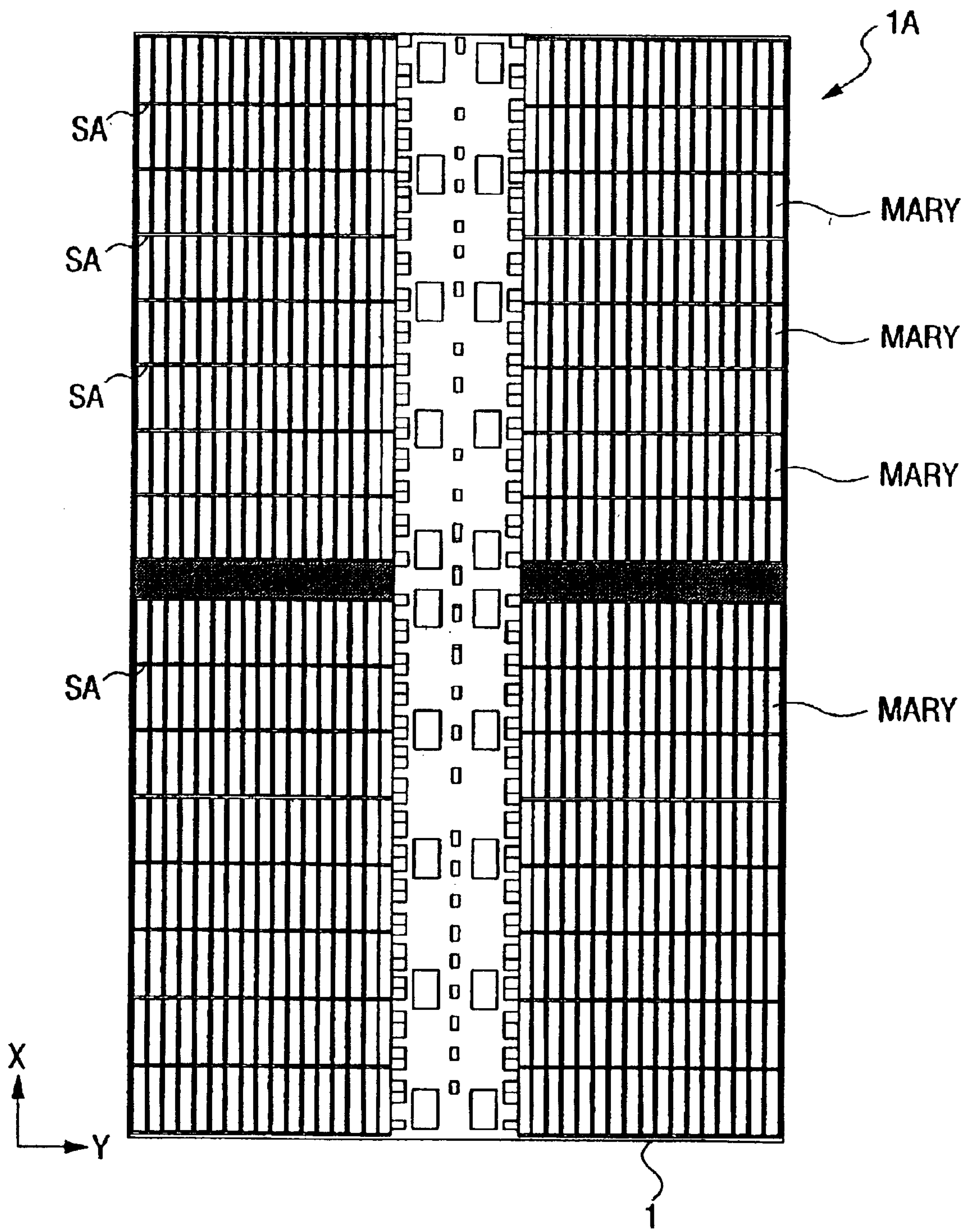
FIG. 1 is a plan view showing one example of the entire semiconductor chip in which a DRAM representing one embodiment of the present invention is formed.

Preferred embodiments of the present invention will hereinafter be described in detail with reference to the accompanying drawings. Incidentally, members or elements having the same function in all the drawings relating to the respective embodiments are identified by the same reference numerals and their repetitive description will be omitted.

Embodiment 1

FIG. 1 is a plan view showing one example of the entire semiconductor chip in which a DRAM showing one embodiment of the present invention is formed. As shown in the drawing, a large number of memory arrays MARY are placed on a major or principal surface of a semiconductor chip 1A comprised of monocrystalline silicon in matrix form along an X direction (corresponding to a longitudinal direction of the semiconductor chip 1A) and a Y direction (corresponding to a transverse direction of the semiconductor chip 1A). Sense amplifiers SA are respectively placed between the memory arrays MARYs adjacent to one another along the X direction. Control circuits such as word drivers WD, data line selection circuits or the like, input/output circuits, bonding pads, etc. are arranged in a central portion of the principal surface of the semiconductor chip 1A.

Figure 2:
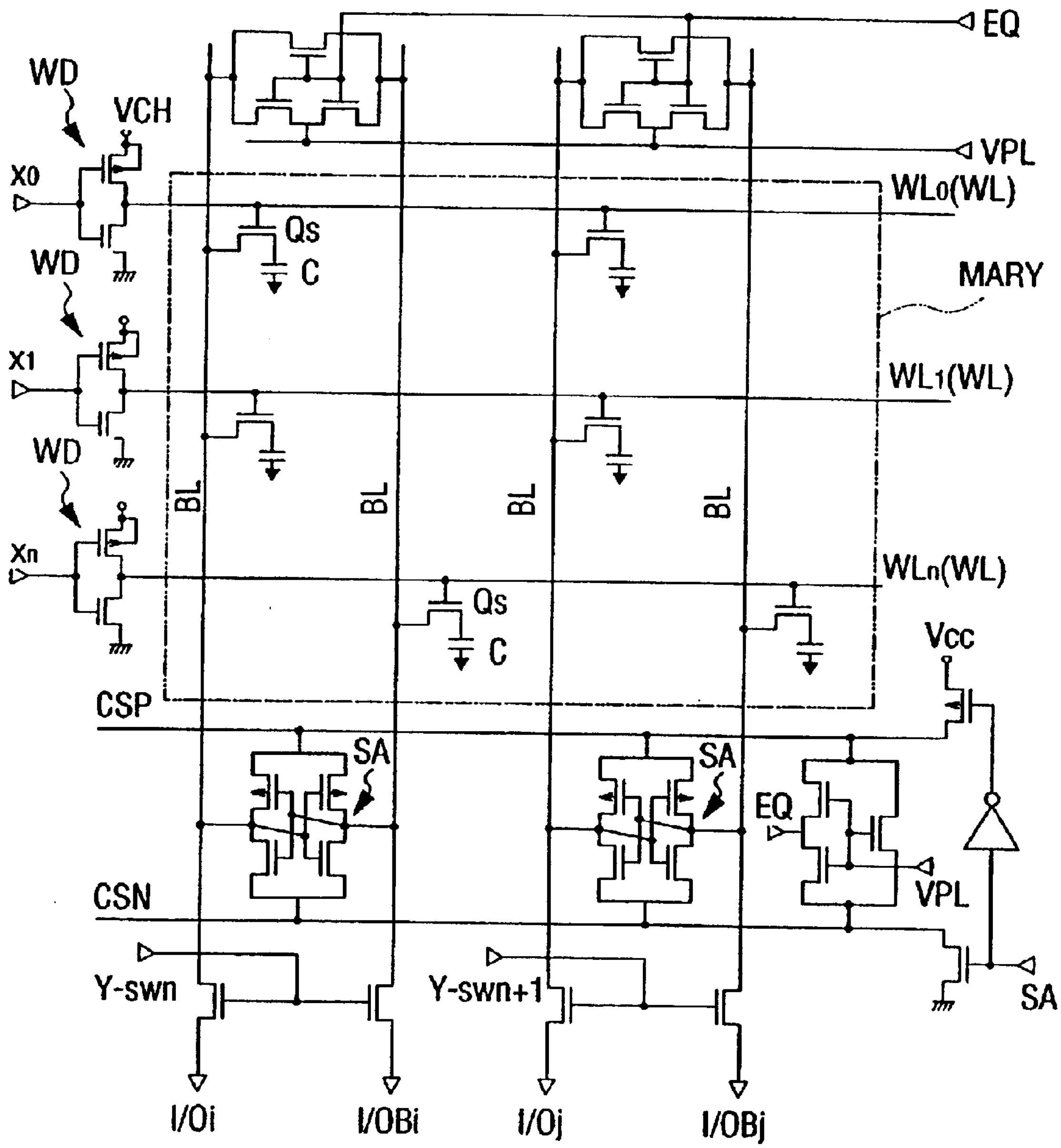
FIG. 2 is an equivalent circuit diagram of the DRAM according to the present embodiment 1.

FIG. 2 is an equivalent circuit diagram of the DRAM showing the present embodiment 1. As shown in the drawing, A memory array (MARY) of the DRAM comprises a plurality of word lines (WL0, WL1, WLn . . . ) and a plurality of bit lines BL placed in matrix form, and a plurality of memory cells placed at their intersecting points, respectively. A single memory cell for storing one-bit of information therein comprises one information storage capacitative element C and one memory cell selection MISFET Qs electrically connected in series with the capacitative element C. One of the source and drain of the memory cell selecting MISFET Qs is electrically connected to the information storage capacitative element C, whereas the other thereof is electrically connected to its corresponding bit line BL. One end of each word line WL is electrically connected to its corresponding word driver WD, and one end of each bit line BL is electrically connected to its corresponding sense amplifier SA.

Figure 3:
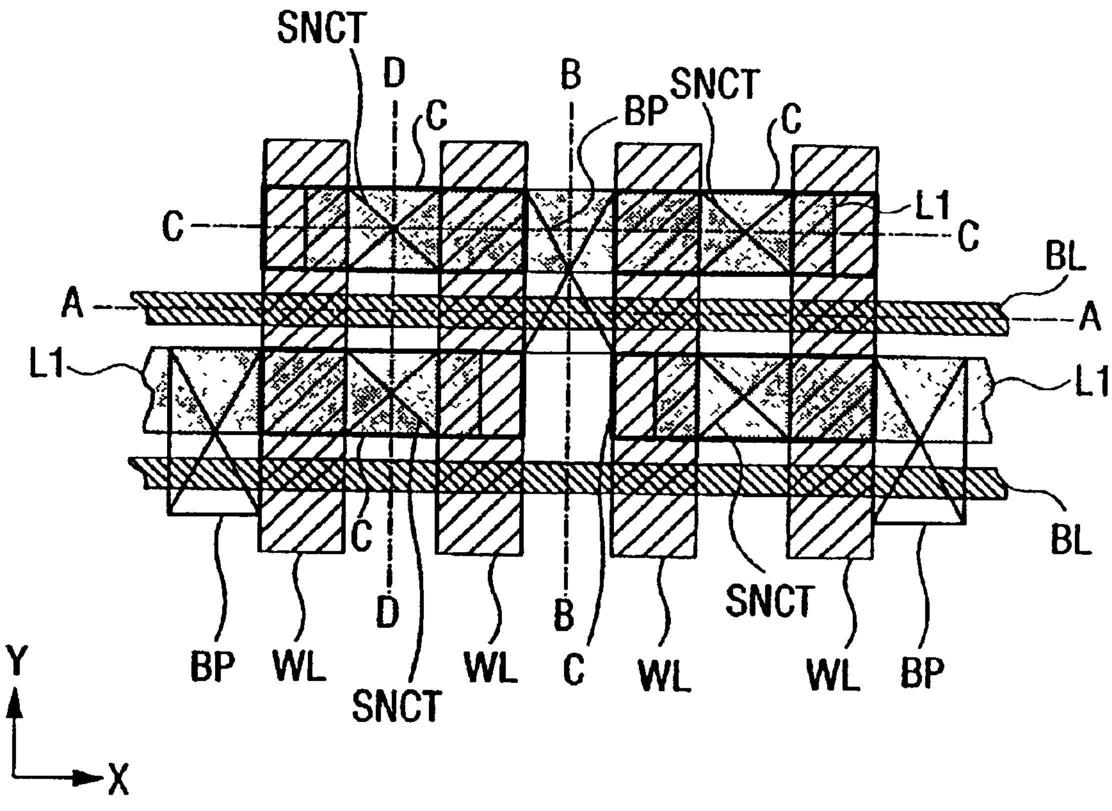
FIG. 3 is a plan view showing a part of a memory array MARY of FIG. 1 in enlarged form.

FIG. 3 is a plan view showing a part of the memory array MARY shown in FIG. 1 in enlarged form. Incidentally, the present plan view and the subsequent plan views show the shape of patterns constituting elements or members and do not represent the shape of actual elements. In the memory array MARY, active regions L1 are disposed, word lines WL are formed in a Y direction and bit lines BL are formed in an X direction. In regions where the word lines WL and the active regions L1 overlap, each word line WL serves as a gate electrode of each memory cell selection MISFET Qs. Connecting plugs BP electrically connected to the bit lines BL are formed in the regions of the active regions L1, which are interposed between the regions serving as the gate electrodes of the word lines WL, i.e., in central portions of the active regions L1. The connecting plugs BP have shapes long in the Y direction so as to extend over the active regions L1 and the bit lines BL. The central portions of the active regions L1 and the bit lines are electrically connected to one another through the connecting plugs BP. Double-end regions of the active regions L1 are electrically connected to their corresponding information storage capacitative elements C through capacitive-electrode connecting holes SNCT.

In the present embodiment, the bit lines BL and the active regions L1 are shaped in linear configurations extending in the X direction. Since they are formed in linear configurations in this way, interference to exposure light can be less reduced and the processing margin can be improved during photolithography at the time of the processing of the bit lines BL and the active regions L1. While the bit lines BL and the active regions L1 are respectively formed to be at the limit of processing of the photolithography, the bit lines BL are formed thinner than at the processing limit. It is therefore possible to improve the processing margin of each capacitive-electrode connecting hole SNCT and enhance the reliability of the semiconductor integrated circuit device. Further, the performance of the semiconductor integrated circuit device can be improved by increasing the distance between the adjacent bit lines BL so as to reduce each bit-line capacitance.

Figure 4:
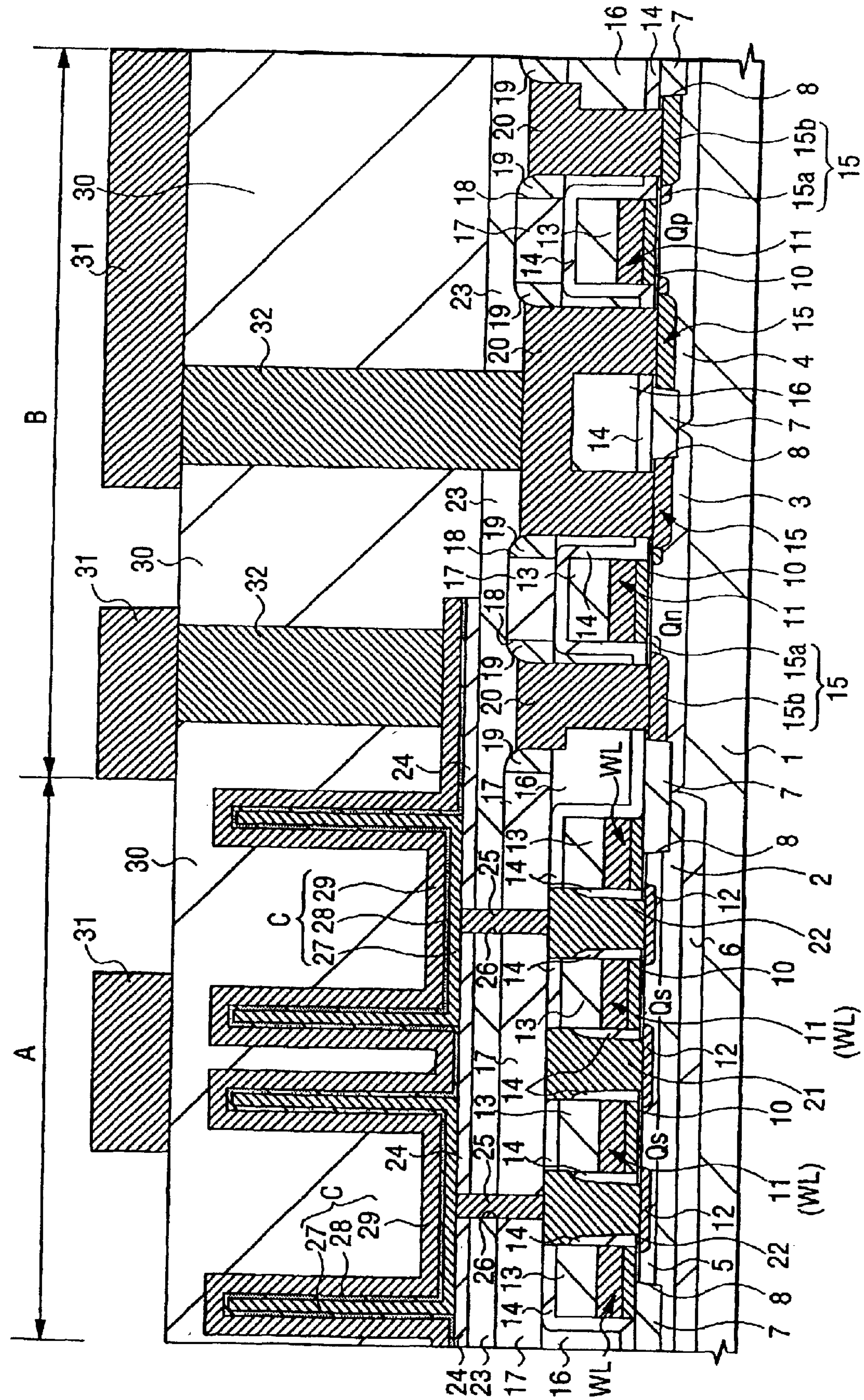
FIG. 4 is a cross-sectional view illustrating a portion of a memory cell and a part of a peripheral circuit both lying in a DRAM area or region employed in the embodiment 1 and represents a cross section of the portion of the memory cell, which is taken along line C—C in FIG. 3.
Figures 5A, 5B, 5C:
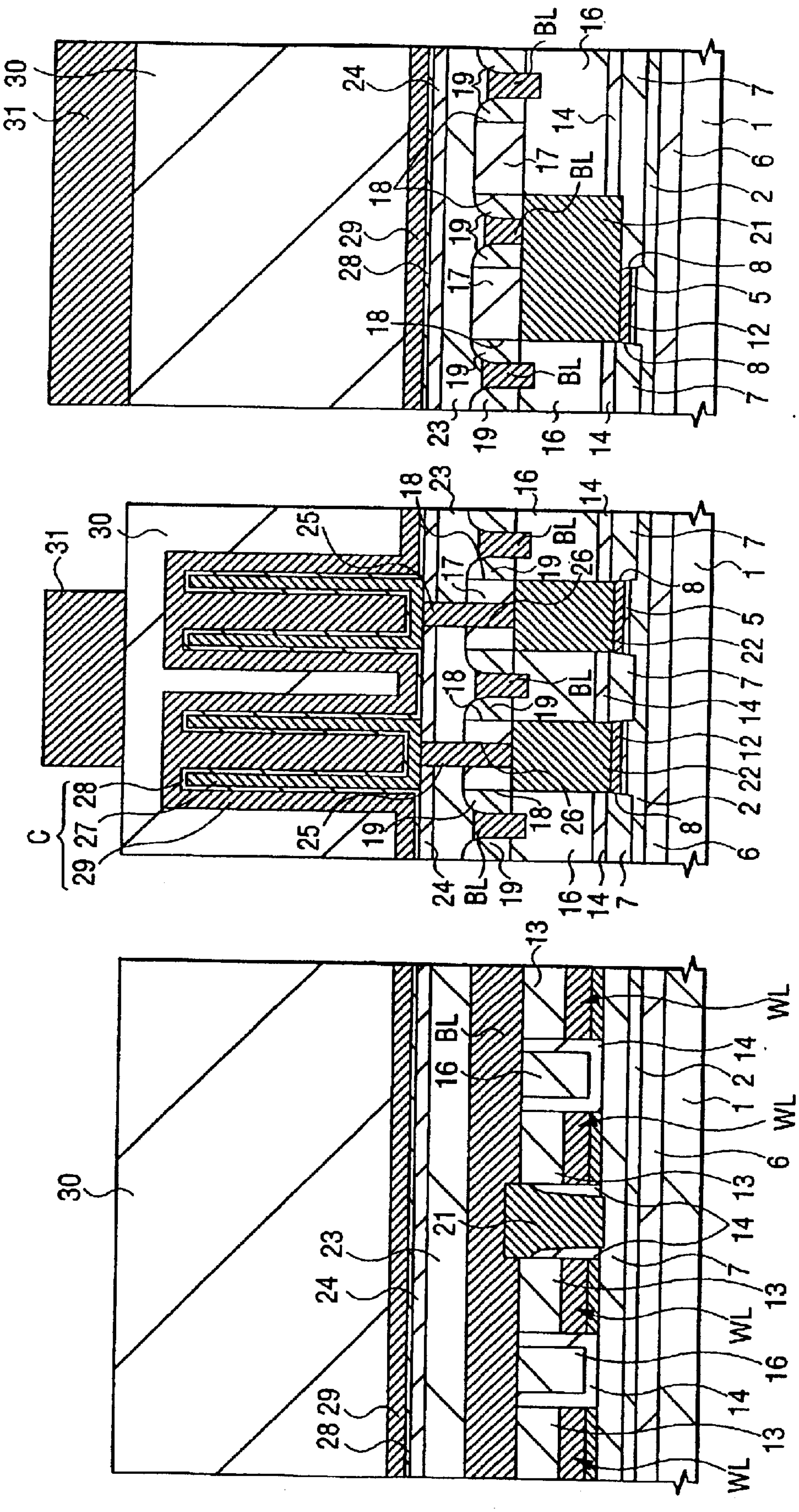
FIGS. 5(*a*) to 5(*c*) are cross-sectional views showing the portion of the memory cell lying in the DRAM region employed in the embodiment 1, wherein FIG. 5(*a*) is a cross section taken along line A—A in FIG. 3, FIG. 5(*b*) is a cross section taken along line D—D in FIG. 3, and FIG. 5(*c*) is a cross section taken along line B—B in FIG. 3, respectively.

FIG. 4 is a cross-sectional view illustrating a portion (area or region A) of a memory cell and a part (area or region B) of a peripheral circuit both lying in a DRAM region employed in the present embodiment and shows a cross section taken along line C—C in FIG. 3. FIG. 5(*a*) shows a cross section taken along line A—A in FIG. 3, FIG. 5(*b*) illustrates a cross section taken along line D—D in FIG. 3, and FIG. 5(*c*) depicts a cross section taken along line B—B in FIG. 3, respectively. Incidentally, a manufacturing technique is illustrated by way of example according to 0.18 μm-design rules in the present embodiment.

A p-type well 2 lying in the region A, and a p-type well 3 and an n-type well 4 lying in the region B are formed on a principal surface of a semiconductor substrate 1. The semiconductor substrate 1 is composed of p-type monocrystalline silicon having a specific resistivity of 10Ω·cm, for example. Further, a threshold voltage control layer 5 is formed over a principal surface of the p-type well 2, and an n-type deep well 6 is formed so as to surround the p-type well 2. Incidentally, threshold voltage control layers may be formed even over other respective wells.

Separation regions 7 are formed in the principal surfaces of the respective wells. The separation regions 7 are composed of a silicon oxide film and are formed so as to be embedded or buried in shallow grooves 8 defined in the principal surface of the semiconductor substrate 1. Each shallow groove 8 has a depth of 0.3 μm, for example. A thermally-oxidized silicon oxide film may be formed in an inner wall of each shallow groove 8.

Memory selection MISFETs Qs of the DRAM are formed over the major surface of the p-type well 2. Further, an n channel MISFET Qn and a p channel MISFET Qp are respectively formed over the principal surfaces of the p-type well 3 and the n-type well 4.

Each memory cell selection MISFET Qs has a gate electrode 11 formed over the principal surface of the p-type well 2 through a gate insulating film 10, and semiconductor regions 12 formed over the principal surface of the p-type well 2, which are placed on both sides of the gate electrode 11.

The gate insulating film 10 is composed of a silicon oxide film formed by thermal oxidation, which has thicknesses ranging from 7 nm to 8 nm.

Each gate electrode 11 can be constructed as a film formed by stacking or laminating a polycrystal silicon film having a thickness of 50 nm, for example, and a tungsten silicide ($WSi_2$) film having a thickness of 100 nm on each other. For example, phosphorus (P) can be implanted or introduced into the polycrystal silicon film on the order of $3\times10^{20}$ atoms/$cm^3$. Incidentally, other silicide films such as cobalt silicide (CoSi) film, a titanium silicide (TiSi) film, etc. may be used without placing a limitation on the tungsten silicide film. Further, the gate electrode 11 may be formed as a film obtained by stacking, for example, a polycrystal silicon-film having a thickness of 70 nm, titanium nitride film having a thickness of 50 nm and a tungsten film having a thickness of 100 nm on one another.

An n-type impurity, e.g., arsenic (As) or phosphor is introduced into each semiconductor region 12.

Each of the cap insulating films 13 made up of a silicon nitride film is formed over the gate electrode 11 of each memory cell selection MISFET Qs. Further, the upper layer of the cap insulating film 13 is covered with a silicon nitride film 14. The thickness of the cap insulating film 13 is 200 nm, for example, whereas the thickness of the silicon nitride film 14 is 30 nm, for example. The silicon nitride film 14 is also formed on the side walls of the gate electrodes 11 and is used for self-aligned processing at the formation of connecting holes to be described later. Incidentally, the gate electrodes 11 of the memory cell selection MISFETs Qs function as the word lines of the DRAM, and parts of the word lines WL are formed over the upper surfaces of the separation regions 7 respectively.

On the other hand, the n channel MISFET Qn and the p channel MISFET Qp are respectively formed over the principal surfaces of the p-type well 3 and n-type well 4 and are respectively made up of gate electrodes 11 formed through gate insulating films 10 and semiconductor regions 15 formed in the principal or major surfaces of the respective wells, which are located on both sides of the gate electrodes 11. The gate insulating film 10 and the gate electrodes 11 are similar to the above. The semiconductor region 15 comprises a low-density impurity region **15*a* and a high-density impurity region 15*b* and forms a so-called LDD (Lightly Doped Drain) structure. As an impurity introduced into each semiconductor region 15**, an n-type or p-type impurity is introduced therein according to the conduction type of each MISFET.

Each of the cap insulating films 13 composed of the silicon nitride film is formed over the gate electrode 11 of each of the n channel MISFET Qn and p channel MISFET Qp. Further, an upper layer of the cap insulating film 13 and side walls of the gate electrode 11 and the cap insulating film 13 are covered with a silicon nitride film 14. The cap insulating film 13 and the silicon nitride film 14 are similar to the above.

An insulating film 16 is embedded in each of gaps defined between the adjacent gate electrodes 11 of the memory cell selection MISFET Qs, the n channel MISFET Qn and the p channel MISFET Qp. The insulating film 16 can be formed as a film obtained by laminating, for example, an SOG (Spin On Glass) film, a TEOS oxide film obtained by flattening a silicon oxide film (hereinafter called TEOS oxide film) formed by a plasma CVD process or method with TEOS (Tetramethoxysilane) as a material gas by a CMP (Chemical Mechanical Polishing) process or method, and a -TEOS oxide film on one another.

An insulating film 17 for wiring formation is formed over the insulating film 16. The insulating film 17 can be formed as the TEOS oxide film.

Wiring grooves 18 are defined in the insulating film 17, and sidewall spaces 19 are respectively formed on side walls of the wiring grooves 18. As will be described later, the wiring grooves 18 are formed at the limit of processing of the photolithography. Further, the sidewall spaces 19 are composed of a silicon nitride film, for example. The sidewall spacer 19 may be composed of a silicon oxide film.

Each bit line BL and a first layer wire or interconnection 20 are formed inside each wiring groove 18 interposed by the sidewall spacers 19. The bit line BL and the first layer-interconnection 20 are simultaneously formed by the CMP process as will be described later. While the bit line BL and the first layer interconnection 20 are respectively composed of a tungsten film, for example, they may use another metal such as a copper film or the like.

Thus, since the bit line BL is formed so as to be embedded into each wiring groove 18, the layer-to-layer height extending to the information storage capacitative element C, which will be described later, can be reduced. Namely, if an attempt is made to form the bit line BL by using metal-film patterning based on photolithography, it is necessary to provide an insulating film for isolating, each connecting plug to be described later from the bit line BL. However, this becomes unnecessary in the case of the present embodiment. Therefore, the height of each element can be reduced by decreasing the layer-to-layer width by a width corresponding to the thickness of the insulating film.

Further, since the sidewall spacers 19 are formed on the inner walls of the wiring grooves 18, the width of the bit line BL can be reduced. Namely, the width of each wiring groove 18 is narrowed by portions corresponding to the widths of the sidewall spacers 19 so that the width of the bit line BL formed in the wiring groove 18 can be reduced. This means that the width of the bit line BL can be formed with a processing accuracy which is less than the processing limit of the photolithography. Therefore, even if the processing margin at the processing of each capacitive-electrode connecting hole for electrically connecting the information storage capacitative element C and the connecting plug to be described later is increased and thereby a displacement in alignment of processing patterns for the capacitive-electrode connecting holes occurs, a failure in the information storage capacitative element C and bit line BL due to a short circuit does not occur. As a result, the reliability of the DRAM and product yields can be enhanced.

Since the processing margin for each capacitive-electrode connecting hole can be made great, it is unnecessary to adopt self-aligned processing on the bit line BL at the time of processing of the capacitive-electrode connecting hole, which has been adopted in the prior art. Therefore, the cap insulating film for each bit line BL, which is necessary for the self-aligned processing, becomes unnecessary. Accordingly, an amount of each element can be reduced by a height corresponding to the thickness of the cap insulating film. As a result, a step-like offset between a memory cell region (region A) and a peripheral circuit region (region B) can be reduced in addition to the previous effect of reducing the element height. Alternatively, the insulating film in the region B can be reduced in thickness, and an improvement in processability of interconnections for a second layer or more due to the offset and the prevention of breaks in the interconnections can be achieved, or the processability of connecting holes to a second layer interconnection and layer interconnections therebelow or the like can be improved.

Further, since the width of each bit line BL can be formed thin, the distance between the adjacent bit lines BL is increased so that line-to-line capacitance between the bit lines BL can be reduced. It is thus possible to improve detection sensitivity of each sense amplifier, improve the noise resistance and enhance the performance of the DRAM.

Incidentally, the bit line BL is formed so as to be lower in height than the surface of the insulating film 17 with each wiring groove 18 defined therein. This means that the thickness of each sidewall spacer 19 in the vicinity of its upper portion has a tendency to become thin as illustrated in the drawing. In such a case, there is a possibility that when the bit line BL is formed in the neighborhood of the upper portion of each sidewall spacer 19, the effect of reducing the width of the bit line BL will not be obtained sufficiently. Therefore, as will be described later, the bit line BL and the first layer interconnection 20 are excessively polished by the CMP process upon their formation to cause dishing intentionally, whereby the width of the bit line BL is sufficiently formed thin. Thus, the effect of reducing the width of each bit line BL can be brought about with reliability.

Each bit line BL is electrically connected to the semiconductor region 12 shared between the pair of memory cell selection MISFETs Qs through the connecting plug 21. As is also shown in the plan view of FIG. 3, the connecting plugs 21 are formed so as to be long in the Y direction so as to overlap with a pattern for each active region L1 and a pattern for each bit line BL. Incidentally, the bit line BL and the connecting plug 21 are electrically connected to each other at the bottom of the wiring groove 18. This is based on the fact that upper portions of the connecting plugs 21 are exposed simultaneously upon formation of the wiring grooves 18 as will be described later.

Connecting plugs 22 electrically connected to their corresponding information storage capacitative element are formed over the other semiconductor regions 12 of the memory cell selection MISFETs Qs. The connecting plugs 21 and 22 can be formed as a polycrystal silicon film in which an n-type impurity, e.g., phosphorous is introduced therein on the order of $2\times10^{20}$ atoms/$cm^3$.

Incidentally, the bit line BL is directly connected to the high-density impurity regions 15*b* of the n channel MISFET Qn and p channel MISFET Qp in the peripheral circuit region (region B). Thus, as compared with the case in which each bit line BL is electrically, directly connected to the high-density impurity regions 15*b* to thereby form the connecting plugs, the resistance of each connecting plug and connecting resistance can be reduced and the n channel MISFET Qn and p channel MISFET Qp can be improved in operation speed. Incidentally, a silicide film such as cobalt, titanium, tantalum, tungsten or the like can be formed over the surface of each high-density impurity region 15*b*.

The bit line BL and the first layer interconnection 20 are covered with an interlayer insulating film 23. The interlayer insulating film 23 can be formed as a TEOS oxide film, for example.

An insulating film 24 composed of a silicon nitride film is formed in the region A lying in the upper layer of the interlayer insulating film 23. Further, the information storage capacitative elements C are formed in the region A. As will be described later, the insulating film 24 is a thin film which functions as an etching stopper upon formation of each lower electrode 27 of the information storage capacitative element C.

The information storage capacitative element C comprises the lower electrode 27 electrically connected to its corresponding connecting plug 22 through a connecting plug 25, a capacitive insulating film 28 composed of, for example, a silicon nitride film and tantalum oxide, and a plate electrode 29 composed of titanium nitride, for example. Since each connecting plug 25 is formed within a capacitive-electrode connecting hole 26 and the capacitive-electrode connecting hole 26 is formed sufficiently far from the bit line BL, there is no in danger of short-circuits in the bit line BL and each connecting plug 25.

An insulating film 30 composed of a TEOS oxide film, for example, is formed over each information storage capacitative element C. Incidentally, an insulating film may be formed over the interlayer insulating film 23 in the same layer as the information storage capacitative element C. This insulating film allows prevention of the occurrence of the step-like offset between the regions A and B, which is caused by the height of the information storage capacitative element C and allows the focal depth at photolithography to have a margin, whereby the process can be stabilized so as to cope with micro-fabrication.

A second layer interconnection 31 is formed over the insulating film 30, and each of the plugs 32 provides an electrical connection between the second layer interconnection 31 and the upper electrode 29 or the first layer interconnection 20. The second layer interconnection 31 can be formed as a film obtained by laminating, for example, a titanium nitride film, an aluminum film and the titanium nitride film on one another. The plug 32 can be formed as a film obtained by laminating, for example, a titanium film, the titanium nitride film and a tungsten film on one another.

Incidentally, a third layer interconnection or wired layers subsequent to the third layer interconnection may further be provided over the second layer interconnection 31 with an interlayer insulating film interposed therebetween. However, their description will be omitted.

According to the DRAM of the present embodiment 1, since each bit line BL is formed so as to be embedded in the wiring groove 18 and each sidewall spacer 19 is formed on the side wall of the wiring groove 18, as described above, the width of the bit line BL can be reduced. Thus, the capacitive-electrode connecting holes 26 can be processed with a sufficient processing margin, and the connecting plugs 25 and the bit line BL can be prevented from being short-circuited. It is also possible to reduce the formed height of each information storage capacitative element C. Moreover, the line-to-line capacitance between the bit lines BL is reduced so that the performance of the DRAM can be enhanced.

Figure 6A:
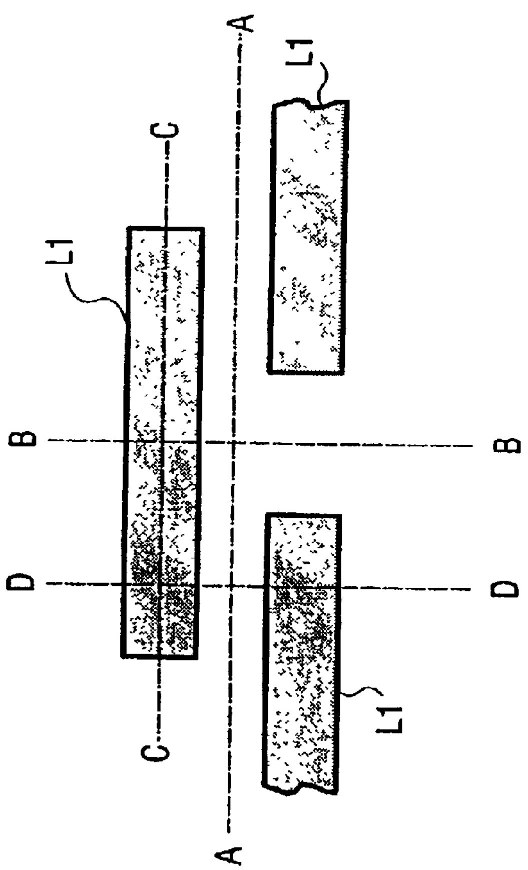
FIGS. 6(*a*), 8(*a*), 11, 15, 21, 24 and 30 are respectively plan views of a memory cell in a process for manufacturing the DRAM according to the embodiment 1.
Figure 6B:
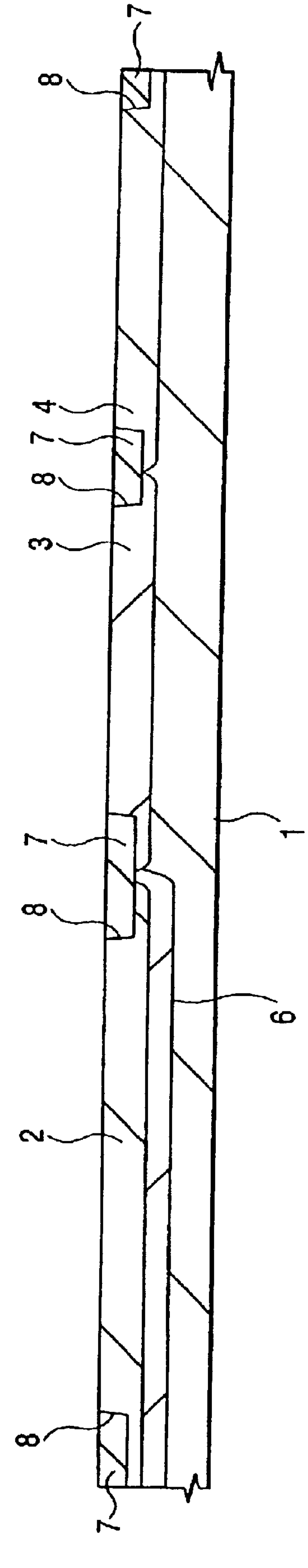

A method of manufacturing the DRAM according to the present embodiment 1 will next be described with reference to the drawings. FIGS. 6(*a*) through 42(*c*) are respectively cross-sectional views or plan views showing, in process order, one example of the method of manufacturing the DRAM according to the present embodiment 1. Unless otherwise specified, the cross-sectional views respectively show a cross section taken along line C—C in FIG. 3 and a cross section of a peripheral circuit portion.

A p-type semiconductor substrate 1 having a specific resistivity of about 10Ω·cm, for example, is first prepared. Shallow grooves 8 each having a depth of 0.3 μm, for example, are defined in a principal surface of the semiconductor substrate 1. Thereafter, the semiconductor substrate 1 may be subjected to thermal oxidation to form a silicon oxide film. Further, the silicon oxide film is deposited and polished by the CMP process so as to leave it only within each shallow groove 8, whereby a separation region 7 is formed.

Incidentally, the patterns for active regions L1 surrounded by the separation regions 7 at this time correspond to linear plane patterns as shown in FIG. 6(*a*), respectively. Therefore, the factors such as interference to exposure light, etc. that reduce processing accuracy, are eliminated to the utmost upon processing of each shallow groove 8 by photolithography, and its processing can be done with satisfactory accuracy even in the vicinity of the processing limit of the photolithography.

Next, phosphorus ions having an acceleration energy of 2300 keV and a dose of $1\times10^{13}/cm^2$ is implanted in the semiconductor substrate with a photoresist as a mask to thereby form a deep well 6. Next, phosphorus ions having an acceleration energy of 1000 keV, phosphorus ions having an acceleration energy of 460 keV, and phosphorus ions having an acceleration energy of 180 keV are respectively superimposedly ion-implanted therein under conditions of a dose of $1\times10^{13}/cm^2$, a dose of $3\times10^{12}/cm^2$ and a dose of $5\times10^{11}/cm^2$, respectively, with a photoresist being used as a mask to thereby form an n-type well 4. Further, boron ions having an acceleration energy of 500 keV, boron ion having an acceleration energy of 150 keV, and boron ions having an acceleration energy of 50 keV are respectively superimposedly ion-implanted therein under conditions of a dose of $1\times10^{13}/cm^2$, a dose of $3\times10^{12}/cm^2$ and a dose of $5\times10^{11}/cm^2$, respectively, with a photoresist being used as a mask to thereby form p-type wells 2 and 3 (see FIG. 6(*b*)). Moreover, boron difluoride ($BF_2$) ions having an acceleration energy of 70 keV may be ion-implanted into the entire surface of the semiconductor substrate 1 under a condition of a dose of $1.5\times10^{12}/cm^2$.

Figure 7:
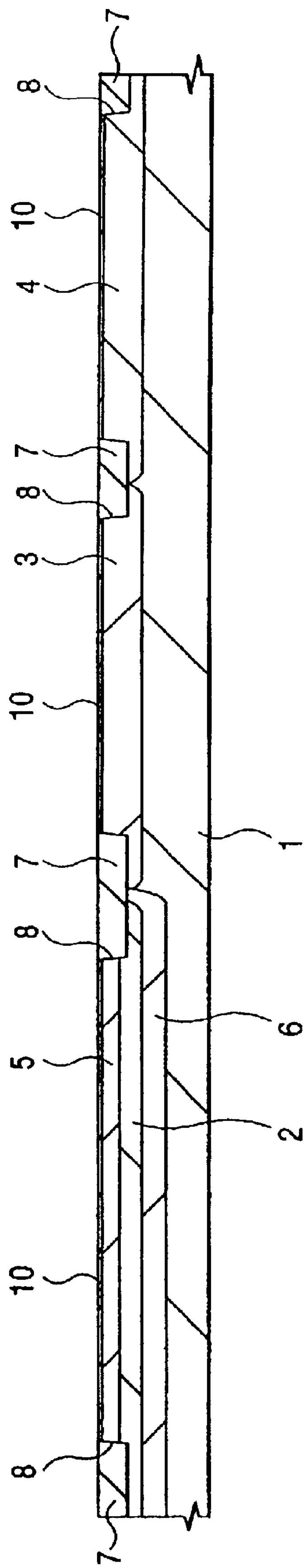

Next, a gate insulating film 10 is formed in an active region in which the p-type wells 2 and 3 and the n-type well 4 are formed, by a thermal oxidation method. Further, boron ions having an acceleration energy of 20 keV are ion-implanted under a condition of a dose of $3\times10^{12}/cm^2$ using, as a mask, a photoresist in which a memory cell region (region A) of the DRAM is opened, thereby forming a threshold voltage control layer 5 of each memory cell selection MISFET Qs (see FIG. 7). Owing to the threshold voltage control layer 5, the threshold voltage of the memory cell selection MISFET Qs can be adjusted to about 0.7V.

Figure 8A:
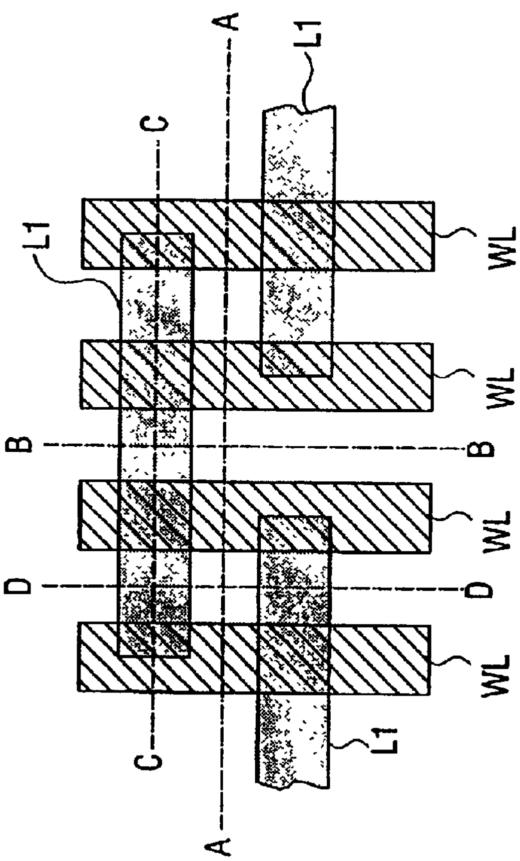
Figure 8B:
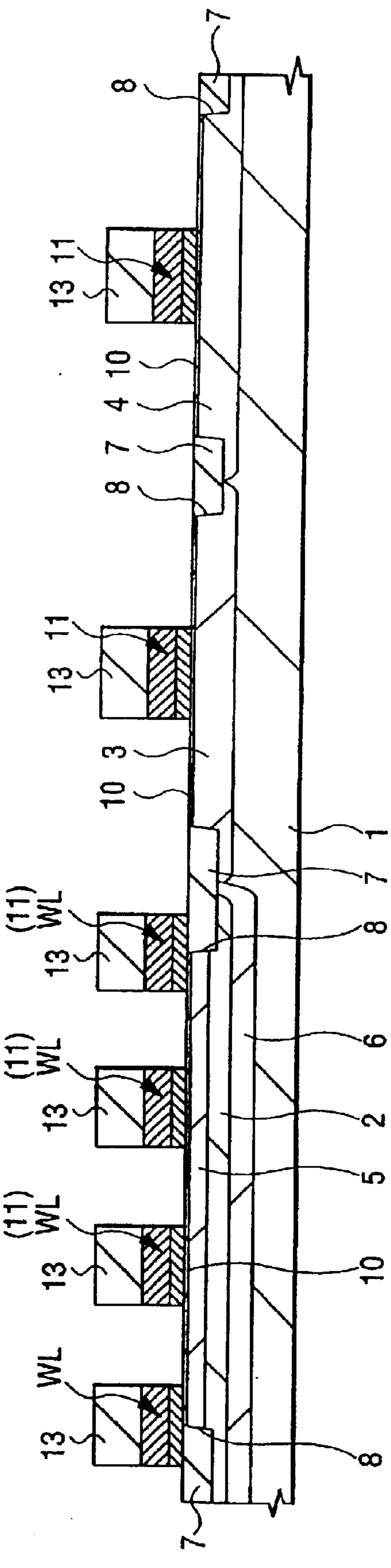

Next, a polycrystal silicon film in which, for example, phosphorus is introduced in a concentration of $3\times10^{20}/cm^3$ as an impurity, is formed over the entire surface of the semiconductor substrate 1 with a thickness of 50 nm. Next, a tungsten silicide film is deposited thereon with a thickness of 100 nm, for example. Further, a silicon nitride film is deposited with a thickness of 200 nm, for example. The polycrystalline silicon film and the silicon nitride film can be formed by a CVD (Chemical Vapor Deposition) process, for example, whereas the tungsten silicide film can be formed by sputtering. Thereafter, the silicon nitride film, tungsten silicide film and polycrystal silicon film are patterned by a photolithography technique and an etching technique to thereby form gate electrodes 11 (word lines WL) and cap insulating films 13 (see FIG. 8(*b*)). Patterns for the word lines WL (cap insulating films 13 are also similar to them) at this time are illustrated in FIG. 8(*a*). It is understood that each word line BL is linearly patterned and the photolithography can be easily performed even at its processing limit.

Figure 9:
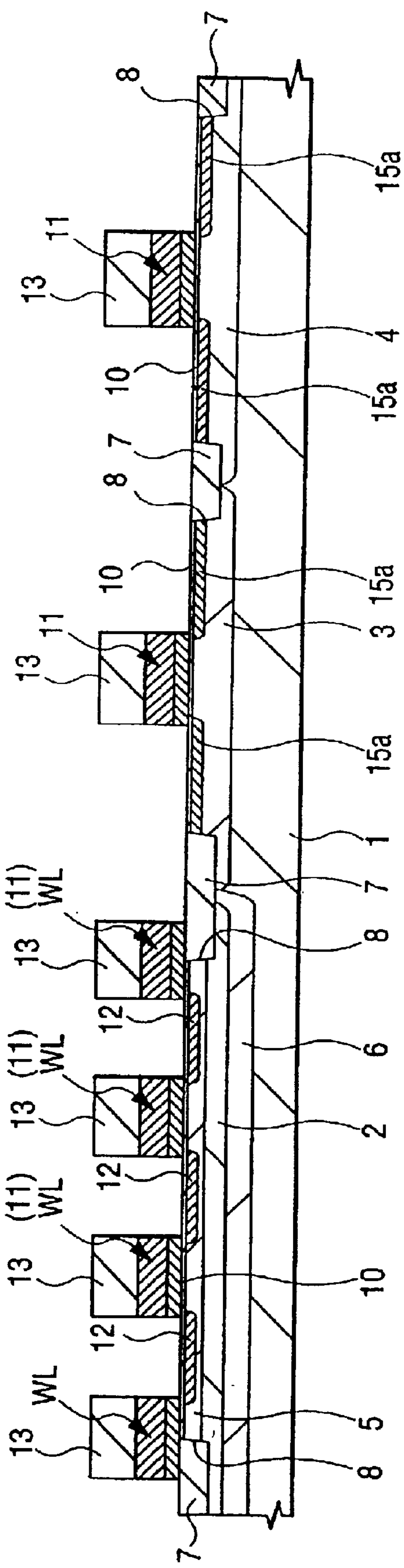

Next, an impurity such as arsenic (As) or phosphorus is ion-implanted in the memory cell forming region (region A) and a region for forming each n channel MISFET Qn, of a peripheral circuit region (region B) with the cap insulating films 13 and the gate electrodes 11 and the photoresist as masks thereby to form semiconductor regions 12 and a low-density impurity region 15*a* for each n channel MISFET Qn. Thereafter, an impurity, e.g., boron (B) is ion-implanted in a region for forming each p channel MISFET Qp, of the peripheral circuit region (region B) to thereby form a low-density impurity region 15*a* for each p channel MISFET Qp (see FIG. 9).

Next, a silicon nitride film 14 is deposited over the entire surface of the semiconductor substrate 1 with a thickness of 30 nm, for example. Incidentally, the silicon nitride film 14 is subjected to anisotropic etching with a photoresist film formed only in the memory cell forming region (region A) as a mask, thereby to leave the silicon nitride film 14 only over the semiconductor substrate 1 lying in the region A. At the same time sidewall spacers may be formed on side walls of the gate electrodes 11 lying in the region B.

Next, a photoresist film is formed in the memory cell forming region (region A) and the region for forming each n channel MISFET Qn, of the peripheral circuit region (region B). Further, an impurity, e.g., boron is ion-implanted with the photoresist film and the silicon nitride film 14 as masks to thereby form a high-density impurity region 15*b* for each p channel MISFET Qp. Moreover, the photoresist film is formed in the memory cell forming region (region A) and a region for forming the p channel MISFET Qp, of the peripheral circuit region (region B). Using the photoresist film and the silicon nitride film 14 as masks, an impurity, e.g., phosphorus is ion-implanted to form a high-density impurity region 15*b* for each n channel MISFET Qn (see FIG. 10).

Figure 11:
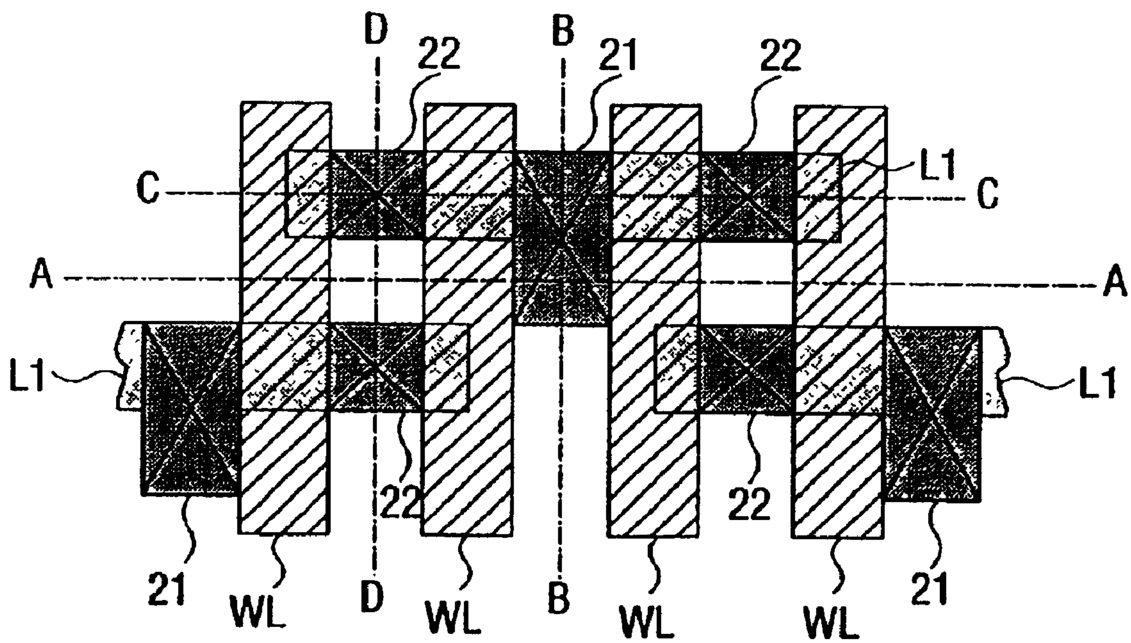
Figures 12A, 12B, 12C, 12D:
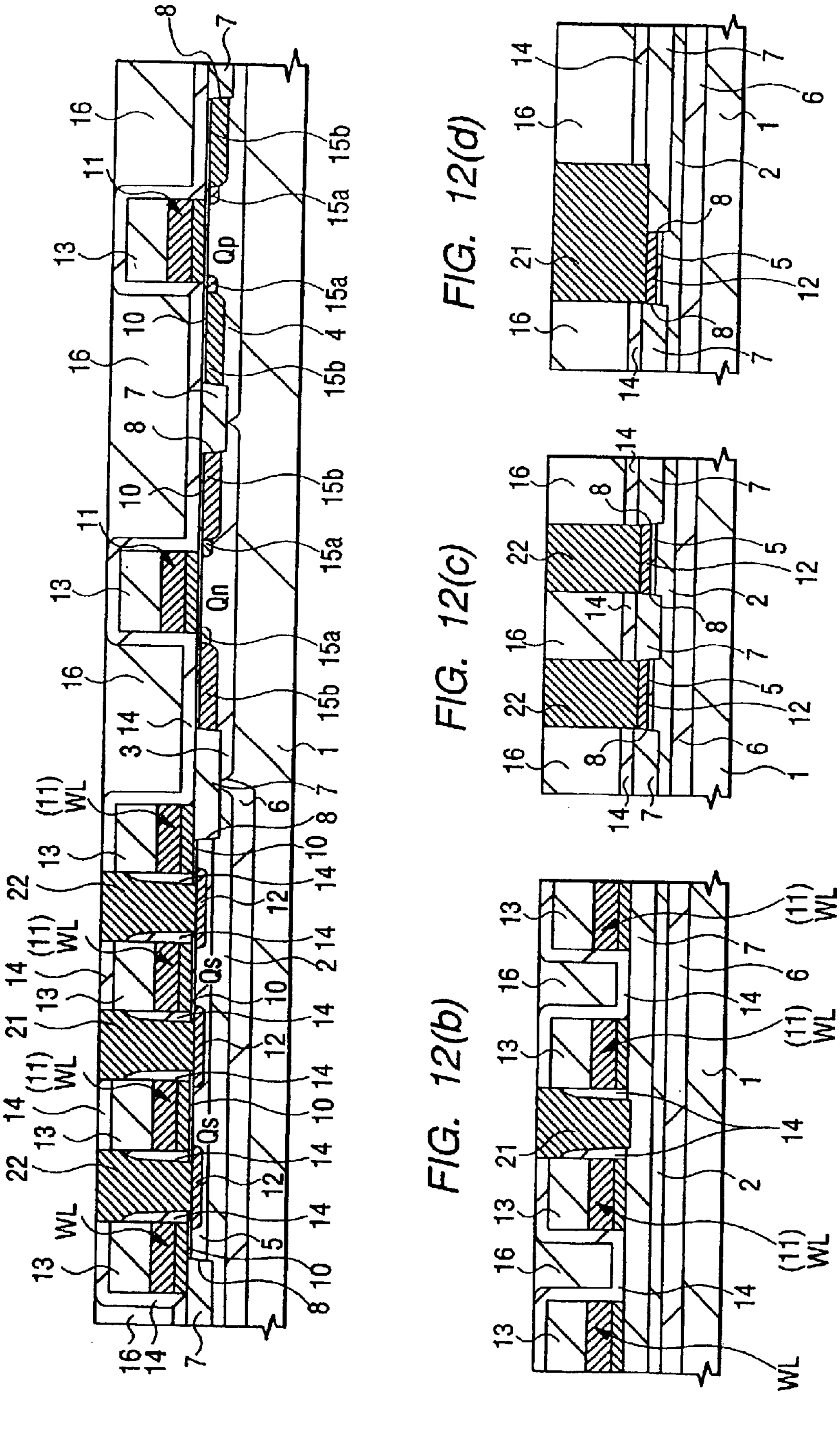
FIGS. 12(*b*), 13(*b*), 14(*b*), 16(*b*), 17(*b*), 19(*b*), 20(*b*), 22(*b*), 23(*b*), 25(*b*), 26(*b*), 27(*b*), 29(*a*), 32(*a*), 34(*a*), 36(*a*), 38(*a*), 40(*a*) and 42(*a*) are respectively manufacturing-process cross-sectional views corresponding to FIG. 5(*a*)
Figure 13A:
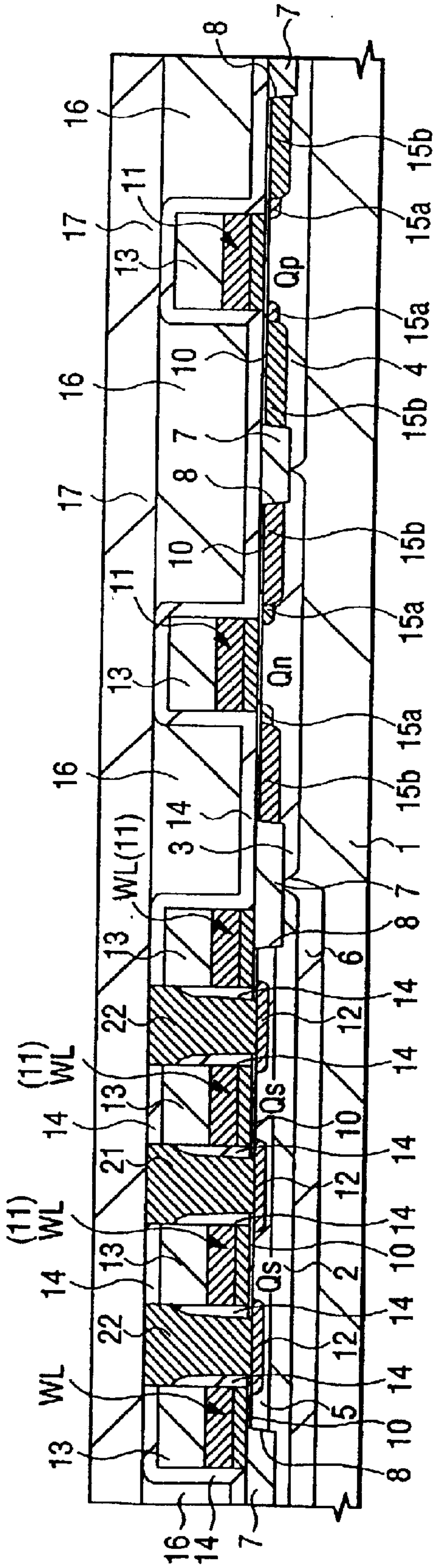
Figure 13B:
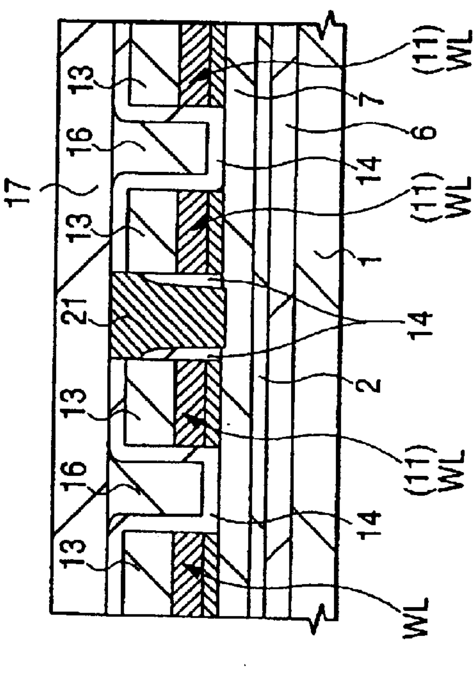
Figure 13C:
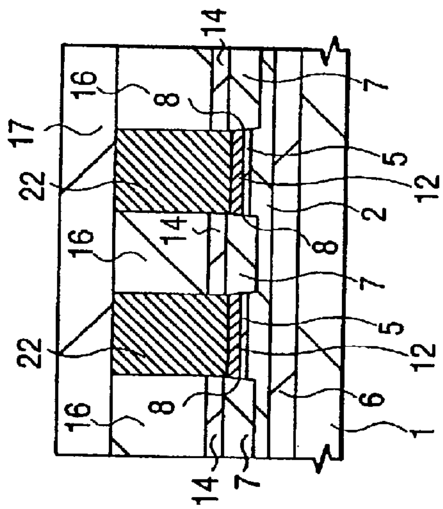
Figure 13D:
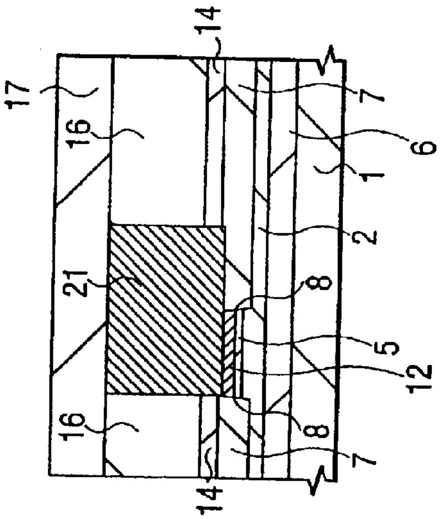

Next, a silicon oxide film having a thickness of 400 nm, for example, is formed by the CVD process and is further polished and flattened by the CMP (Chemical Mechanical Polishing) process, thereby forming an insulating film 16. In the memory cell forming region (region A), each interval defined between the adjacent word lines WL is completely filled with the insulating film 16 to provide a flat surface hereafter, connecting holes corresponding to patterns for connecting plugs 21 and connecting plugs 22 shown in FIG. 11 are opened and subjected to plug-implantation, after which a polycrystal silicon film doped with an impurity is deposited and polished by the CMP process, whereby the connecting plugs 21 and 22 are formed (see FIGS. 12(*a*) to 12(*d*)). Incidentally, FIG. 12(*a*) shows a cross section taken along line C—C in FIG. 3 and a cross section of a peripheral circuit portion, FIG. 12(*b*) illustrates a cross section taken along line A—A in FIG. 3, FIG. 12(*c*) depicts a cross section taken along line D—D in FIG. 3, and FIG. 12(*d*) shows a cross section taken along line B—B in FIG. 3, respectively. They are similarly illustrated in FIGS. 13(2)–13(*d*), 14(*a*)–14(*d*), 16(*a*)–16(*d*), 17(*a*)–17(*d*), 19(*a*)–19(*d*), 20(*a*)–20(*d*), 22(a)–22(d), 23(*a*)–23(*d*), 25(*a*)–25(*d*), 26(*a*)–26(*d*) and 27(*a*)–27(*d*).

The plug implantation allows, for example, a phosphorus ion to be set to an acceleration energy of 50 keV and a dose of $1\times10^{13}/cm^2$. The introduction of the impurity into the polycrystal silicon film can be done by introducing phosphorus having a concentration of $2\times10^{20}/cm^3$ therein by the CVD process, for example. Incidentally, the connecting holes are opened by two-stage etching so that the semiconductor substrate 1 can be prevented from excessive etching. Further, the connecting plugs 21 and 22 can be also formed by an etchback process or method.

Next, an insulating film 17 for wiring formation is formed (see FIG. 13). The insulating film 17 can be formed as a silicon oxide film produced by the CVD process, for example. The thickness of the insulating film 17 is set as 200 nm, for example.

Figures 14A, 14B, 14C, 14D:
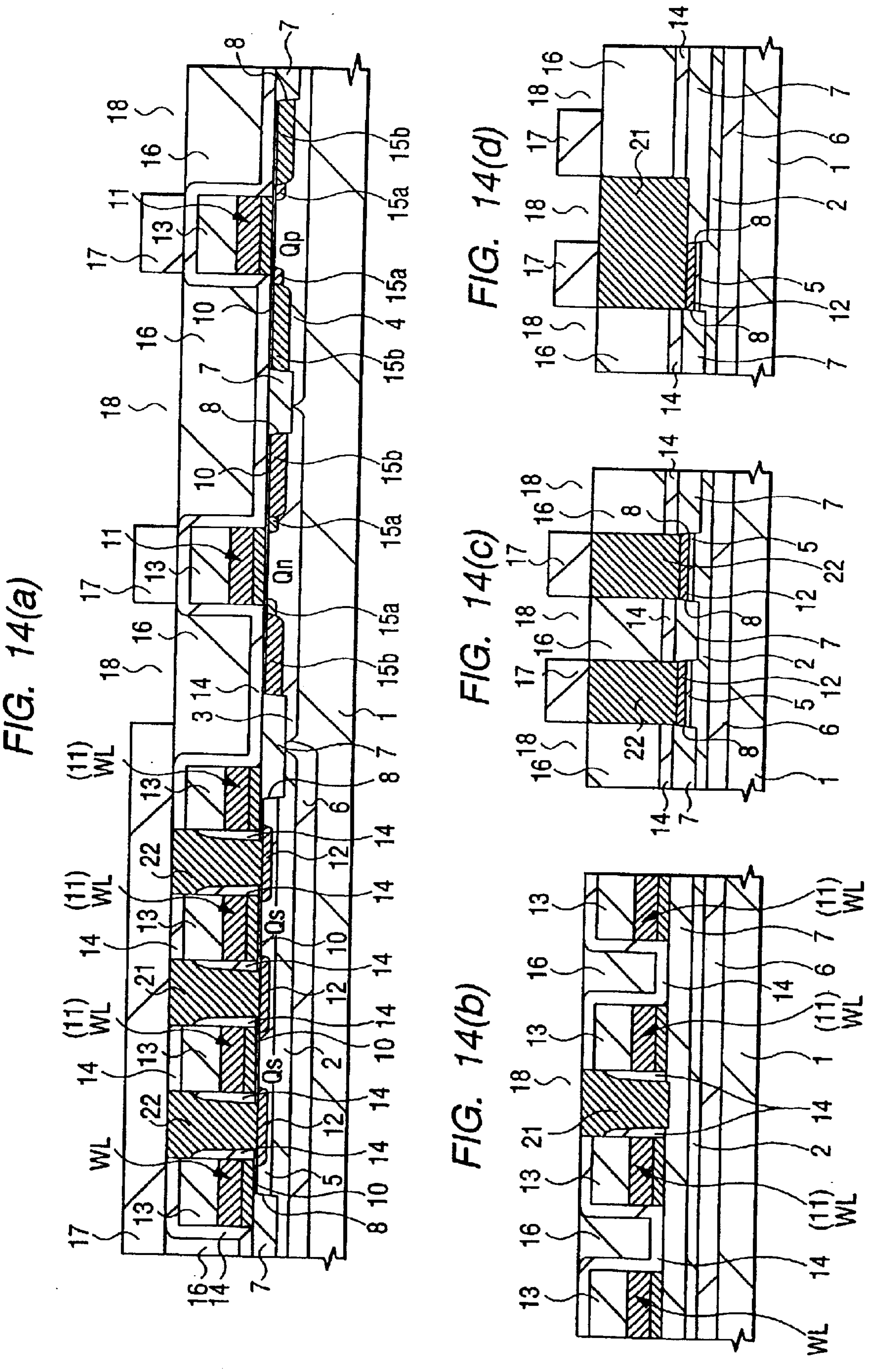
Figure 15:
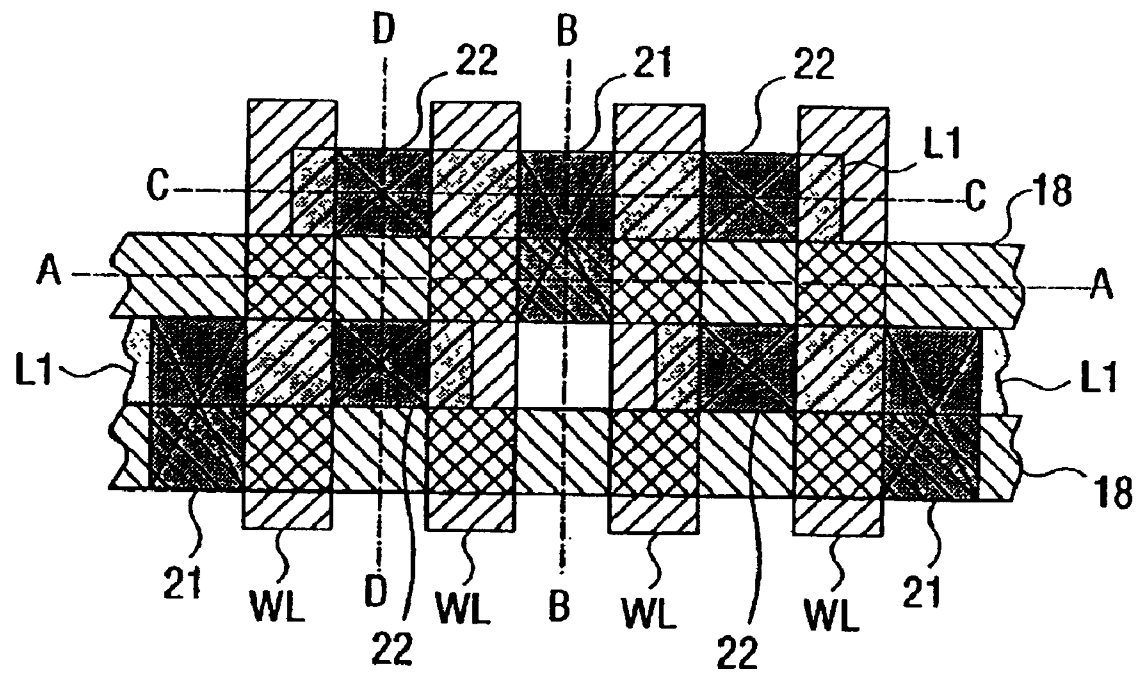

Next, each of interconnection or wiring grooves 18 each having 200 nm is defined in the insulting film 17 (see FIG. 14(*a*)). The wiring groove 18 is defined at the processing limit of photolithography and is formed with a groove width of 0.18 μm, for example. FIG. 15 shows a plane pattern thereof. Since each wiring groove 18 defined between the bit lines BL is formed in a linearly-shaped pattern, the wiring groove 18 can be formed with sufficient processing accuracy even at the processing limit of photolithography.

Figures 16A, 16B, 16C, 16D:
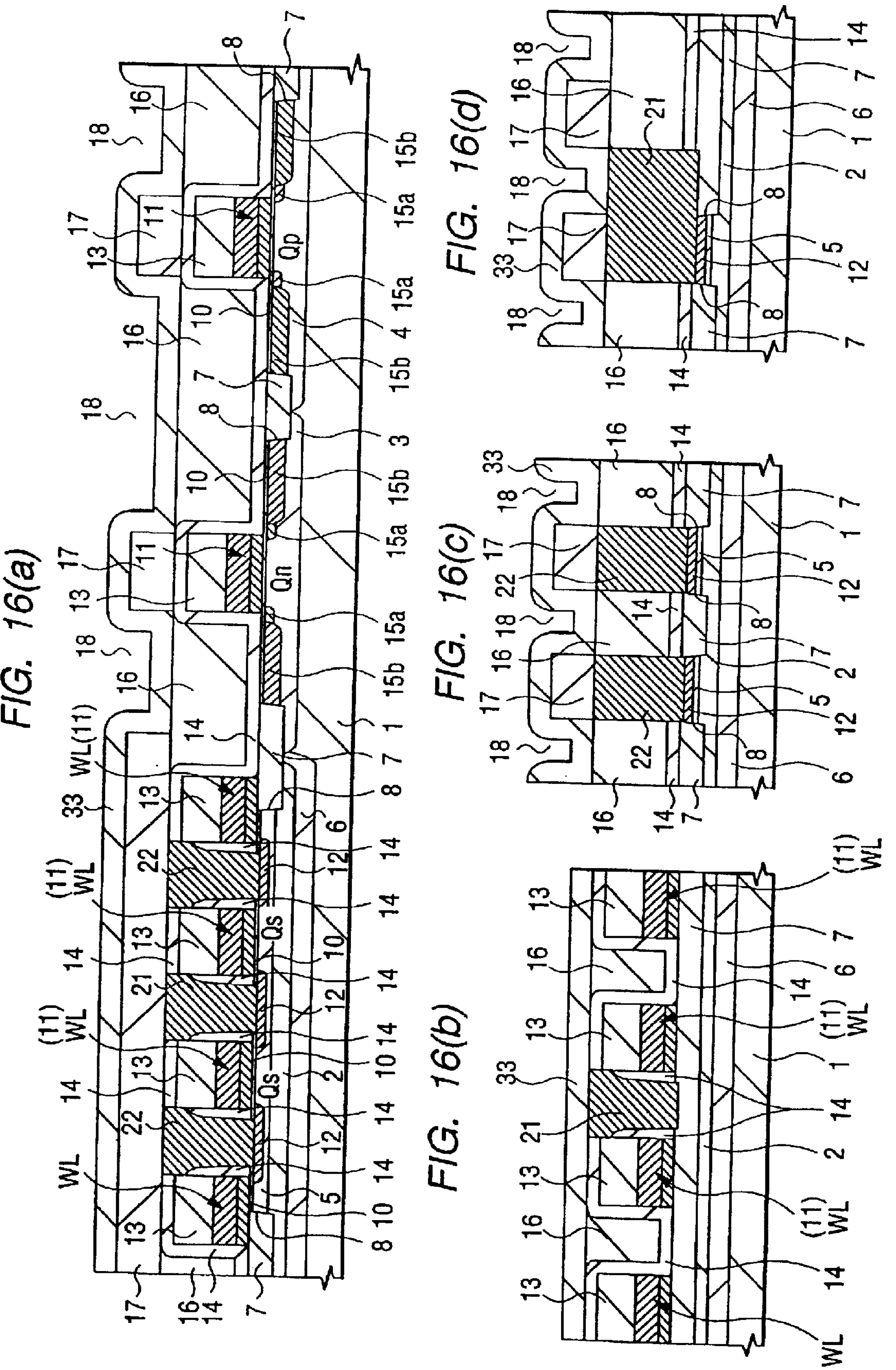
Figure 17A:
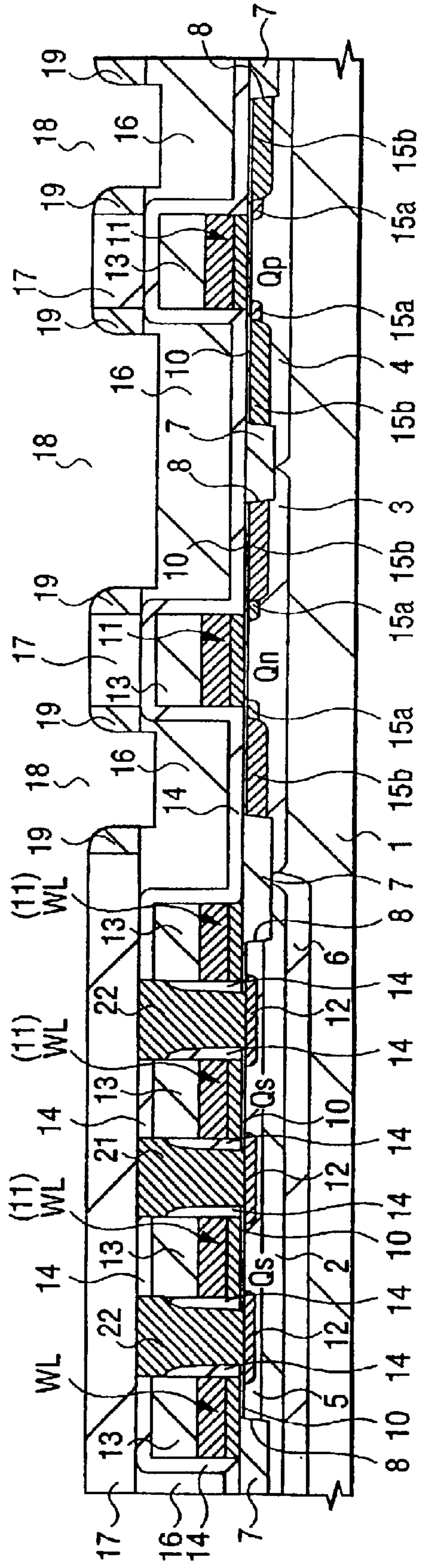
Figure 17B:
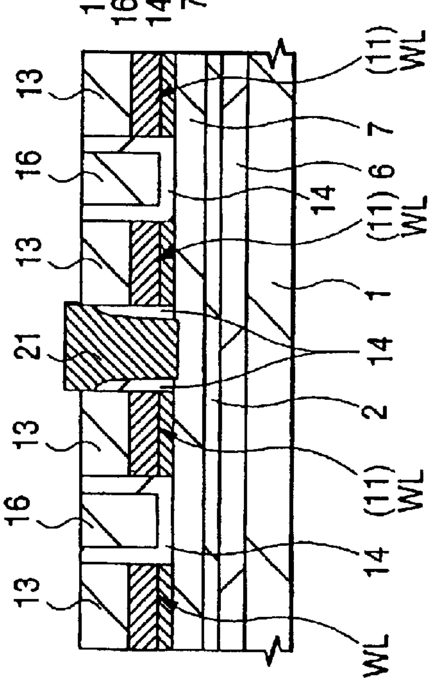
Figure 17C:
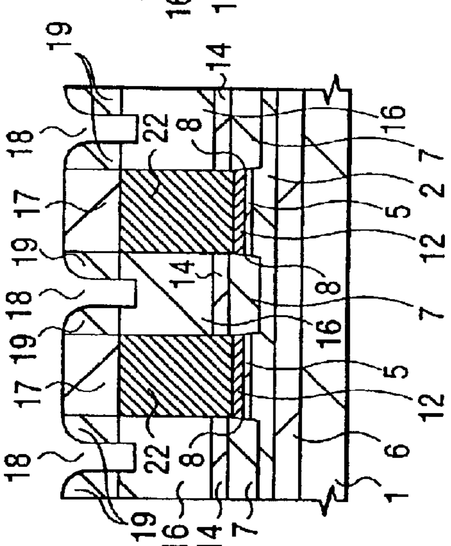
Figure 17D:
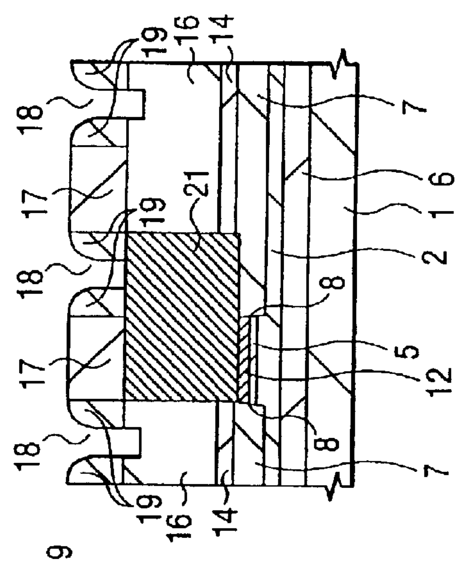

Next, an insulating film 33 for covering each wiring groove 18 is deposited over the entire surface of the semiconductor substrate 1 (see FIG. 16(*a*)). The insulating film 33 can be formed as a silicon oxide film or a silicon nitride film formed by the CVD process, for example. The thickness of the insulating film 33 is set as 60 nm, for example.

The insulating film 33 is next subjected to anisotropic etching to thereby form sidewall spacers 19 on the corresponding side walls of the wiring grooves 18 (see FIG. 17(*a*)). The thickness of each sidewall spacer 19 is defined according to the thickness of the insulating film 33 and is about 60 nm. Since each sidewall spacer 19 is formed in this way, the width of the wiring groove 18 can be narrowed by a width corresponding to the thickness of the sidewall spacer 19. Namely, the width of the wiring groove 18 processed to 0.18 μm corresponding to the processing limit of photolithography can be narrowed to 60 nm equal to a width interposed between the sidewall spacers 19 of 60 nm in thickness. This means that the width of each bit line BL to be described later can be formed to be 60 nm thinner than 0.18 μm corresponding to the processing limit of photolithography.

Incidentally, some of the insulating film 16 is excessively etched according to the anisotropic etching process so that each wiring groove 18 is formed to be slightly deep. However, this makes it possible to reliably expose the surface of each connecting plug 21 (see FIG. 17(*b*)). Thus, the connecting plugs 21 and the bit lines BL can be connected to one another with satisfactory reliability. Further, portions connected to the connecting plugs 21 can be made bare or exposed simultaneously owing to the processing of the wiring grooves 18 and the processing of the sidewall spacers 19. In the conventional method, the bit lines have been formed after the processing of the connecting portions for connecting the bit lines and the connecting plugs. In the method according to the present invention, however, such a connecting-hole processing step becomes unnecessary. It is therefore possible to simplify such a processing step. Further, since each wiring groove 18 is formed to be slightly deep by the excessive etching at the time of processing of the sidewall spacers 19, the cross-sectional area of each bit line BL can be made great by increasing the height of the bit line BL. Since the bit lines BL and the first layer interconnection 20 are formed simultaneously, the effect of increasing the cross-sectional area of each bit line BL is obtained simultaneously with the effect of reducing the resistance value of the first layer interconnection 20 as will be described later. Therefore, the resistance values of each bit line BL and the first layer interconnection 20 are reduced so that the performance of the DRAM can be enhanced.

Figure 18:
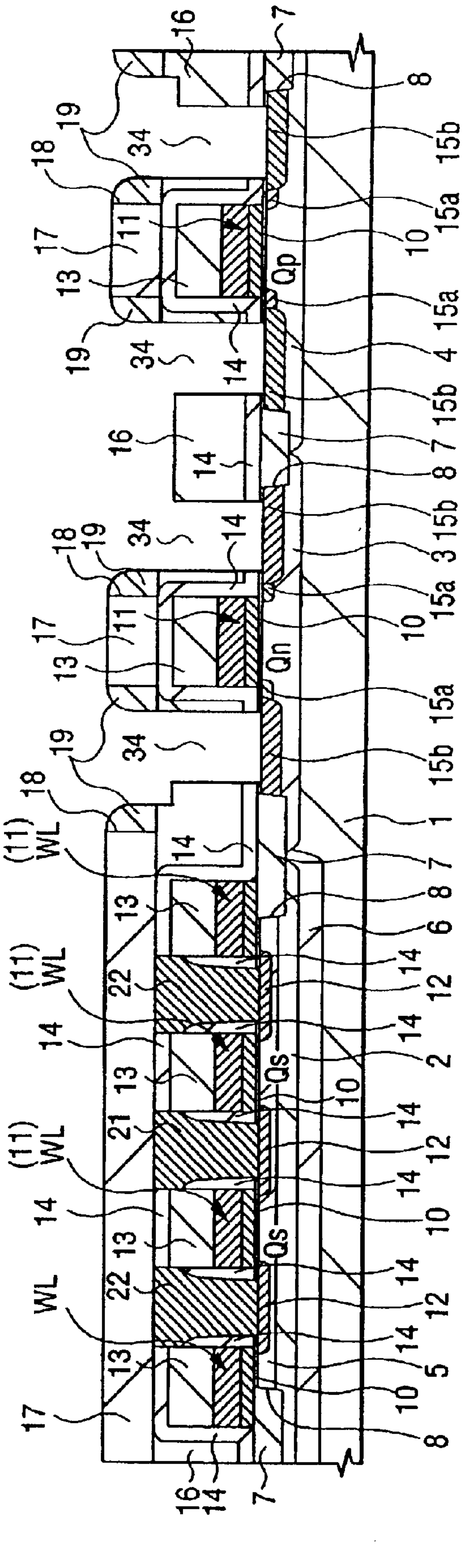

Next, connecting holes 34 are defined with a photoresist film having an opening on each high-density impurity region 15*b* in the peripheral circuit region (region B) as a mask (see FIG. 18). Each connecting hole 34 is used to directly connect the first layer interconnection 20 to be described later to the high-density impurity region 15*b*. As a result, the performance of the DRAM can be improved by reducing the wiring resistance in the peripheral circuit region (region B). Incidentally, connecting plugs may be previously formed in a region in which the connecting holes 34 are defined.

Figures 19A, 19B, 19C, 19D:
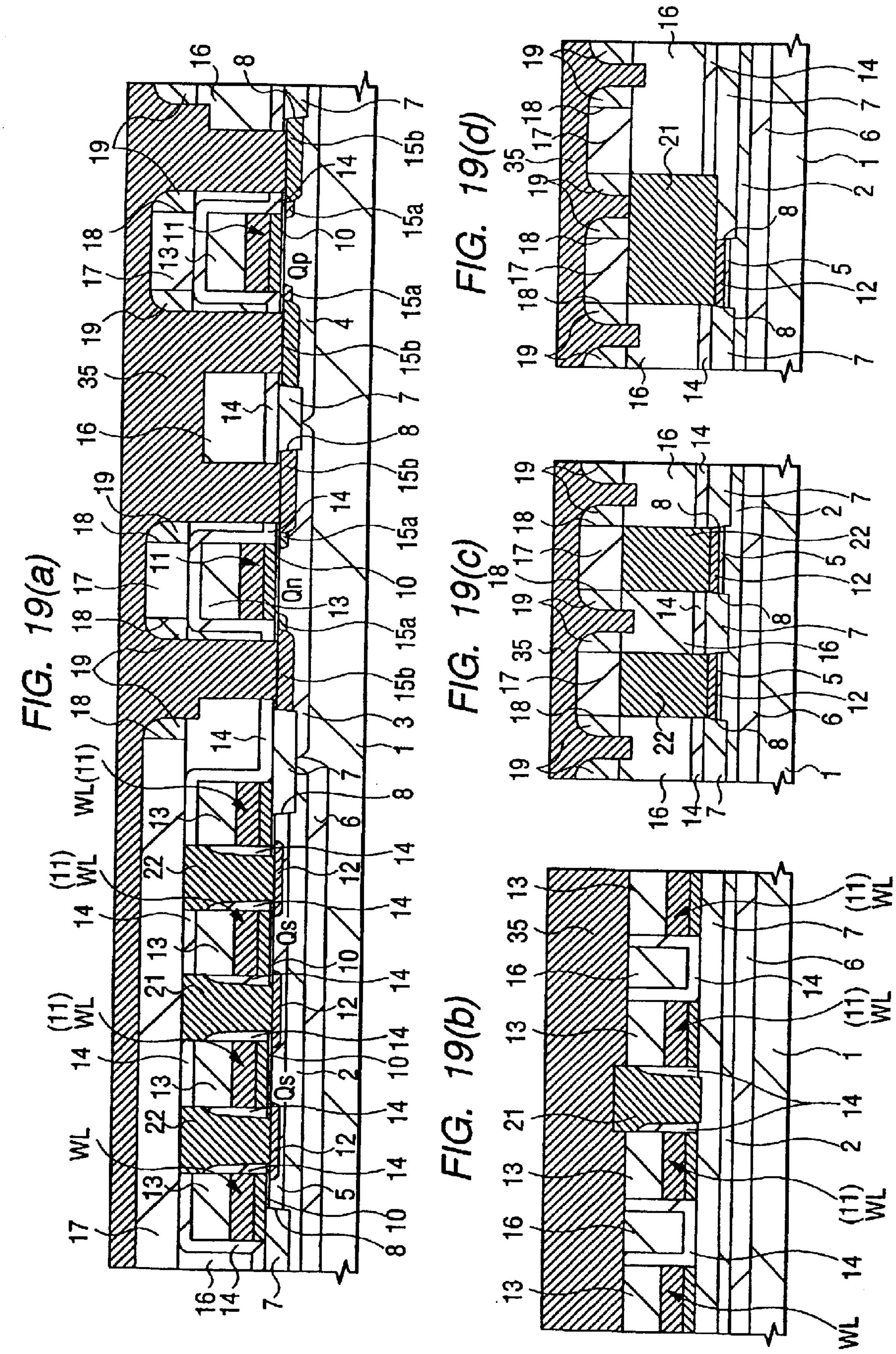

A tungsten film 35 having a thickness of 300 nm is next formed over the entire surface of the semiconductor substrate 1 by sputtering, for example (see FIG. 19). While the tungsten film 35 is illustrated here by way of example, another metal film, e.g., a copper film or the like may be used. However, the metal film may preferably be a metal having a high melting point if consideration is given to a decrease in reliability due to the thermal diffusion of metal atoms into the semiconductor substrate 1. As the metal, molybdenum, tantalum, niobium or the like may be suggested by way of example.

Figures 20A, 20B, 20C, 20D:
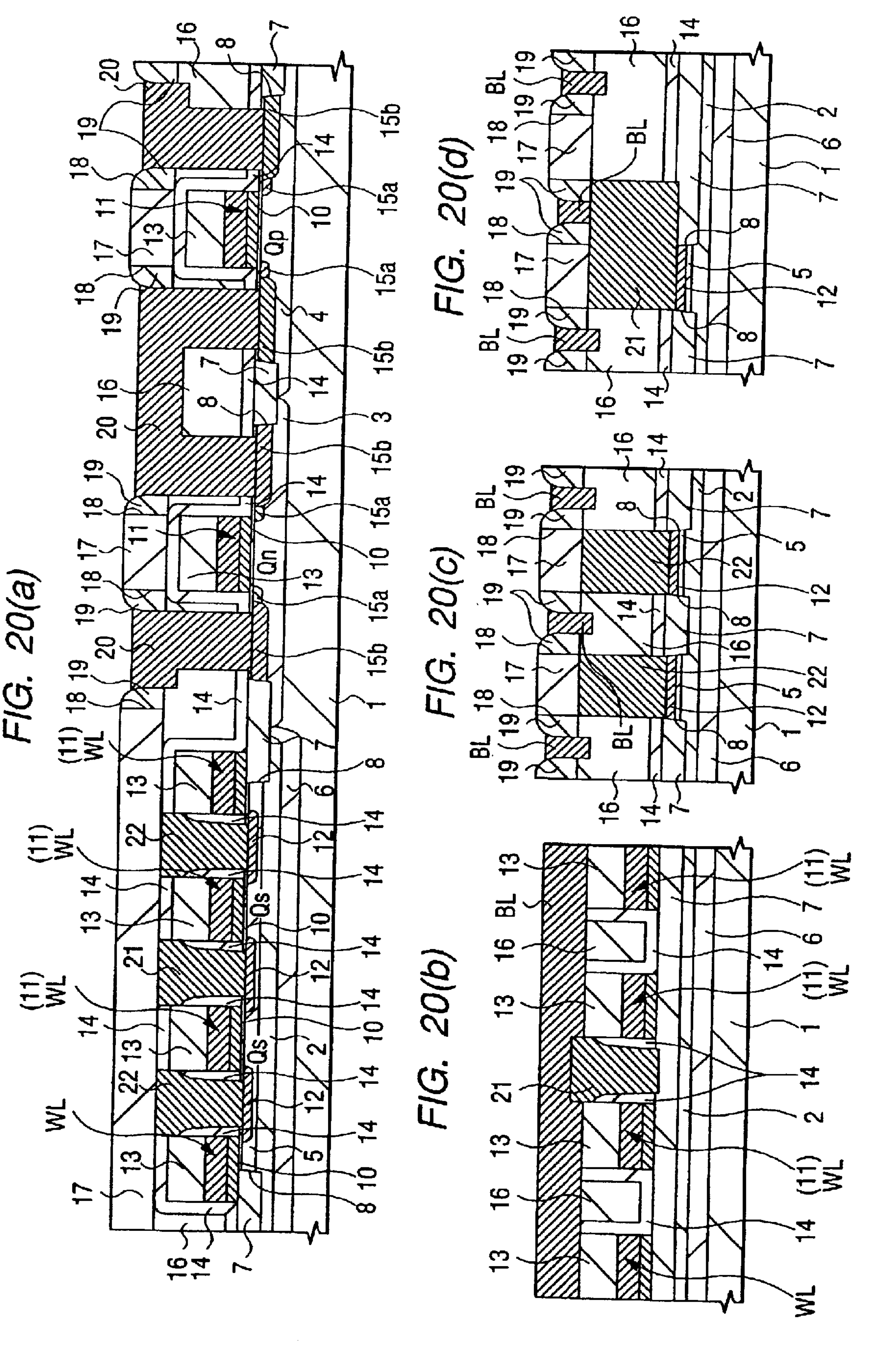
Figure 21:
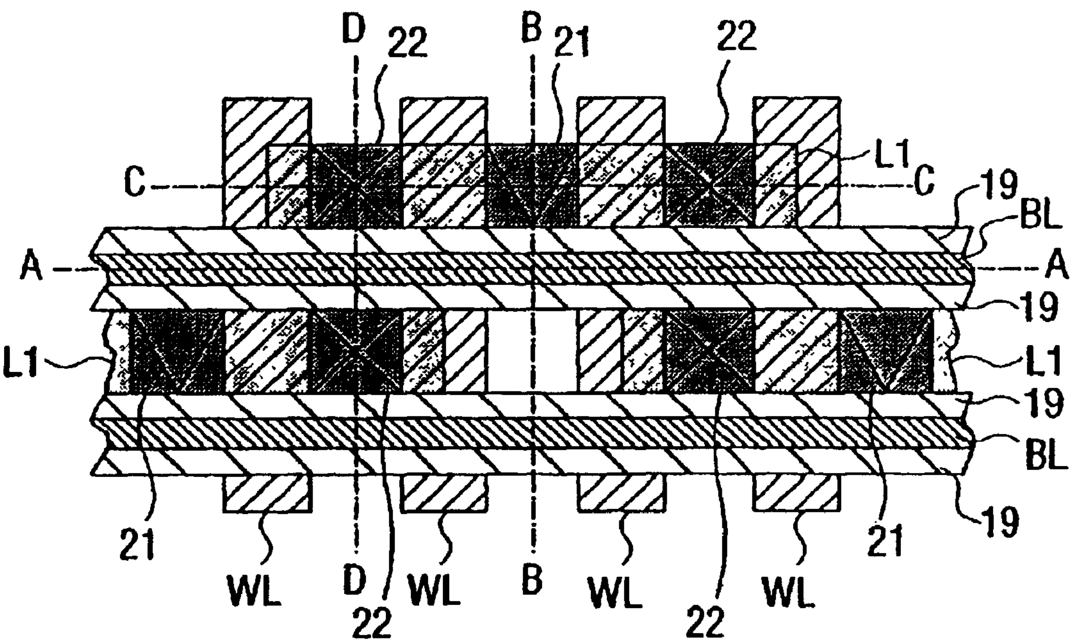

Next, the tungsten film 35 is polished by the CMP process, for example to thereby remove the tungsten film 35 other than the portion, i.e., tungsten film above the wiring grooves 18 and the sidewall spacers 19, whereby each bit line BL and the first layer interconnection 20 are formed (see FIG. 20(*a*)). Plane or flat patterns of the bit lines BL at this time are shown in FIG. 21. Each bit line BL is defined in its corresponding wiring groove 18 interposed between the sidewall spacers 19, and the wiring width thereof is about 60 nm.

Incidentally, portions for connecting the first layer interconnection 20 and the high-density impurity regions 15*b* are simultaneously formed in the present process because the tungsten film 35 is embedded even inside the connecting holes 34 in the process of forming the tungsten film 35.

Further, the polishing using the CMP process is excessively done in the process of polishing the tungsten film 35 so that the surface of the tungsten film 35 can be formed so as to be lower in height than the surface of the insulating film 17 in which each wiring groove 18 is defined, i.e., the upper end of each sidewall spacer 19. Since the surface of the tungsten film 35 is formed low in this way, the effect of reducing the width of each bit line BL can be effectively brought about. Namely, the upper end of the sidewall spacer 19 becomes normally thin as shown in FIG. 20(*c*) or the like. When the bit line BL is formed up to the upper end of each sidewall spacer 19 in such a case, the width of an upper portion of the bit line BL becomes thick even though the width of a lower portion of the bit line BL is sufficiently thin, whereby the line-width reduction effect cannot be sufficiently brought about. To cope with this problem in the present embodiment, polishing using the CMP process is excessively performed to thereby positively produce dishing in the region for forming each bit line BL and the first layer interconnection 20, whereby the surface of each bit line BL is formed so as to be lower than the upper end of the sidewall spacer 19. Incidentally, the insulating film 17 with each wiring groove 18 defined therein and the sidewall spacers 19 may be simultaneously polished and removed by controlling polishing conditions based on the CMP process.

Incidentally, the etchback process may be used to remove the tungsten film 35.

Figures 22A, 22B, 22C, 22D:
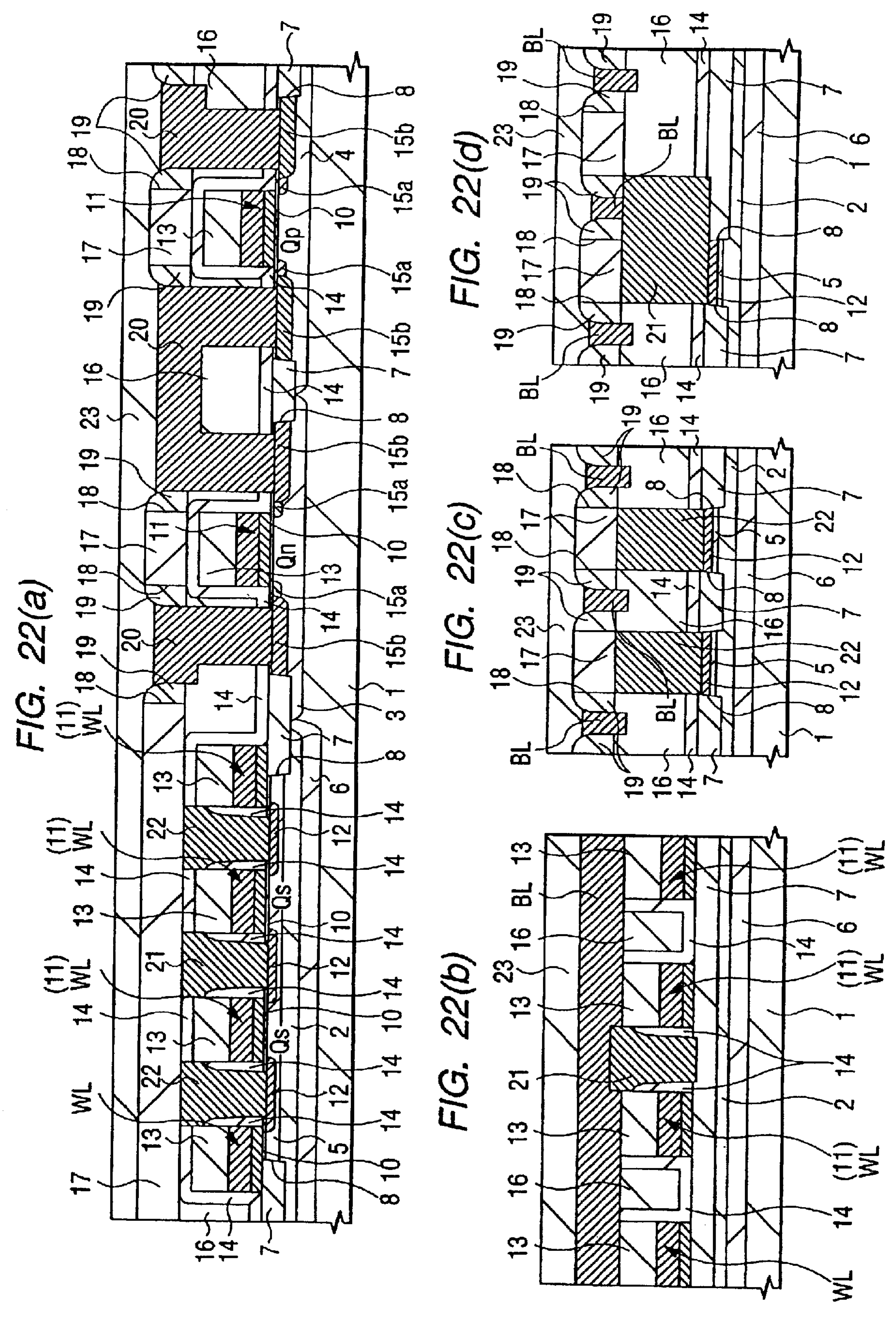
Figure 23A:
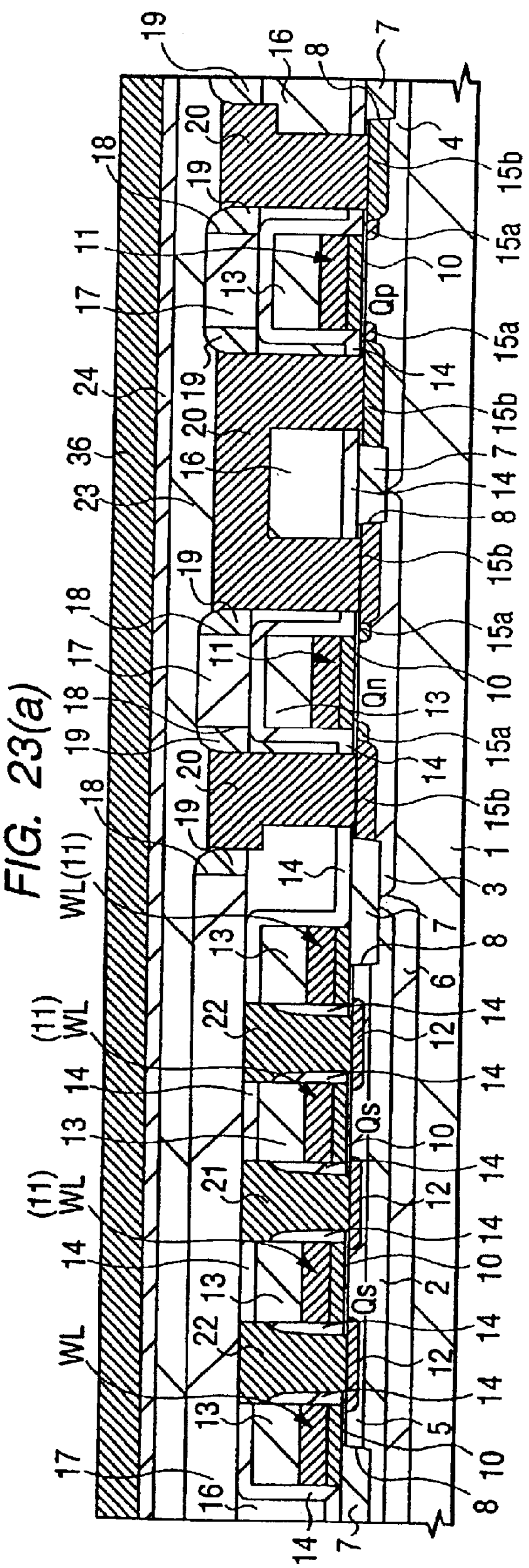
Figure 23B:
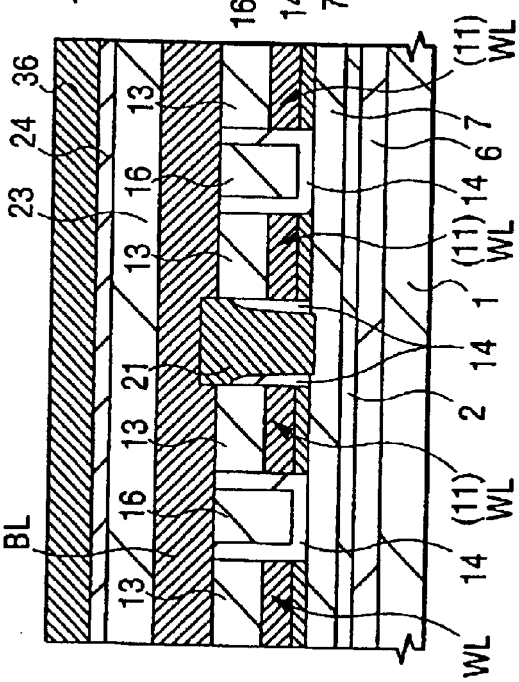
Figure 23C:
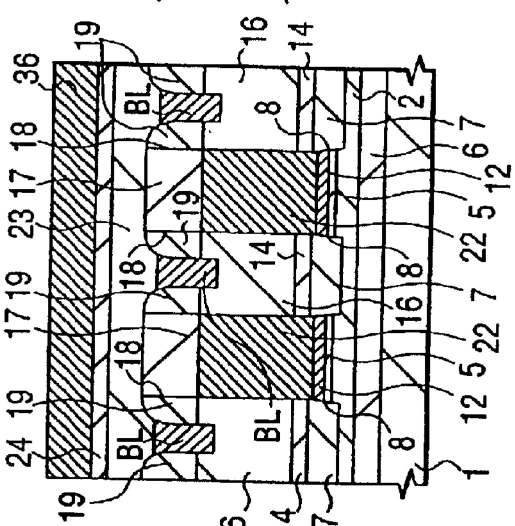
Figure 23D:
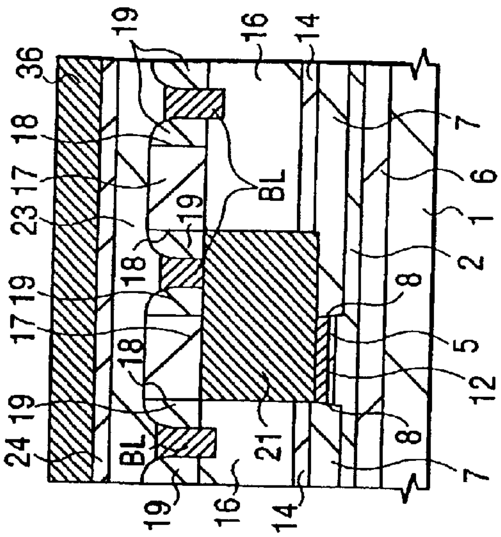

Next, a silicon oxide film is deposited over the entire surface of the semiconductor substrate 1 by the CVD process, for example. Further, the silicon oxide film is polished and flattened by the CMP process to form an interlayer insulating film 23 (see FIG. 22(*a*)).

A silicon nitride film 24 and a polycrystalline silicon film 36 are next deposited over the entire surface of the semiconductor substrate 1 (see FIG. 23(*a*)). Phosphorus having a concentration of $3\times10^{20}/cm^3$, for example, can be introduced into the polycrystalline silicon film 36, and the thickness thereof is 100 nm, for example.

Figure 24:
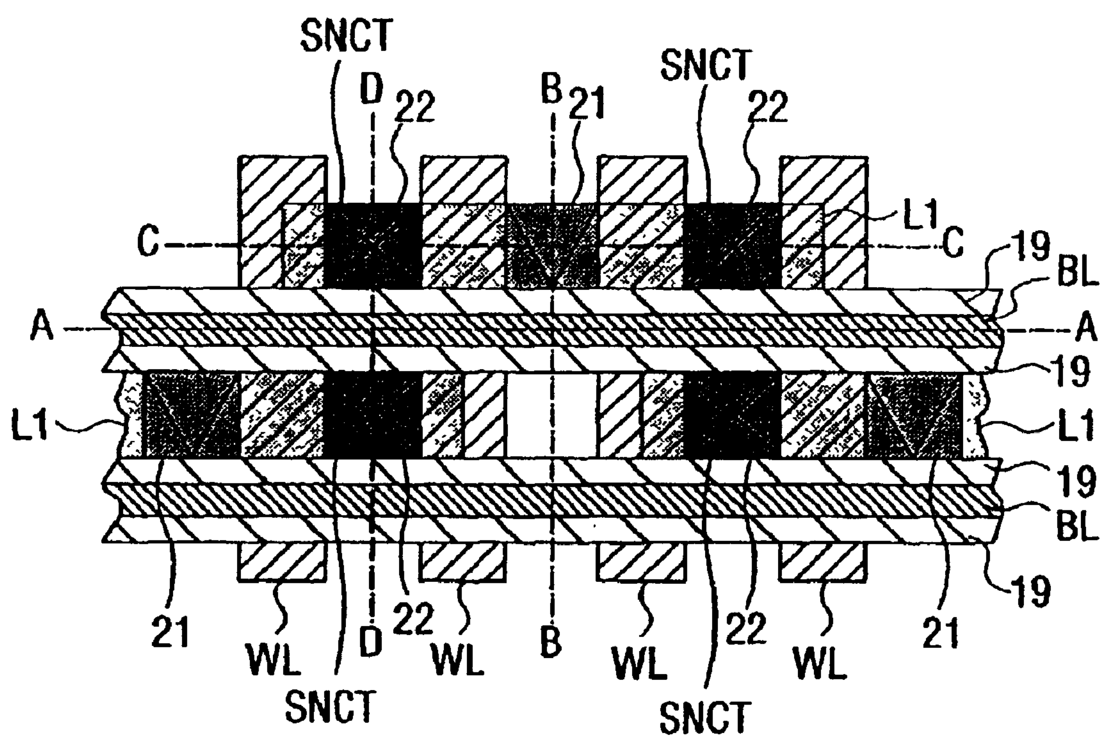
Figures 25A, 25B, 25C, 25D:
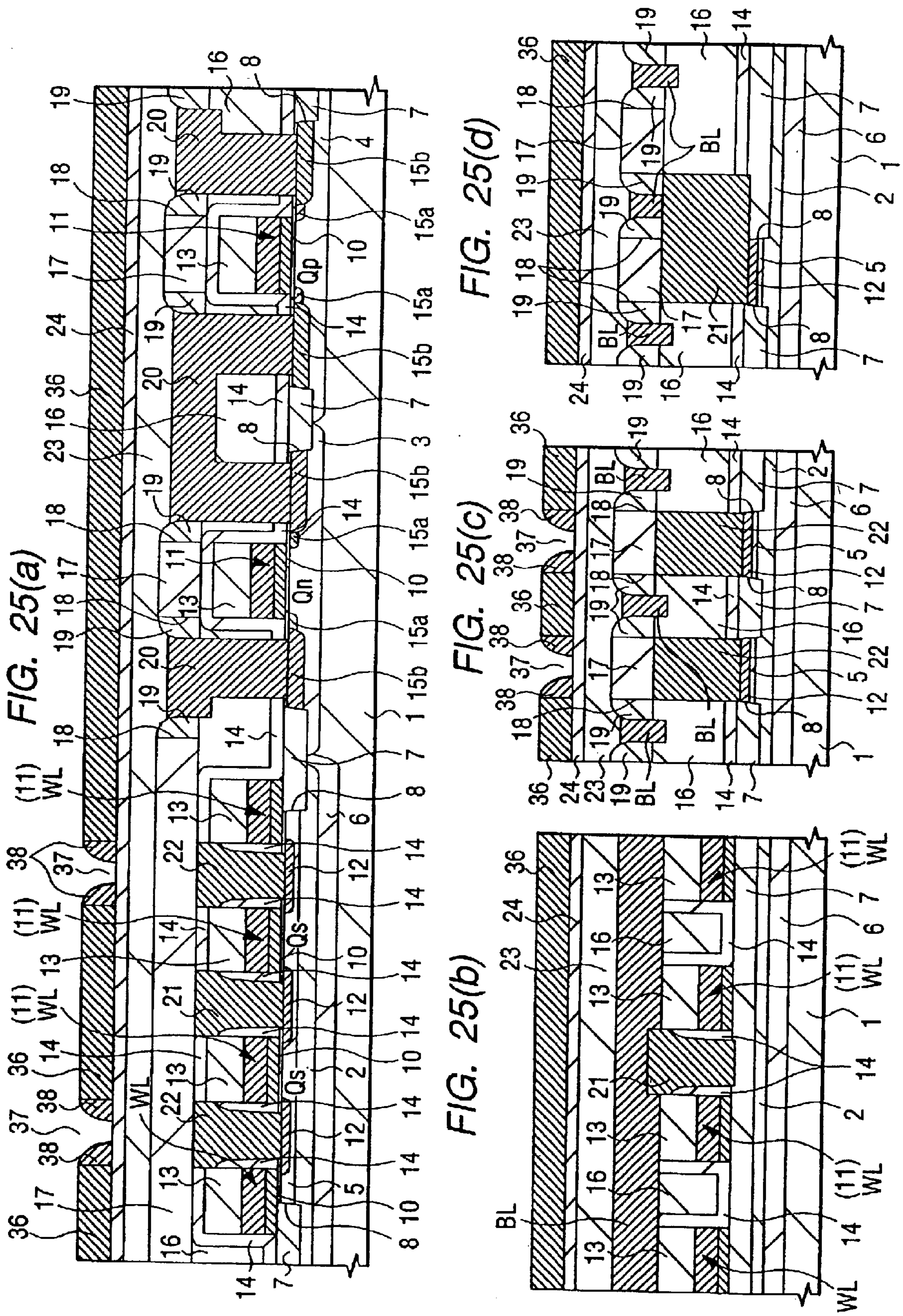

Next, openings 37 are defined in the polycrystal silicon film 36 with SNCT patterns shown in FIG. 24. The diameter of each opening 37 is 0.22 $\mu$m, for example. Thereafter, a polycrystal silicon film similar to the polycrystal silicon film 36 is deposited over the entire surface of the semiconductor substrate 1 with a thickness of 70 nm and thereafter is subjected to anisotropic etching to thereby form sidewall spacers 38 on side walls of the openings 37 (see FIG. 25). The width of each sidewall spacer 38 becomes about 70 nm and the diameter of the opening 37 is reduced to 80 nm by the sidewall spacers 38.

Figures 26A, 26B, 26C, 26D:
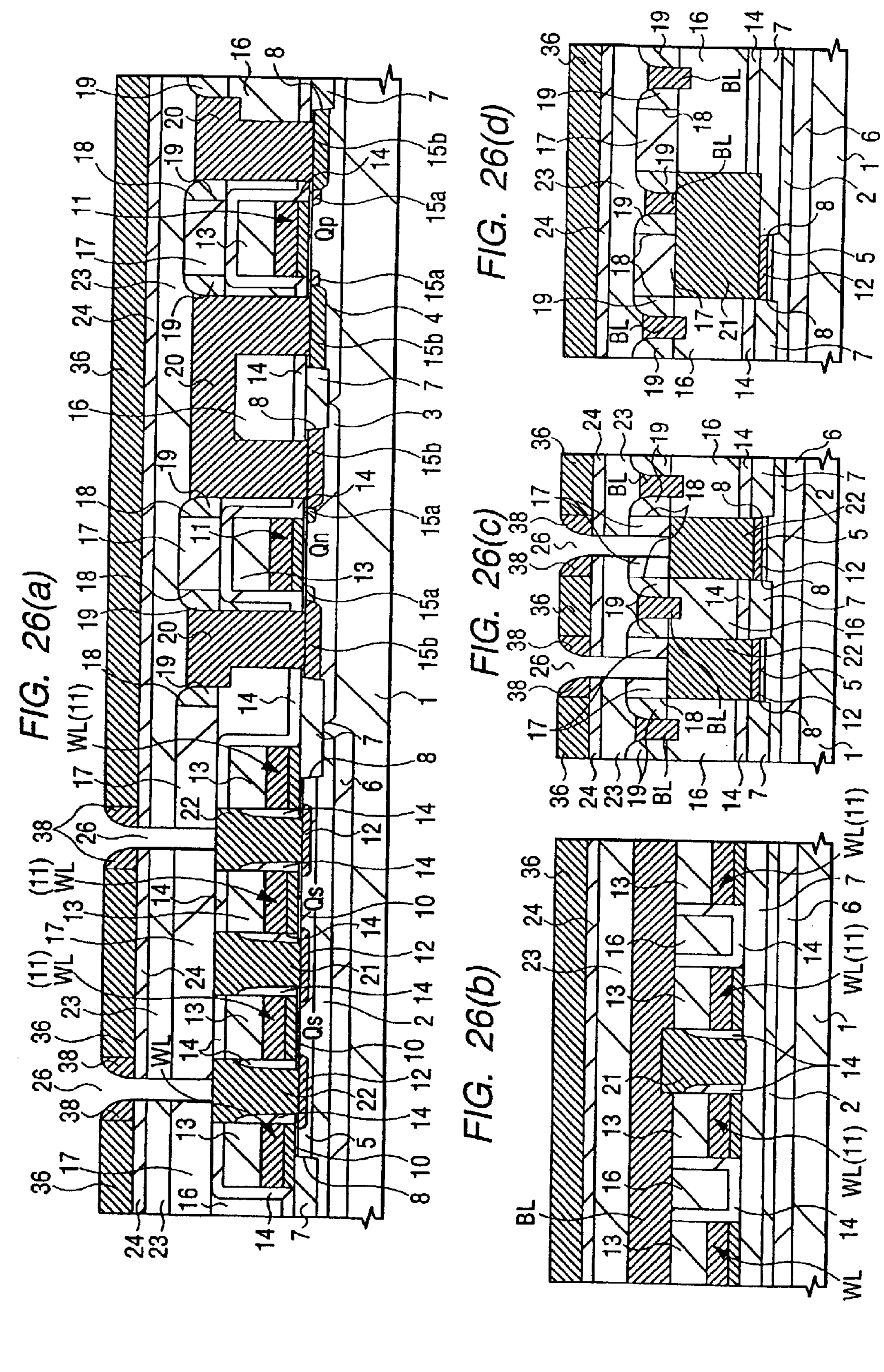
Figure 27A:
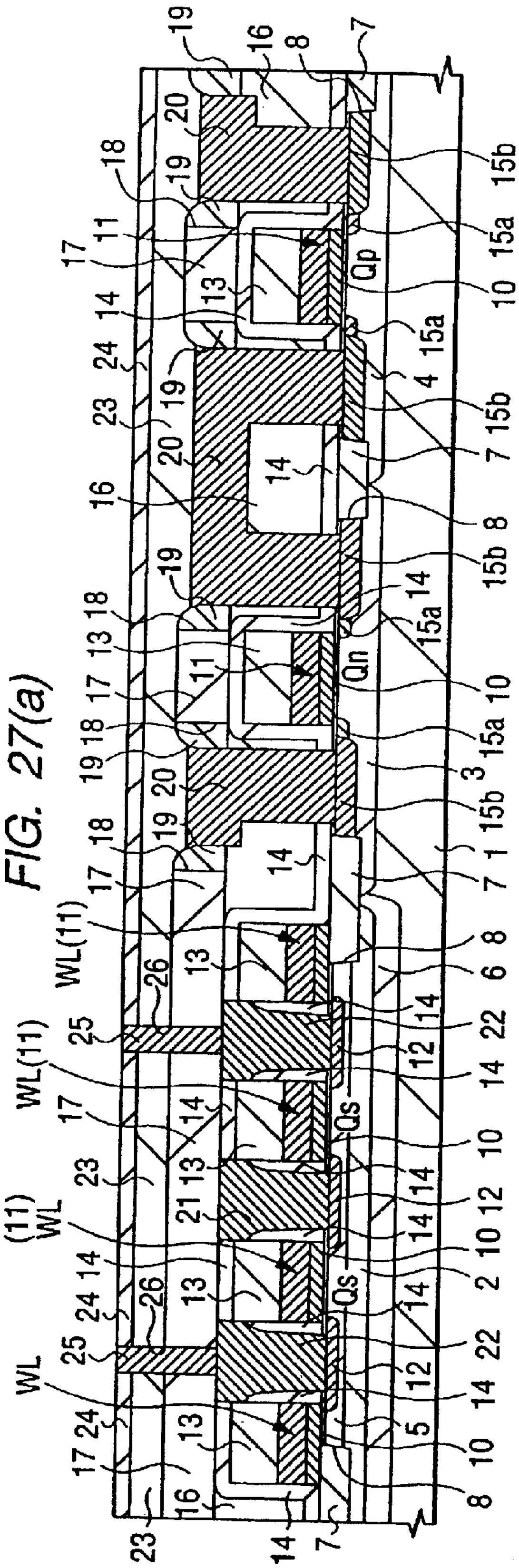
Figure 27B:
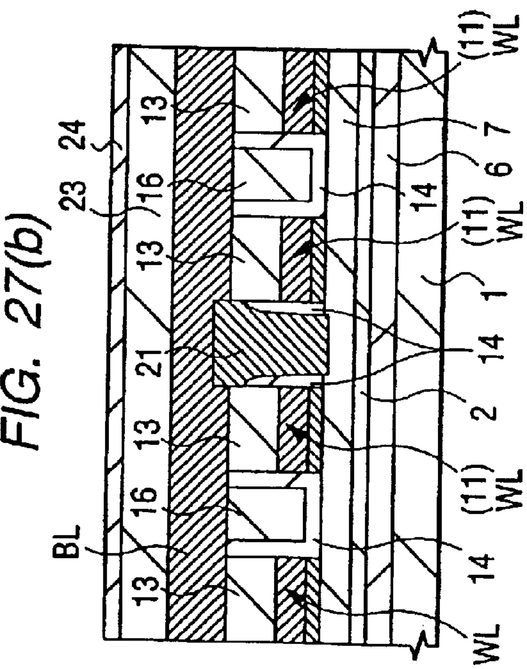
Figure 27C:
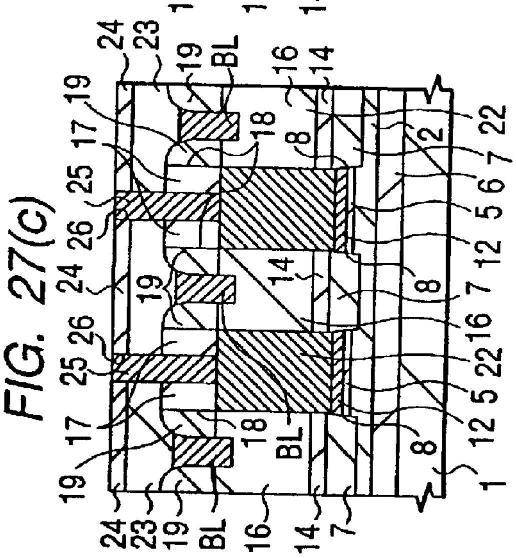
Figure 27D:
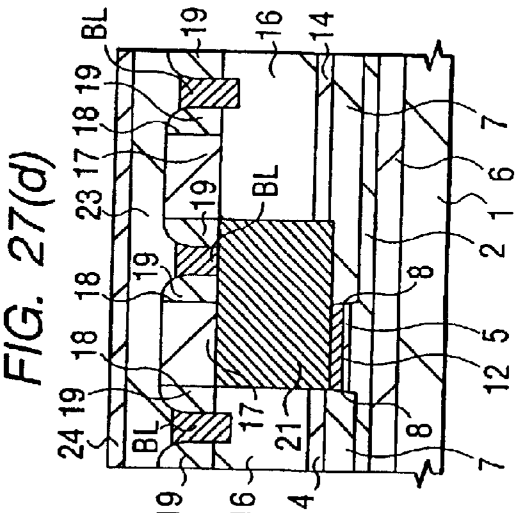

The polycrystal silicon film 36 and the sidewall spacers 38 are next etched as a hard mask to form capacitive-electrode connecting holes 26 (see FIG. 26). The diameter of each capacitive-electrode connecting hole 26 is 80 nm and the depth thereof is about 300 nm.

Since the capacitive-electrode connecting holes 26 can be formed to be small in diameter in this way, they do not contact the bit lines BL even if an alignment displacement occurs in masks for forming the openings 37. Further, since the width of the bit line BL is wide enough, such an effect can be reliably brought about.

Next, a polycrystal silicon film for embedding the capacitive-electrode connecting holes 26 therein is deposited. Thereafter, the present polycrystal silicon film, the polycrystal silicon film 36 and the sidewall spacers 38 are removed by the CMP process or etchback process to thereby form connecting plugs 25 inside the capacitive-electrode connecting holes 26 (see FIG. 27(*a*)). As described above, the connecting plugs 25 and the bit lines BL are not short-circuited. For example, phosphorus having a concentration of $3\times10^{20}/cm^3$ can be introduced into the connecting plugs 25. Upon removal of the polycrystal silicon film, the polycrystal silicon film 36 and the sidewall spacers 38, the silicon nitride film 24 can be activated as an etch stopper film for the CMP process or etchback process.

Figure 28:
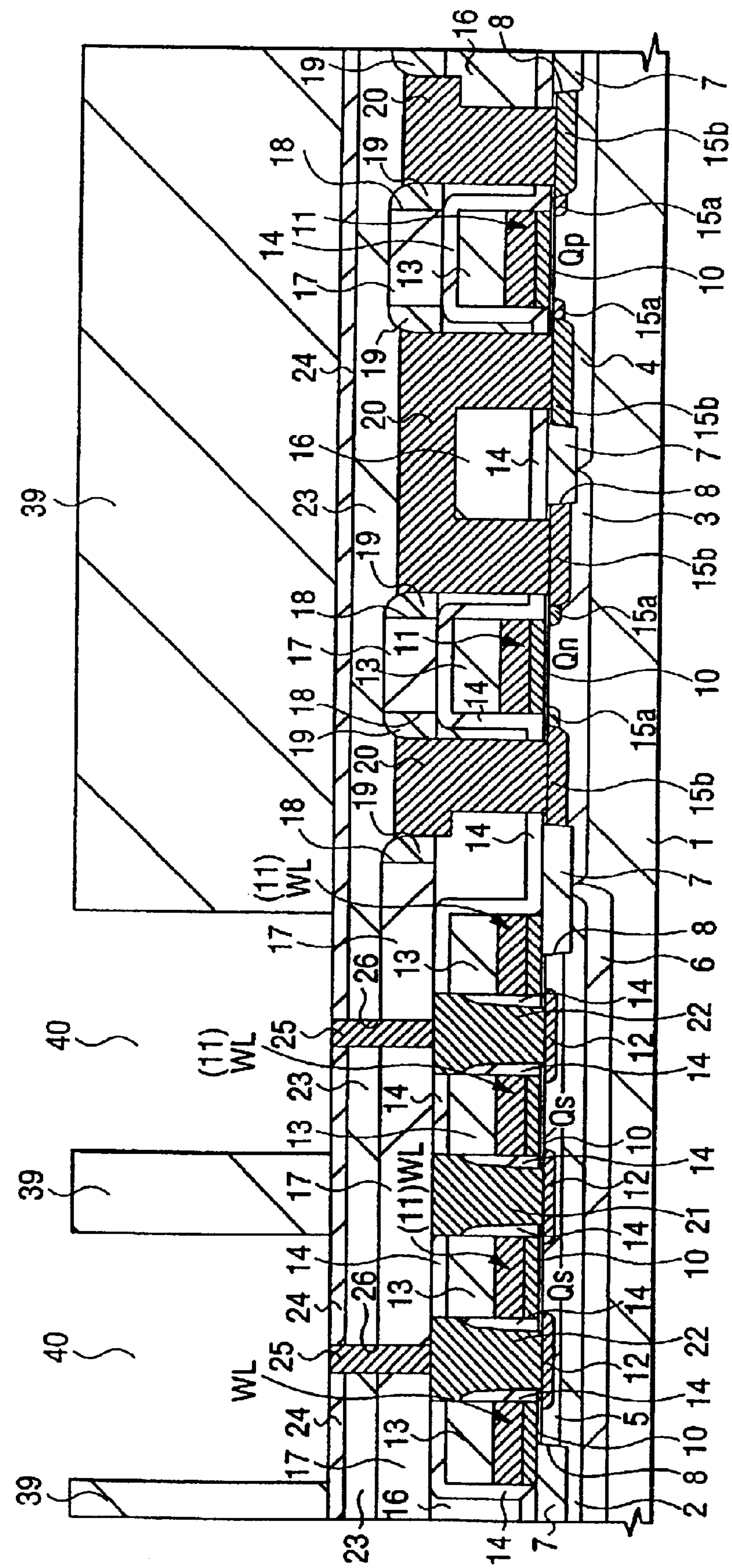
Figures 29A, 29B, 29C:
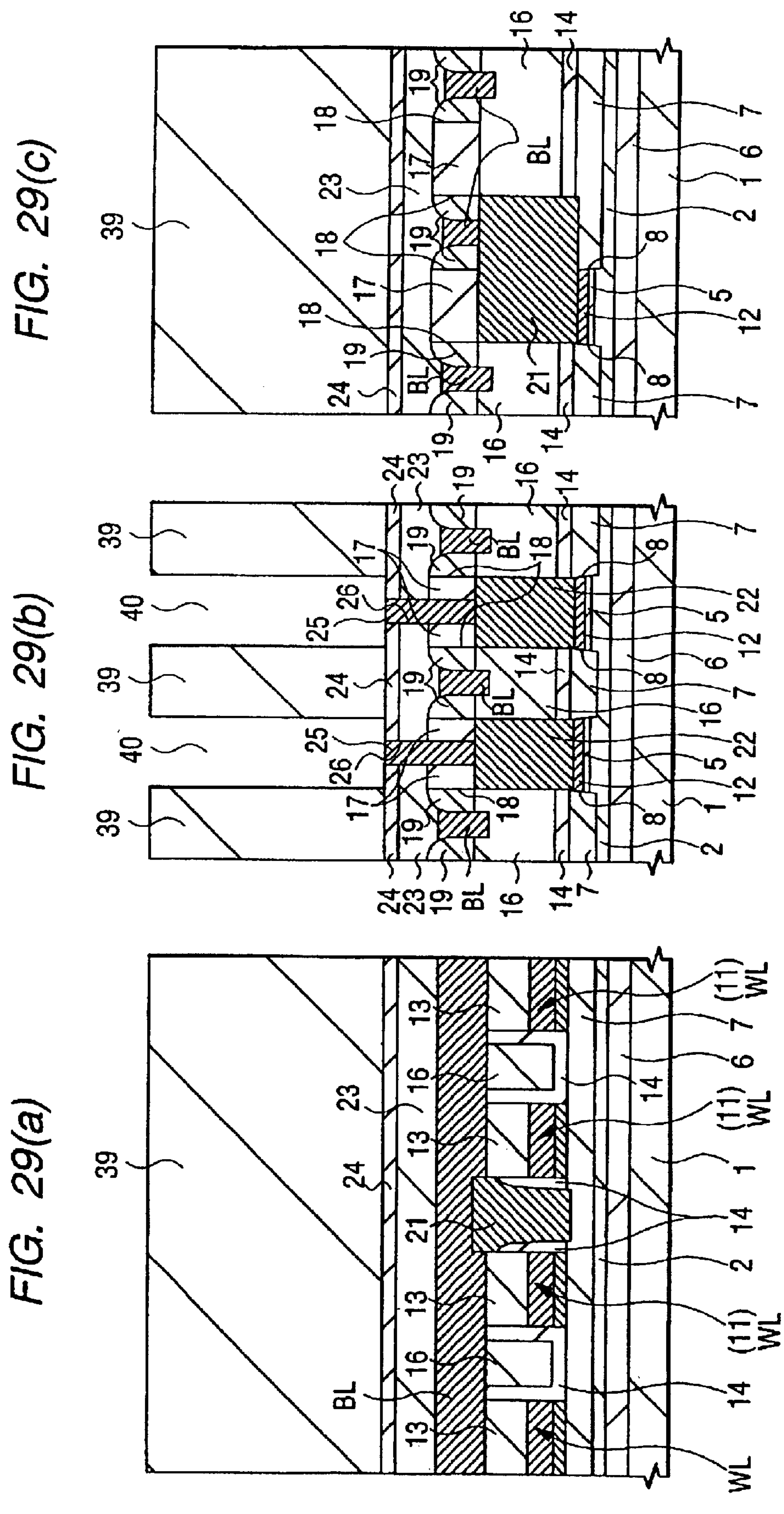
Figure 30:
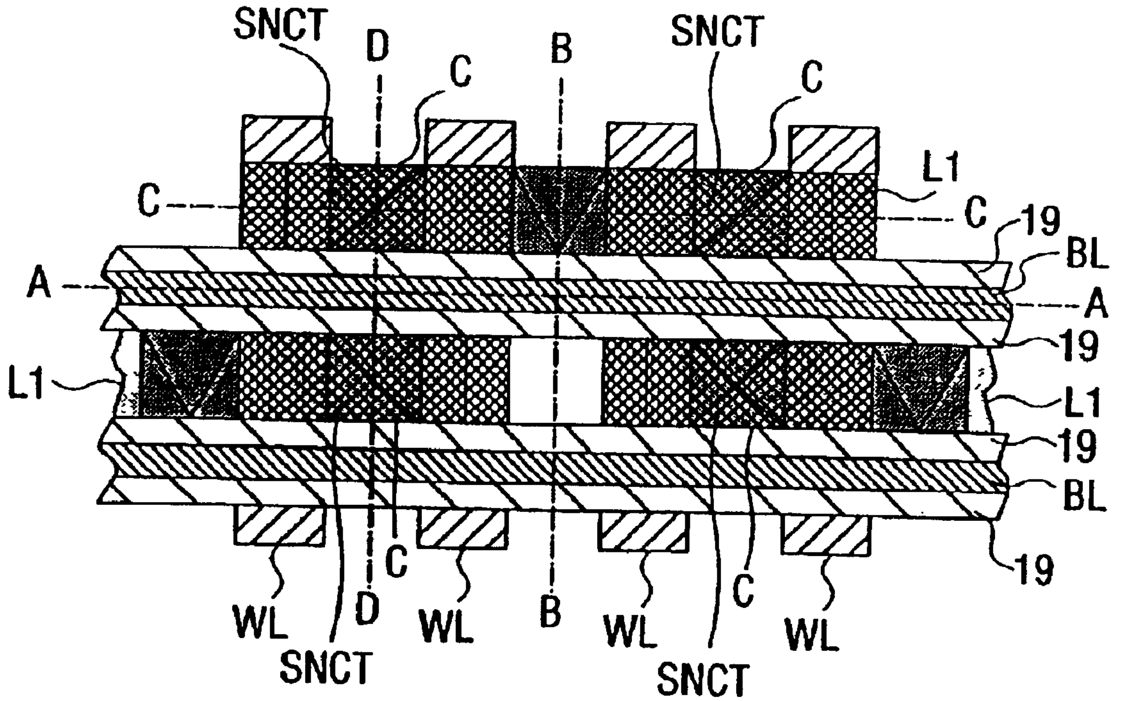
Figures 32A, 32B, 32C:
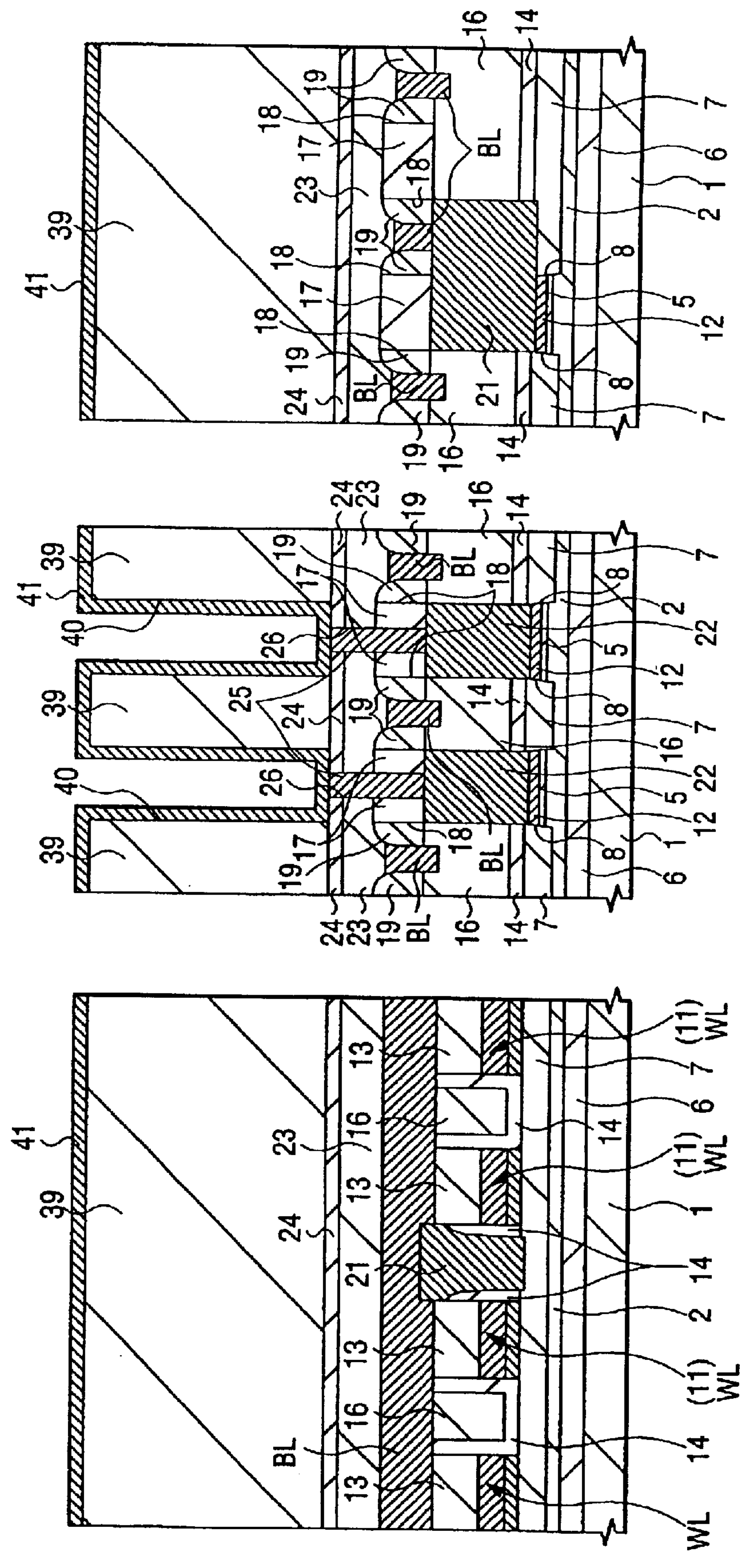

An insulating film 39 composed of a silicon oxide film is next deposited by the CVD process, for example, to thereby define grooves 40 in a region in which each information storage capacitative element C is formed (see FIGS. 28, 29 and 30). Incidentally, FIG. 29(*a*) shows a cross section taken along line A—A in FIG. 3, FIG. 29(*b*) illustrates a cross section taken along line D—D in FIG. 3, and FIG. 29(*c*) depicts a cross section taken along line B—B in FIG. 3, respectively. They are similarly illustrated in FIGS. 32(*a*)–32(*c*), 34(*a*)–34(*c*), 36(*a*)–36(*c*), 38(*a*)–38(*c*), 40(*a*)–40(*c*) and 42(*a*)–42(*c*).

The deposition of the insulating film 39 can be done by plasma CVD, and the thickness thereof can be set as 1.2 $\mu$m, for example.

Figure 31:
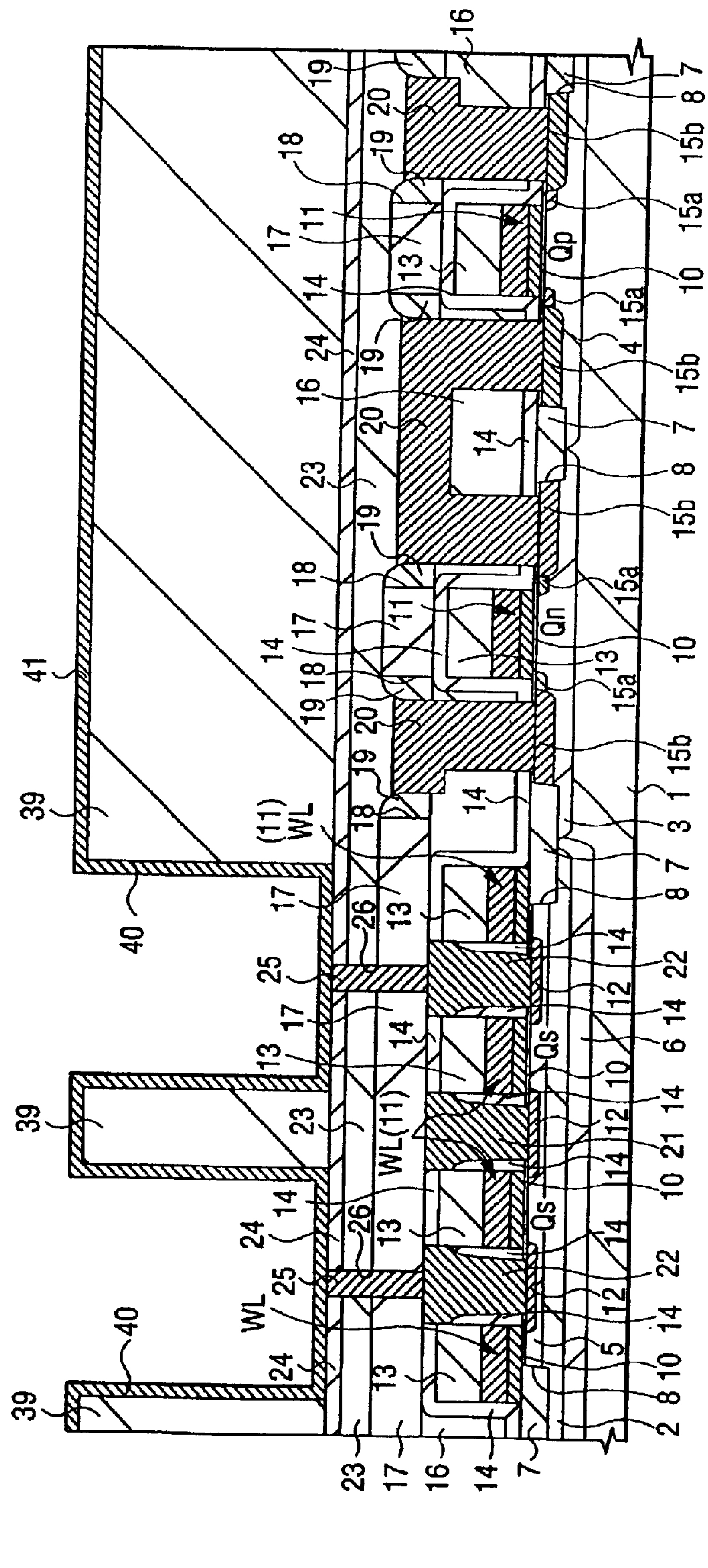
Figure 33:
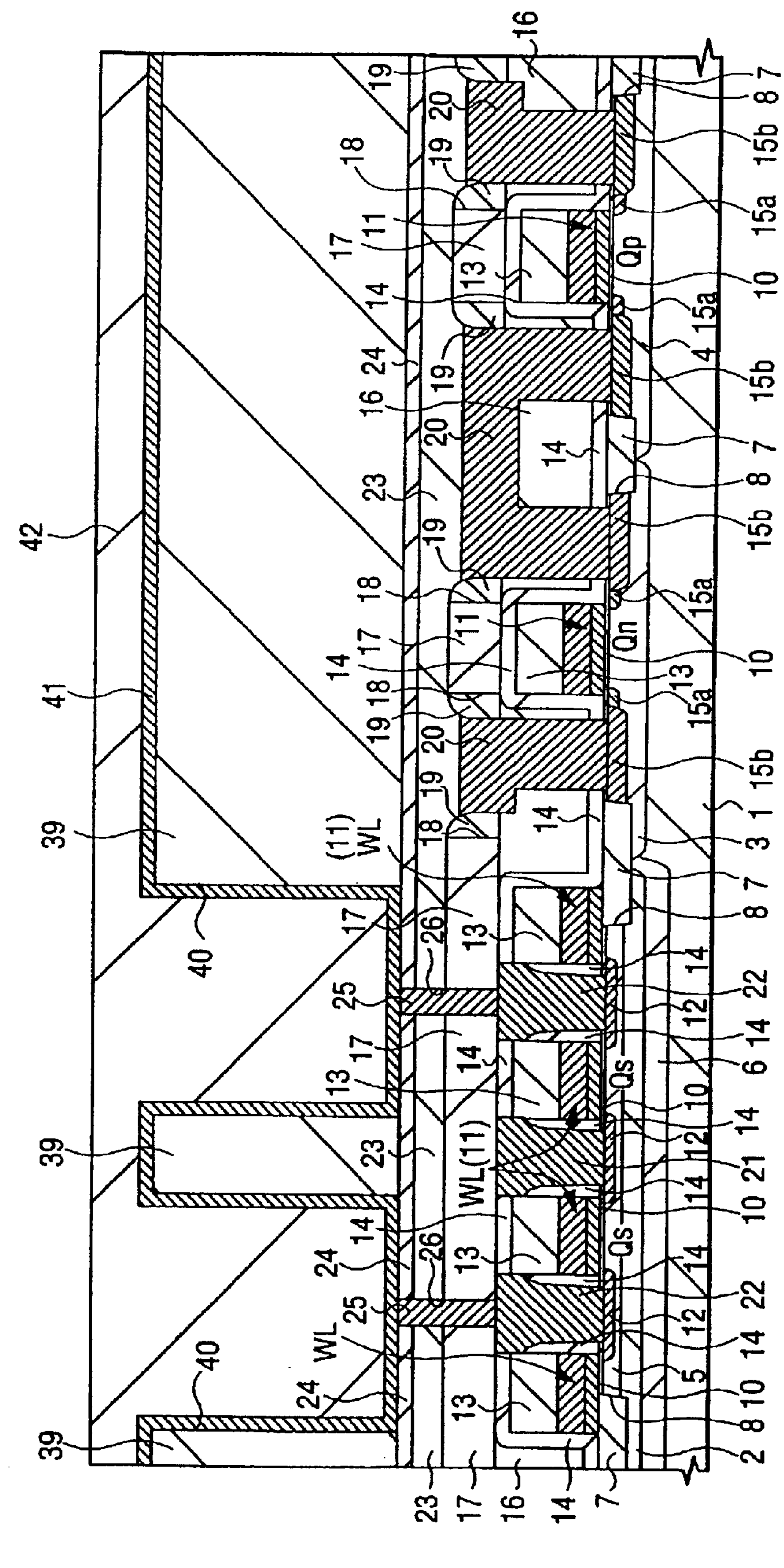
Figures 34A, 34B, 34C:
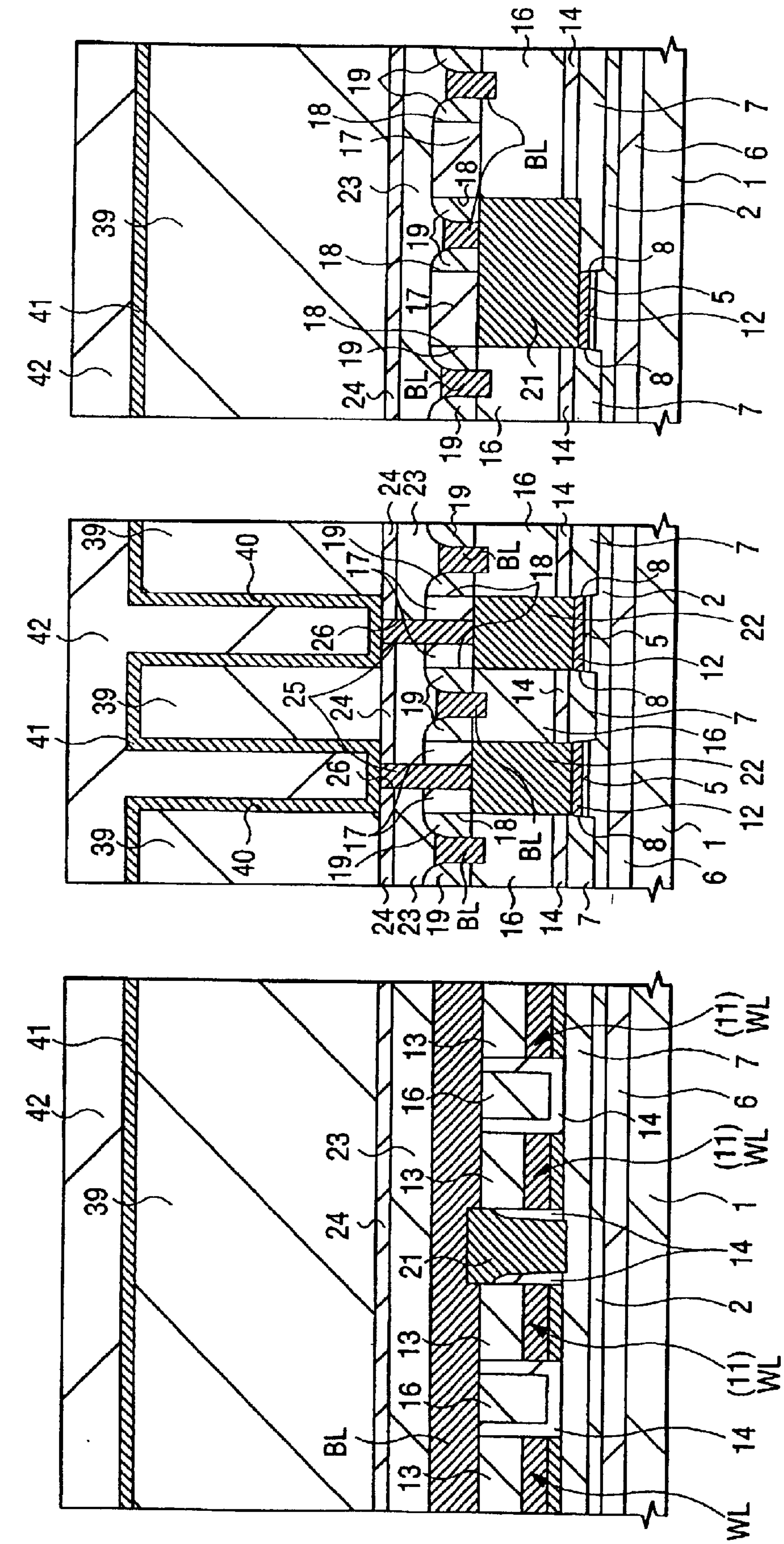

Next, a polycrystal silicon film 41 for covering the grooves 40 is deposited over the entire surface of the semiconductor substrate 1 (see FIG. 31 and ). Further, a silicon oxide film 42 is deposited over the entire surface of the semiconductor substrate 1 (see FIGS. 33 and 34(*a*)). The polycrystal silicon film 41 can be doped with phosphorus and the thickness thereof can be set to 0.03 $\mu$m. Since the thickness of the polycrystal silicon film 41 is sufficiently thinner than the size of each groove 40, the polycrystal silicon film 41 can be deposited even inside each groove 40 with good step coverage. The silicon oxide film 42 is deposited so as to be embedded or buried inside the grooves 40. If consideration is given to the embedability of the silicon oxide film inside the grooves 40, then the silicon oxide film 42 can be formed as an SOG film or a silicon oxide film based on the CVD process using TEOS.

Figure 35:
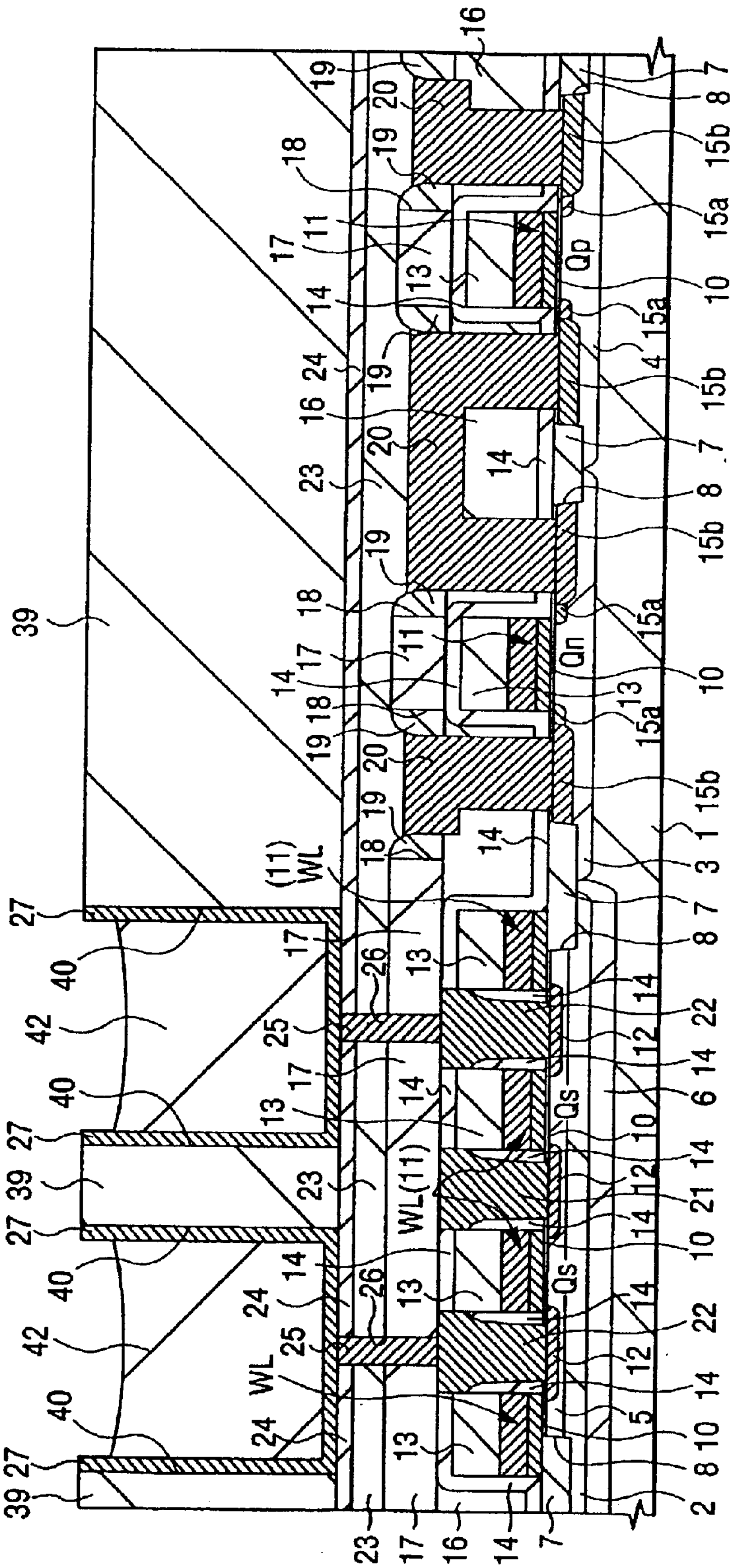
Figures 36A, 36B, 36C:
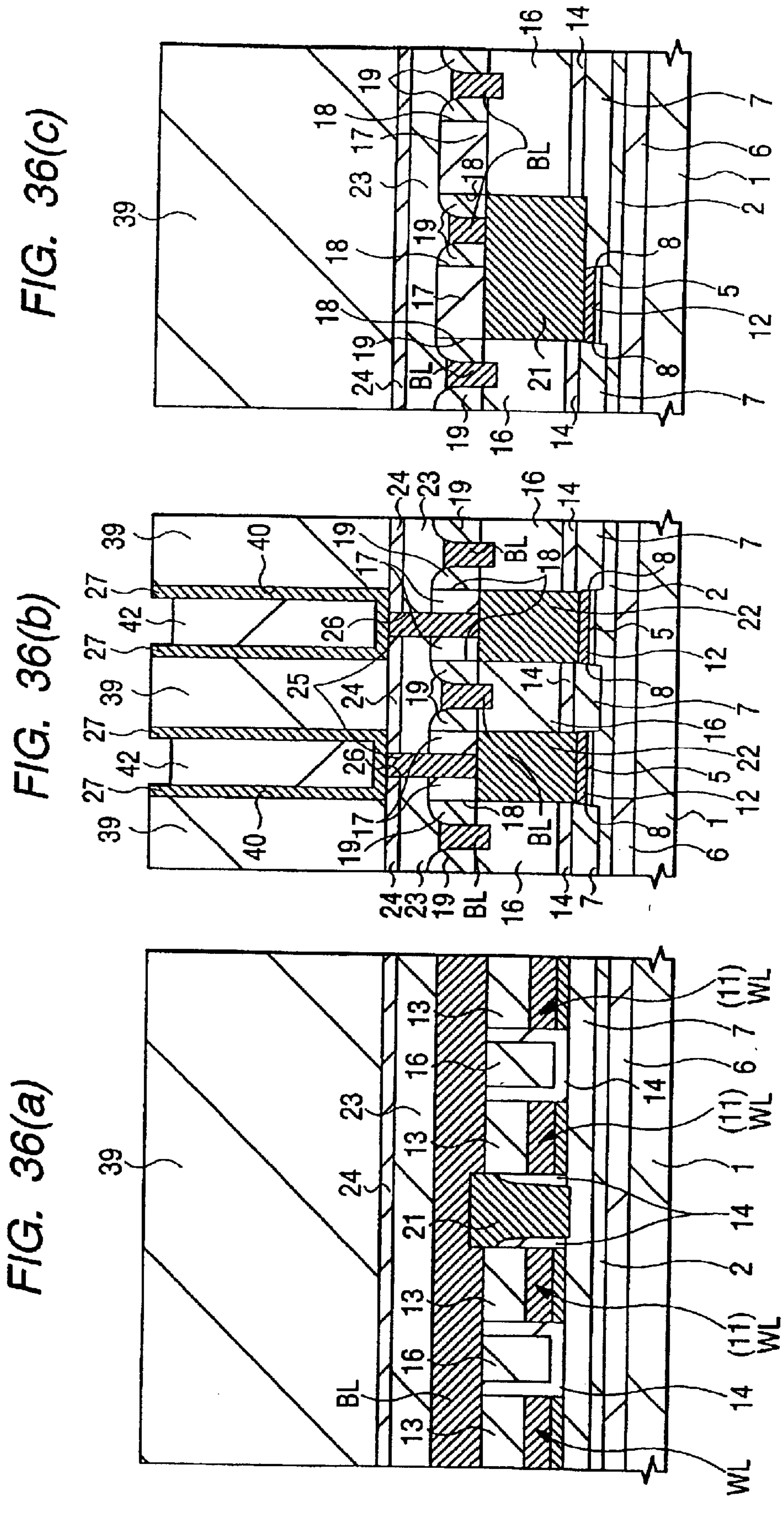

Next, the silicon oxide film 42 and the polycrystal silicon film 41 on the insulating film 39 can be removed to form lower electrodes 27 for the information storage capacitative elements C (see FIGS. 35 and 36(*a*)). The removal of the silicon oxide film 42 and the polycrystal silicon film 41 can be done by the etchback process or CMP process. Further, the silicon oxide film 42 remains inside each lower electrode 27.

Figure 37:
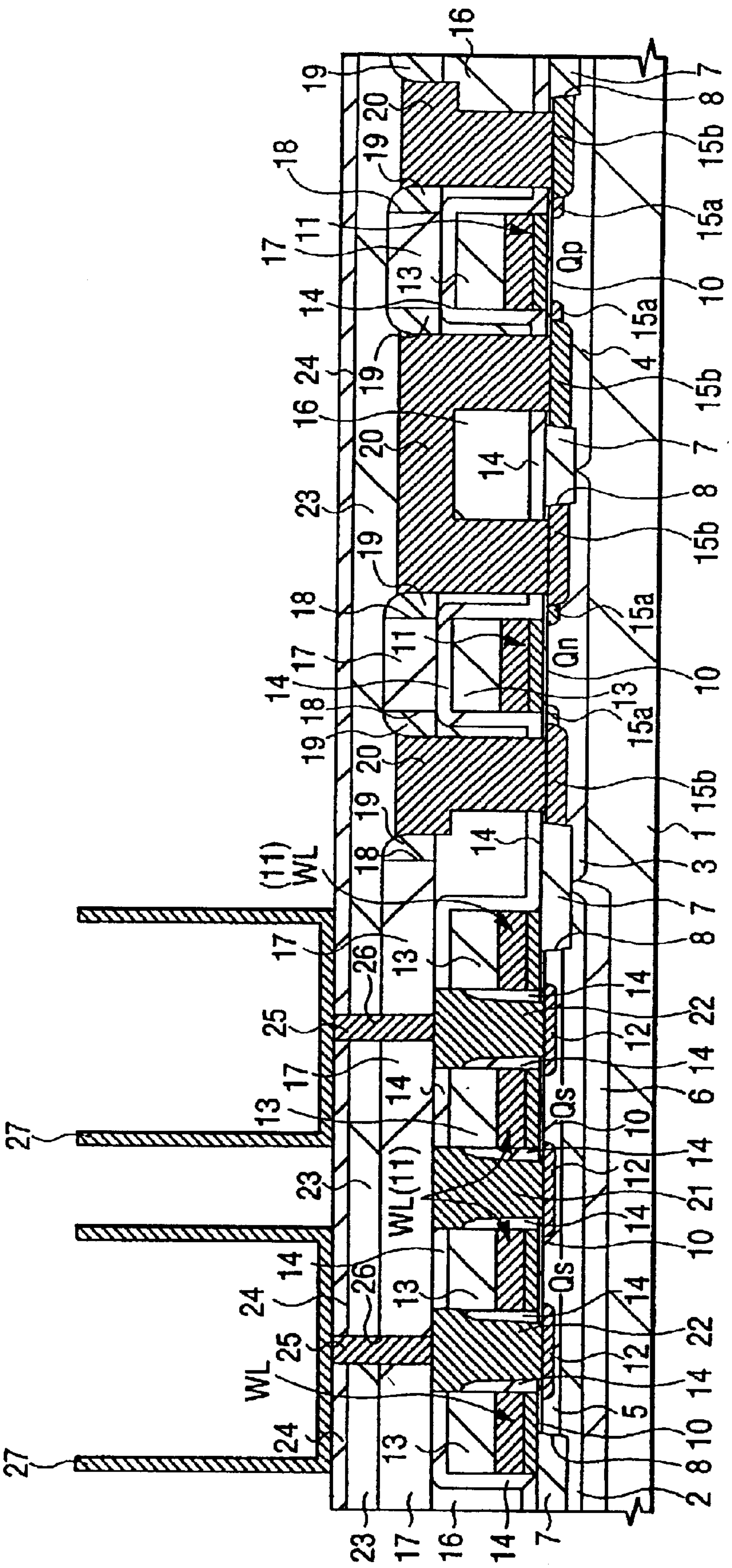
Figure 38C:
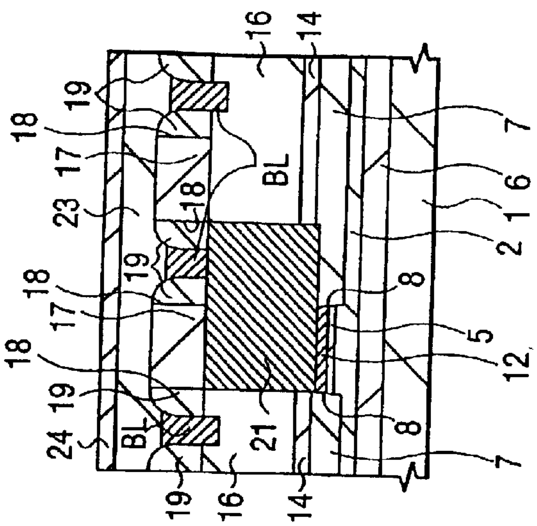
Figure 38B:
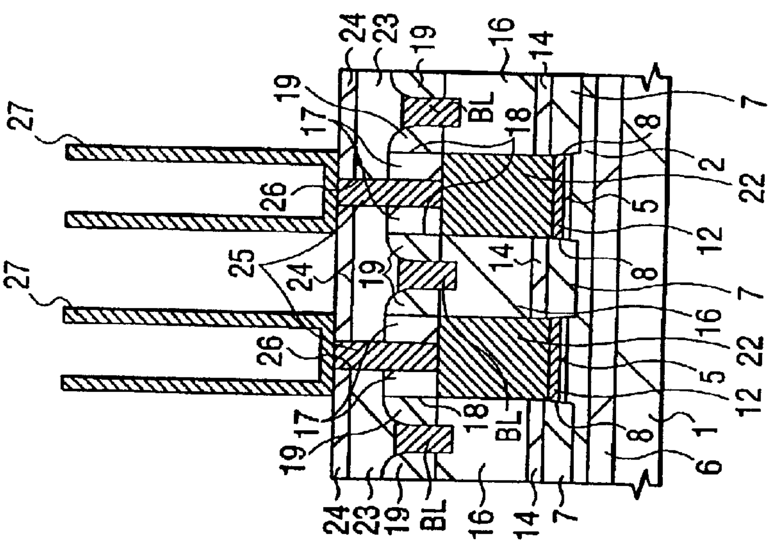
Figure 38A:
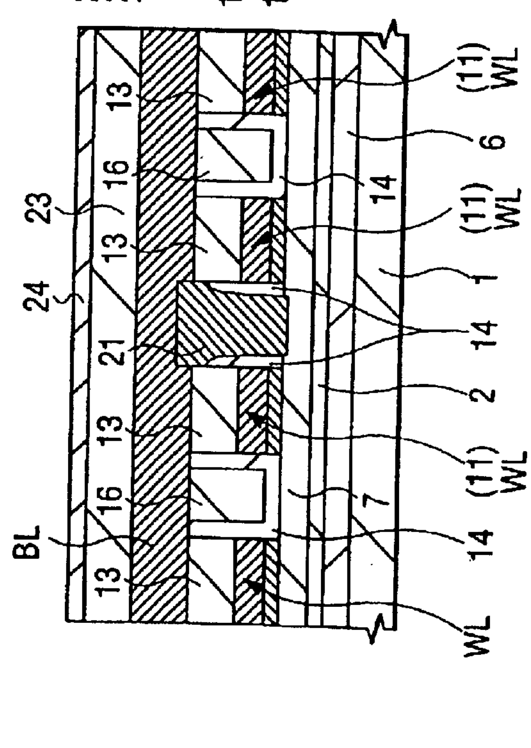

The resultant product is next subjected to wet etching to remove the insulating film 39 and the silicon oxide film 42 (see FIGS. 37 and 38(*b*)). As a result, the lower electrodes 27 are made bare. Incidentally, a photoresist film is formed in the peripheral circuit region (region B) and the insulating film 39 may be left in the region B as the photoresist film as a mask.

Incidentally, the silicon oxide film 24 functions as an etching stopper in the wet etching process.

Figure 39:
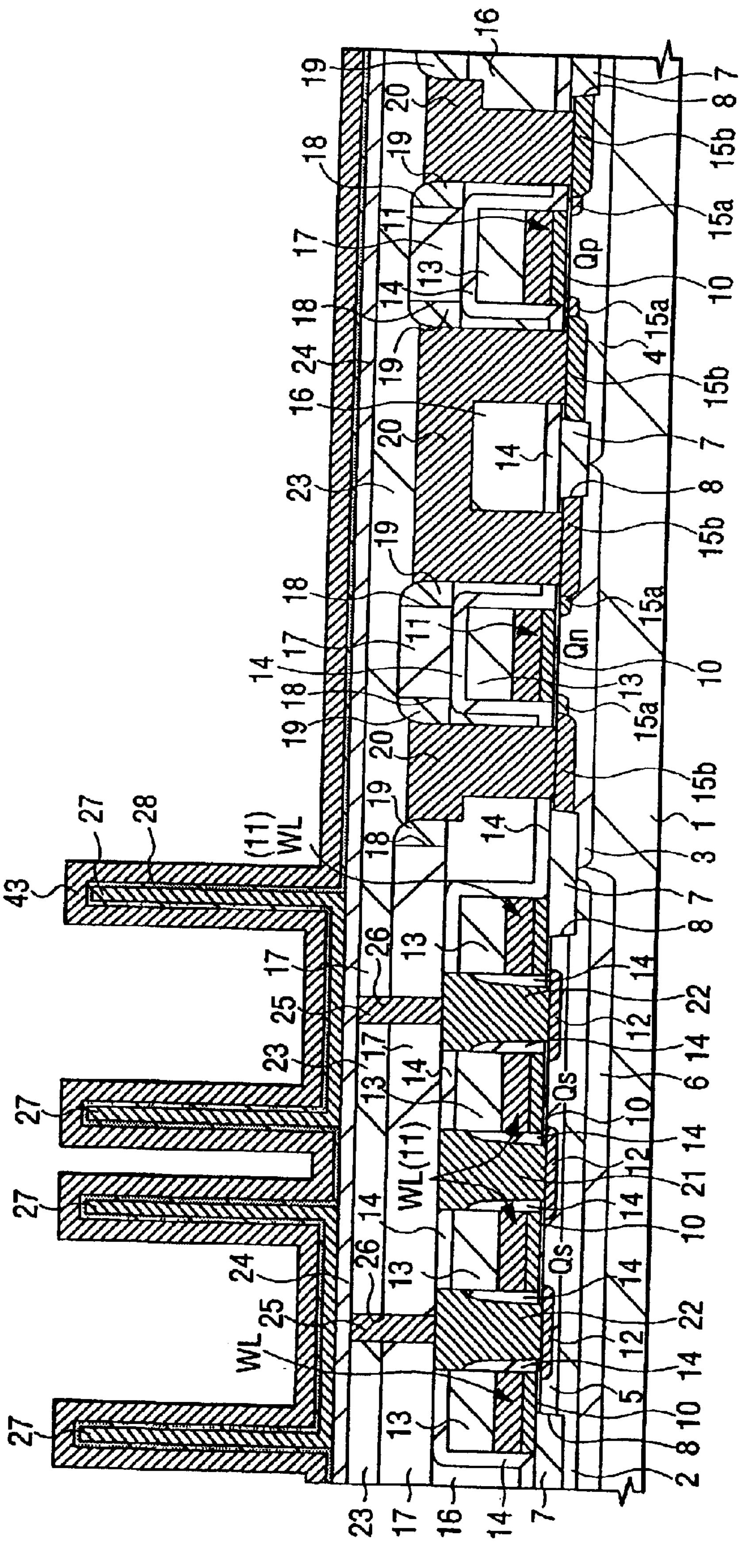
Figure 40C:
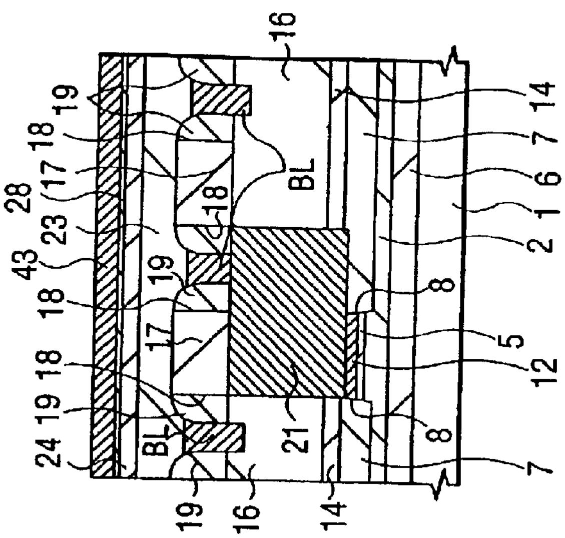
Figure 40B:
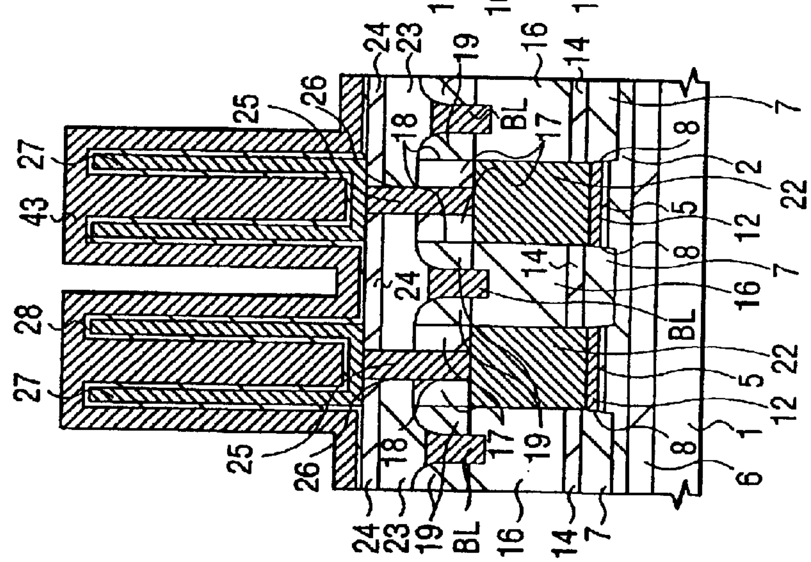
Figure 40A:
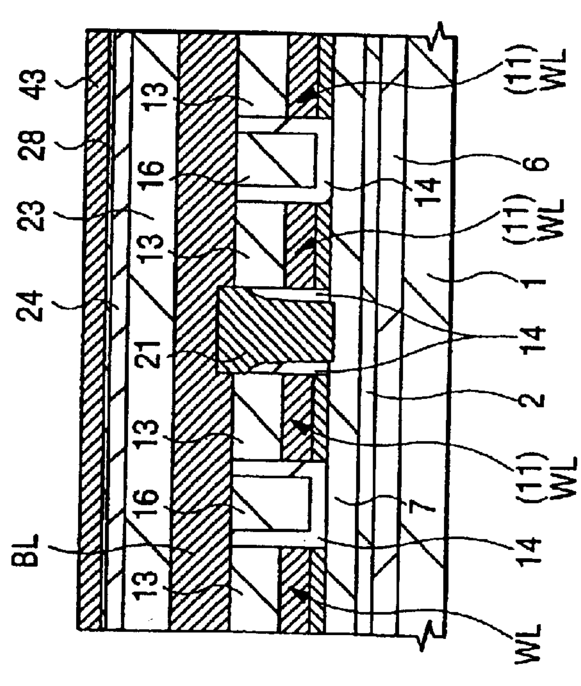

Next, the surface of each lower electrode 27 is subjected to nitriding or oxidizing/nitriding processing and a tantalum oxide film thereafter is deposited thereon to form a capacitive insulating film 28. The deposition of the tantalum oxide film can be done by the CVD process using an organic tantalum gas as a raw material. The tantalum oxide film at this stage has an amorphous structure. Here, the tantalum oxide film is heat-treated so as to be formed as a crystallized (polycrystallized) tantalum oxide film ($Ta_2O_5$), whereby the capacitive insulating film 28 may be formed as a rigid dielectric. Alternatively, the capacitive insulating film 28 may be formed as a silicon nitride film having a thickness of 5 nm in terms of the silicon oxide film. Further, for example, a titanium nitride film 43 is deposited by the CVD process (see FIGS. 39 and 40).

Figure 41:
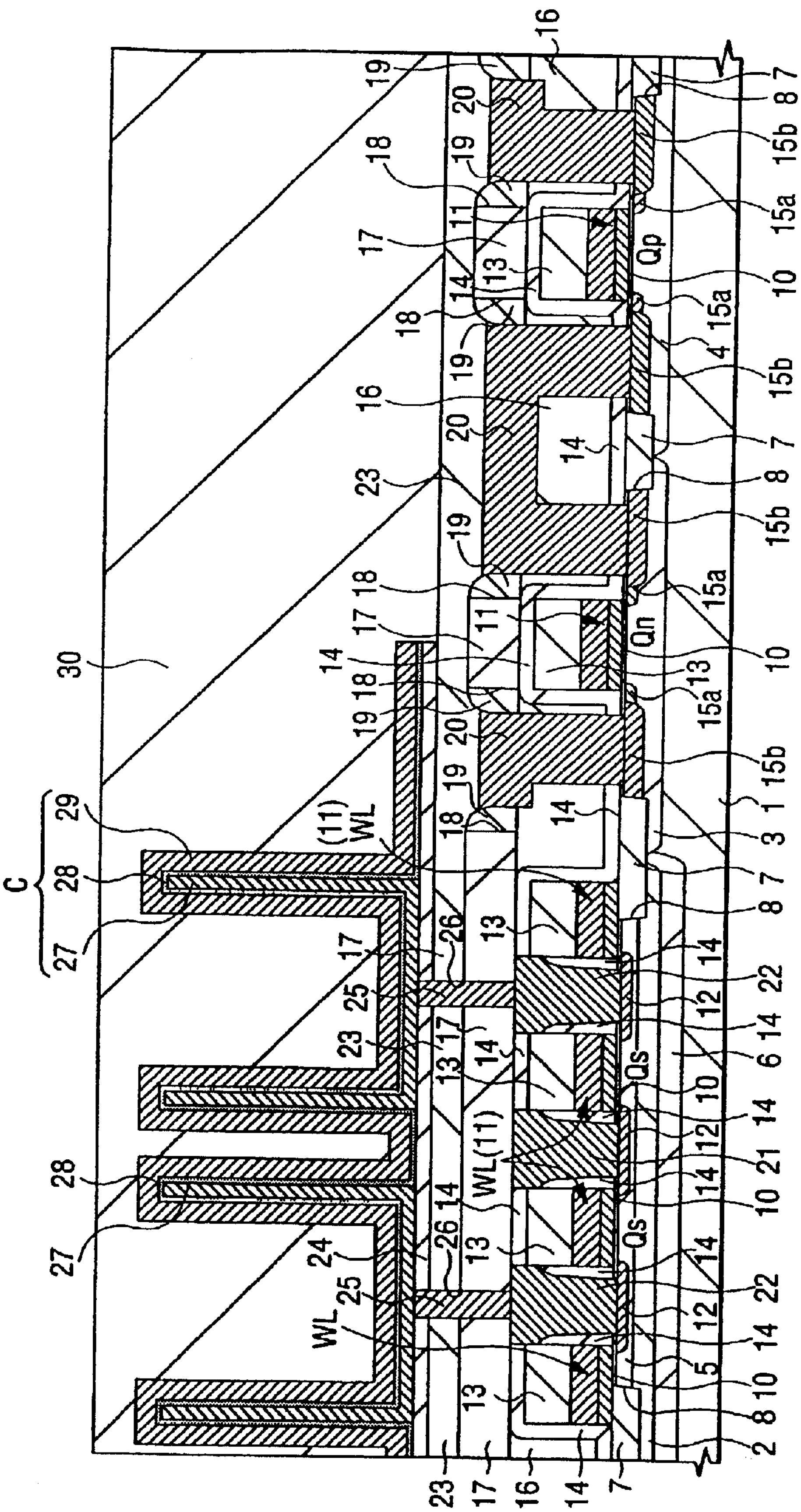
Figures 42A, 42B, 42C:
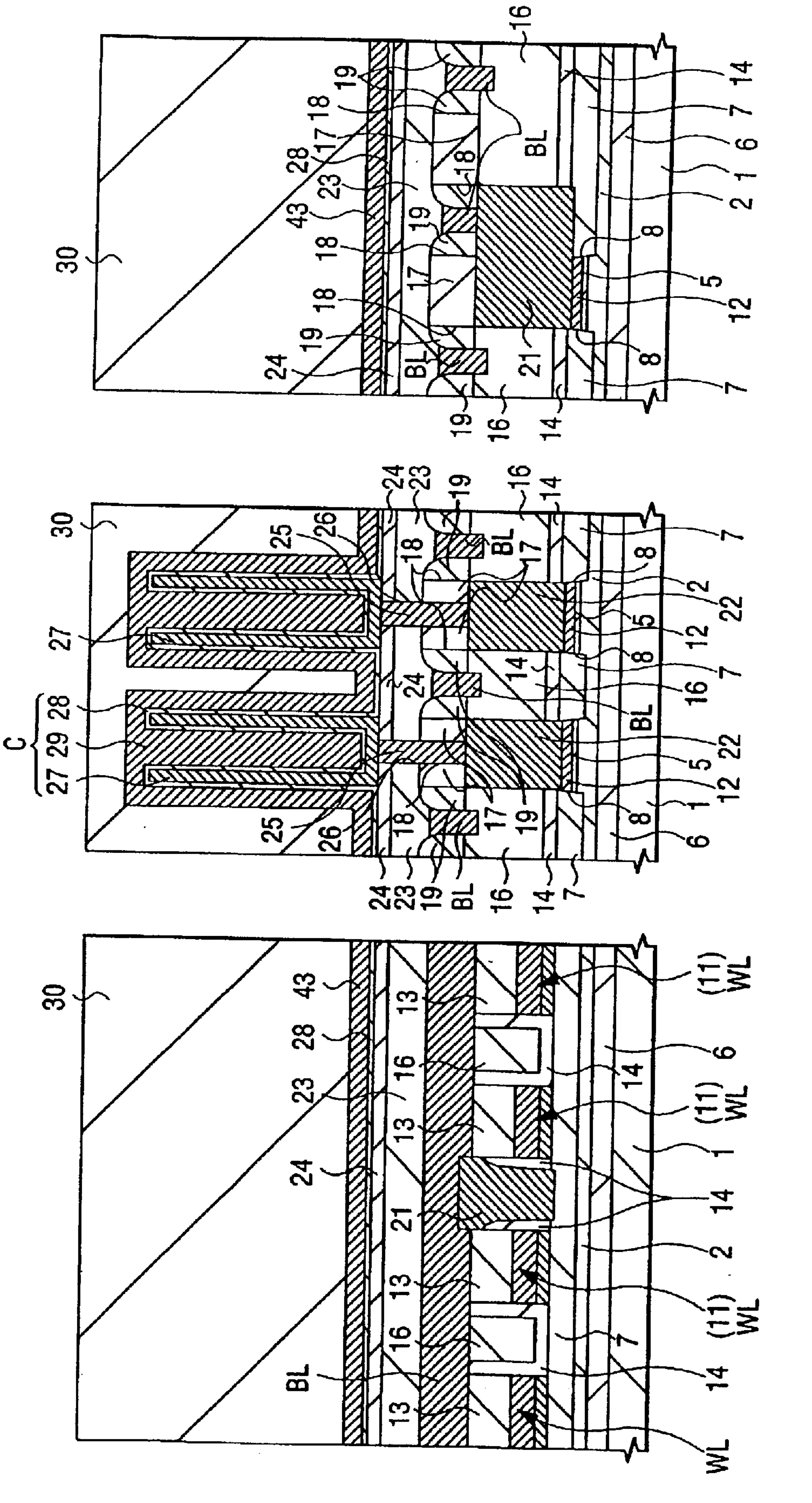

Thereafter, the titanium nitride film and the polycrystallized tantalum oxide film are patterned using a photoresist film to thereby form a capacitive insulating film 28 and a plate electrode 29. Each information storage capacitative element C composed of the lower electrode 27, capacitive insulating film 28 and plate electrode 29 is formed in this way. Further, an insulating film 30 is formed over the entire surface of the semiconductor substrate 1 (see FIGS. 41 and 42). Incidentally, the plate electrode 29 may be formed as a polycrystalline silicon film including phosphorus having a concentration of $4\times10^{20}/cm^3$, for example, as an alternative to the titanium nitride film.

Next, connecting holes are defined in the insulating film 30. Further, for example, a titanium film, a titanium nitride film and a tungsten film are successively deposited over the insulating film 30 including the connecting holes and thereafter are removed by the CMP process or etchback process to form plugs 32. Afterwards, a stacked or laminated film composed of, for example, a titanium nitride film, an aluminum film and the titanium nitride film is deposited over the insulating film 30 and is subjected to patterning to thereby form a second layer interconnection 31. Thus, the DRAM shown in FIGS. 4 and 5 is substantially completed.

Since wiring layers corresponding to further upper layers can be formed in a manner similar to the second layer interconnection 31, their detailed description will be omitted.

According to the DRAM representing the present embodiment, the width of each bit line BL can be formed as 80 nm and the diameter of each capacitive-electrode connecting hole 26 can be formed as 80 nm. As a combined margin of the two, a sufficiently large margin can be ensured in a 0.15-$\mu$m and 0.2-$\mu$m manufacturing technique. It is thus possible to manufacture a micro-fabricated DRMA cell whose cell area is 0.4×0.8 =0.32 $\mu$m2, without any processing problem. The distance between the upper surface of each of the connecting plugs 21 and 22 and the lower surface of the lower electrode 27 of each information storage capacitative element C can be held to only 0.3 $\mu$m. Consequently, the height of each cell, which extends from the surface of the substrate to the upper surface of each plate electrode 29, can be lowered.

Figures 43A, 43B, 43C, 43D:
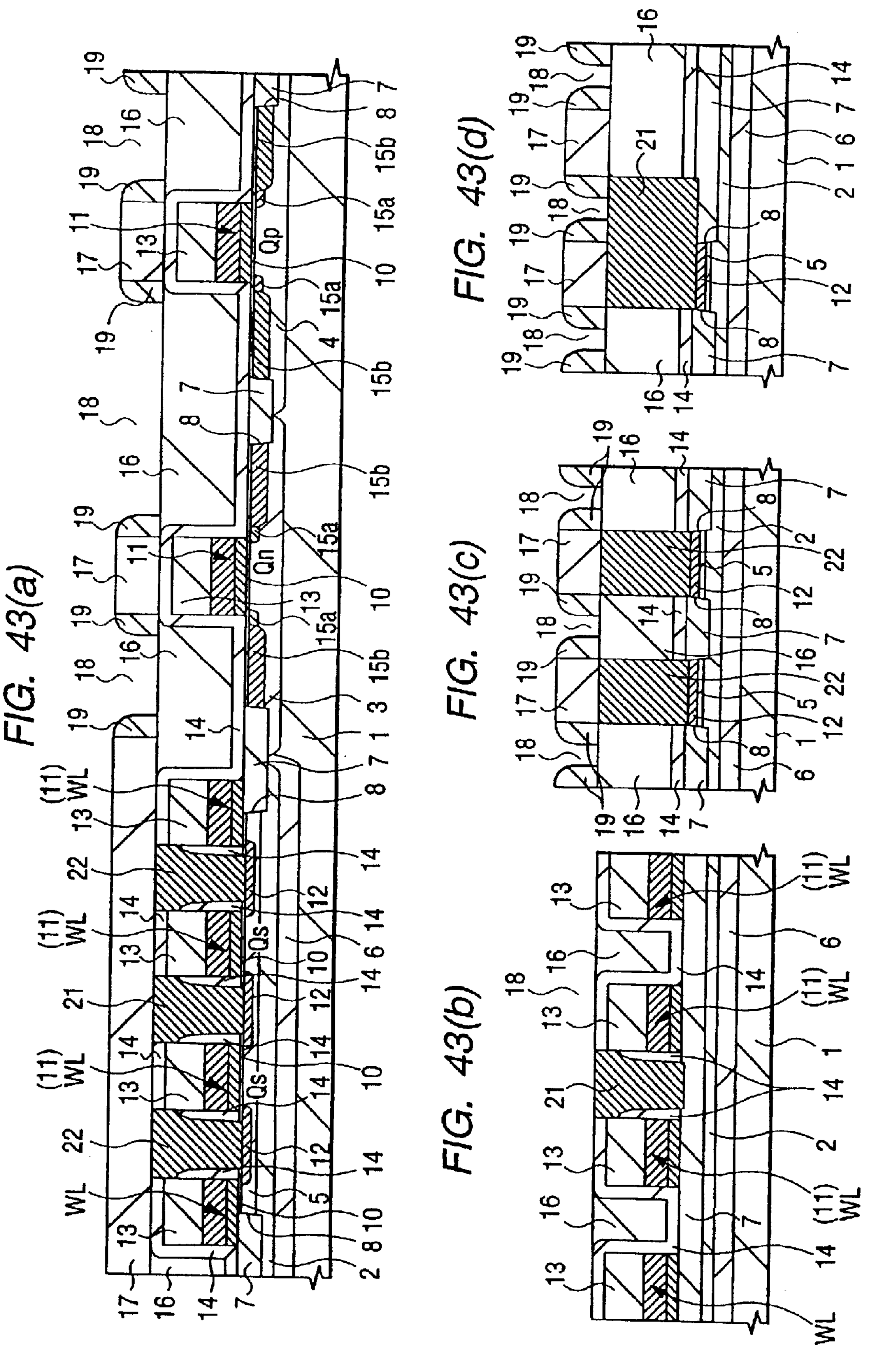
FIGS. 43(*a*) through 44(*d*) respectively show another example of a method of manufacturing the DRAM according to the embodiment 1.
Figure 44A:
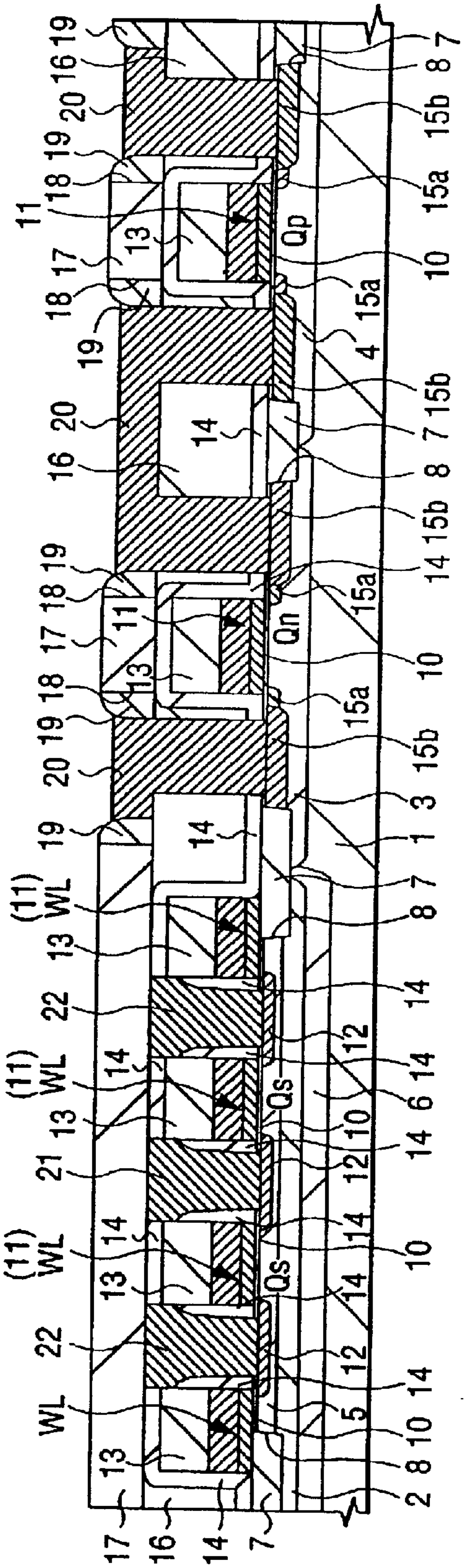
Figure 44B:
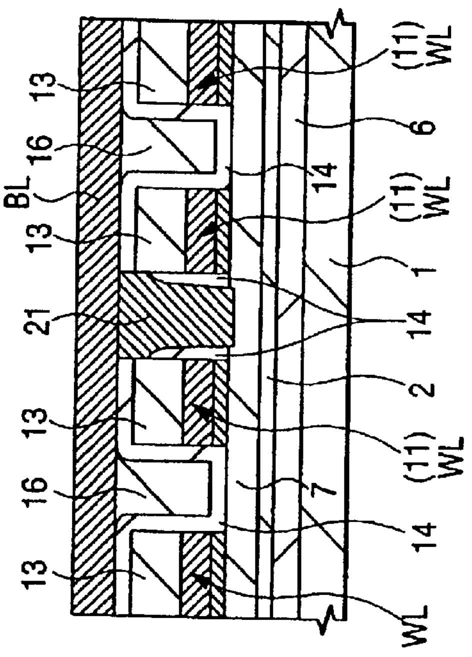
Figure 44C:
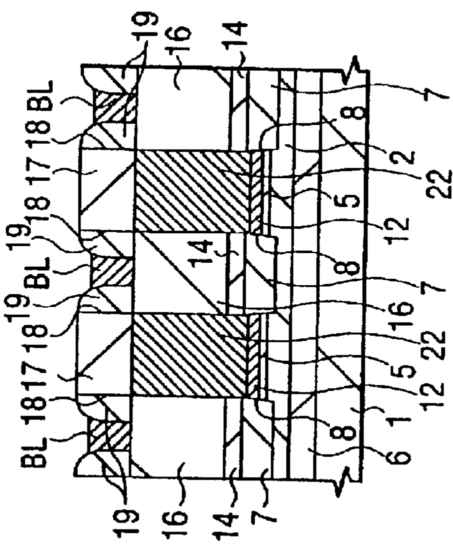
Figure 44D:
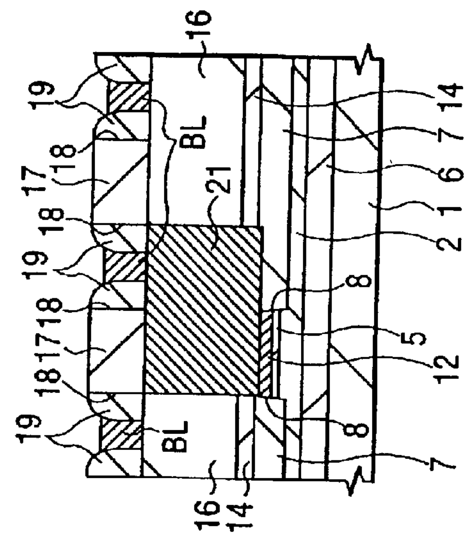

While the present embodiment 1 has described a case in which the etching at the time of processing the sidewall spacers 19 is excessively done in the process step shown in FIG. 17 to form the bottom of each wiring groove 18 deep, the depth of the wiring groove 18 can be held to the order of the thickness of the insulating film 17 without the excessive etching as shown in FIG. 43. Even in this case, the bit line BL and each connecting plug 21 are electrically connected to each other so long as the surface of the connecting plug 21 is exposed at the bottom of each wiring groove 18 as shown in FIG. 44, thus allowing the DRAM to function normally.

Figures 45A, 45B, 45C, 45D:
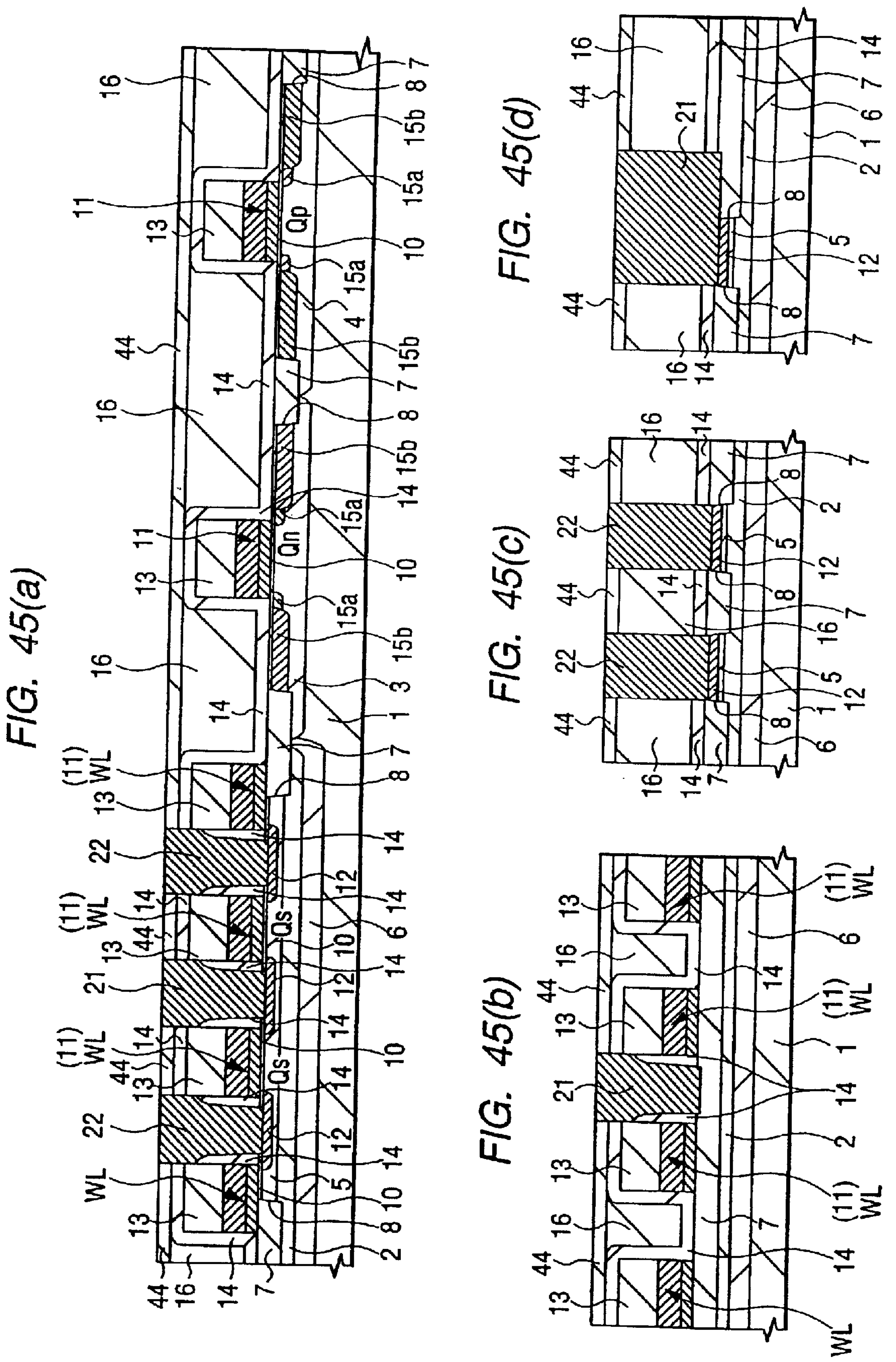
FIGS. 45(*a*) through 47(*d*) respectively illustrate a further example of the method of manufacturing the DRAM according to the embodiment 1.
Figure 46A:
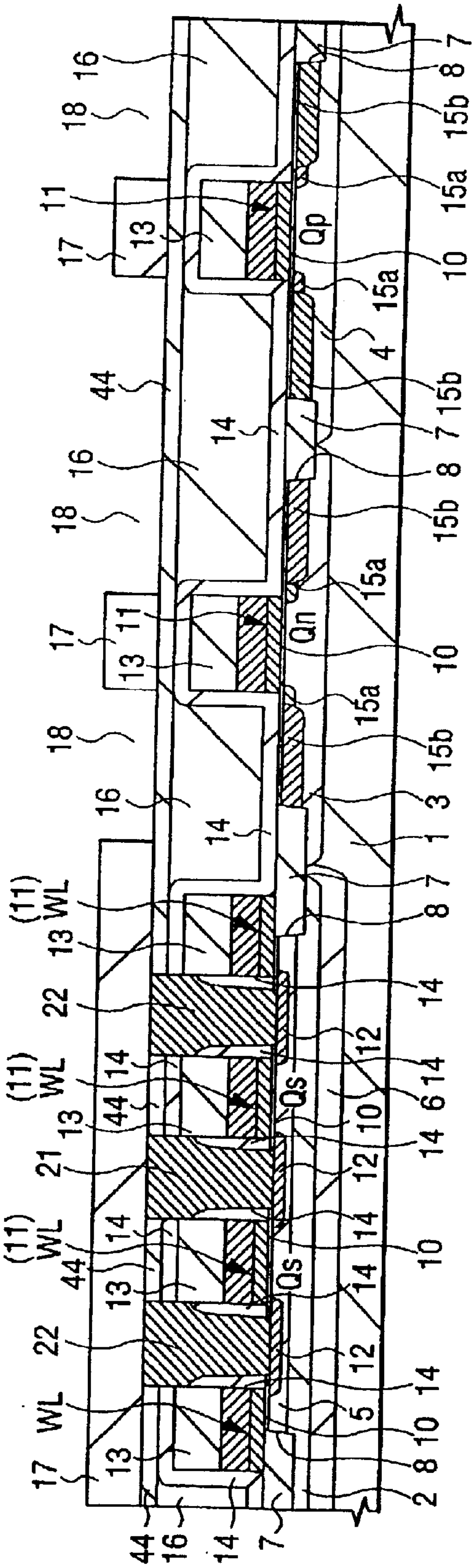
Figure 46D:
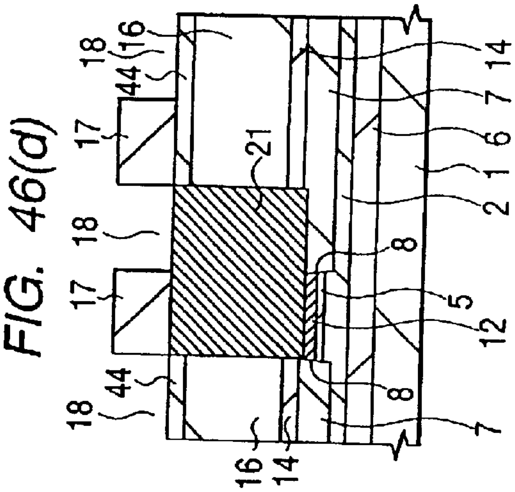
Figure 46C:
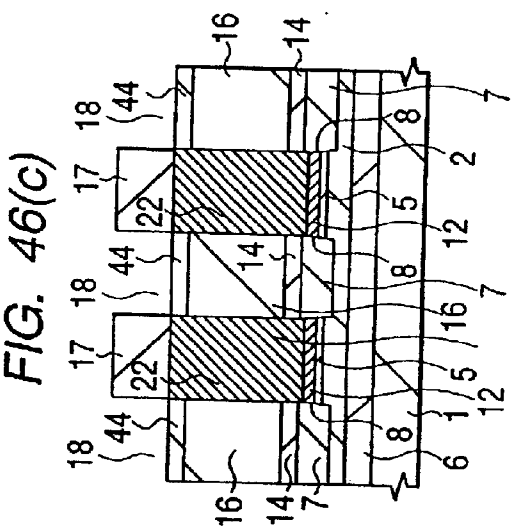
Figure 46B:
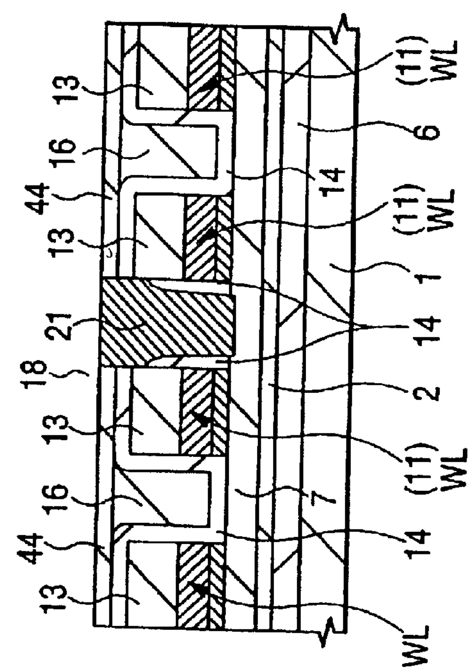
Figure 47A:
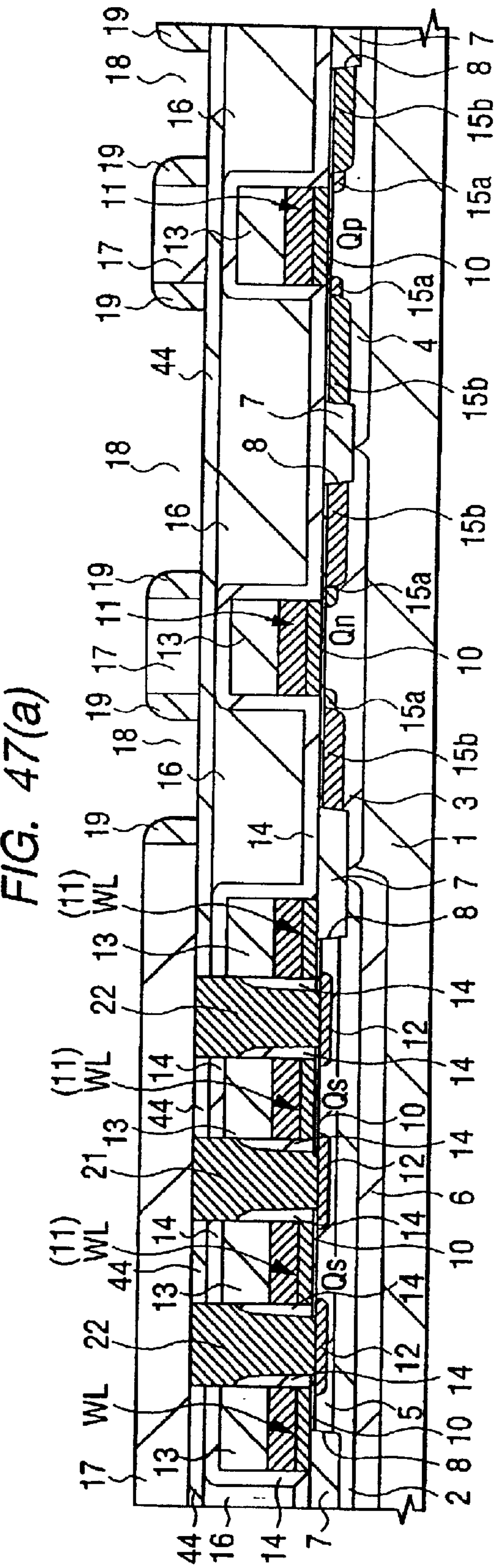
Figure 47B:
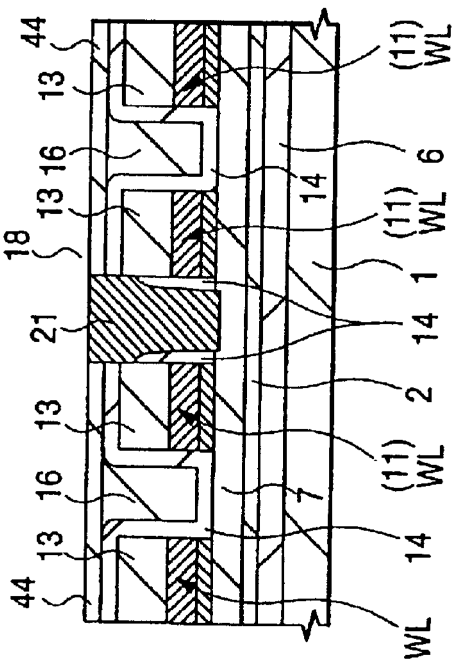
Figure 47C:
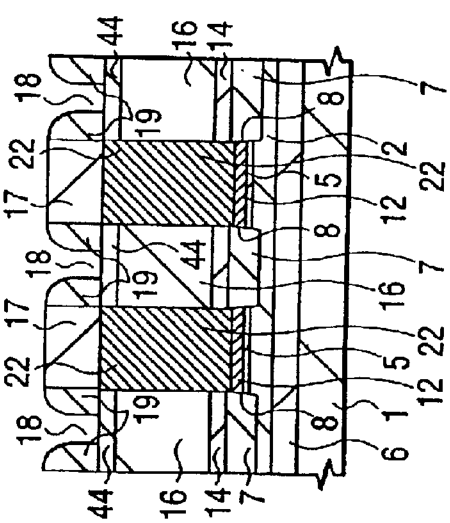
Figure 47D:
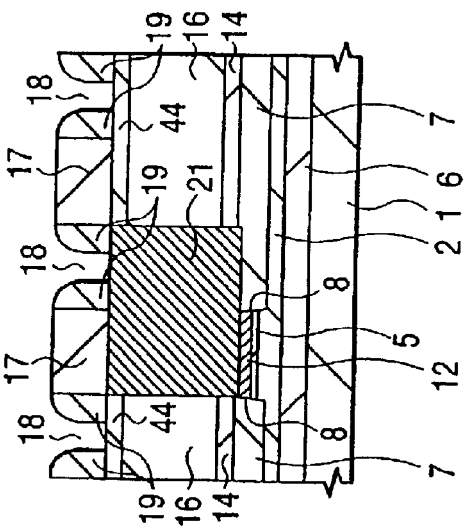

Further, the silicon nitride film can be also formed at the bottom of the insulating film 17 in which the wiring grooves 18 are defined. Namely, an insulating film 16 is formed as shown in FIG. 45 and thereafter a silicon nitride film 44 is formed. Further, connecting holes are defined in the silicon nitride film 44 and the insulating film 17 and connecting plugs 21 and 22 are formed in the connecting holes respectively. Thereafter, the wiring grooves 18 are defined in the insulating film in a manner similar to the process steps shown in FIGS. 13 through 17 (see FIG. 46) and sidewall spacers 19 are formed (see FIG. 47). Since the silicon nitride film 44 is formed in this case, it is possible to cause the silicon nitride film 44 to function as an etching stopper upon etching at the processing of each wiring groove 18 or etching at the processing of each sidewall spacer 19.

Embodiment 2

Figure 48:
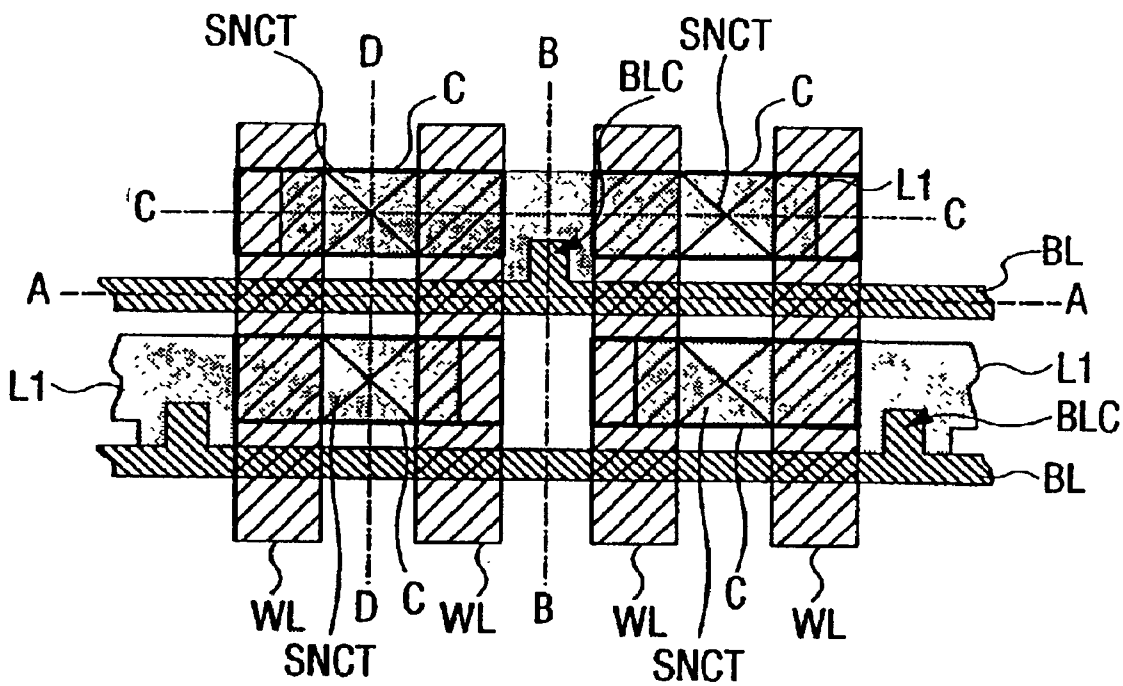
FIG. 48 is a plan view showing a part of a memory array MARY of a DRAM according to an embodiment 2 in enlarged form.
Figure 49:
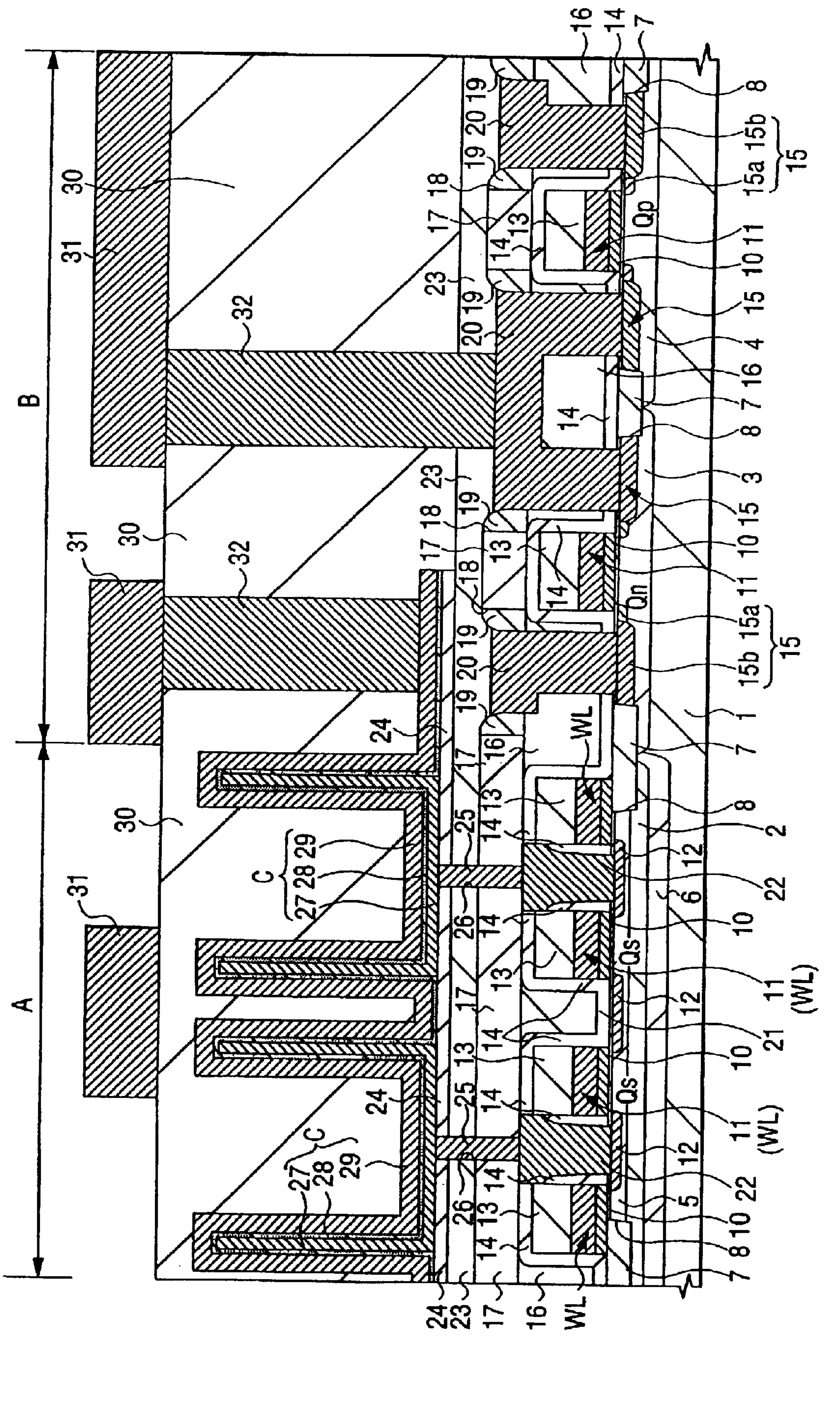
FIG. 49 is a cross-sectional view illustrating a portion of a memory cell and a part of a peripheral circuit both lying in a DRAM area or region employed in the embodiment 2 and shows a cross section taken along line C—C in FIG. 48.
Figure 50C:
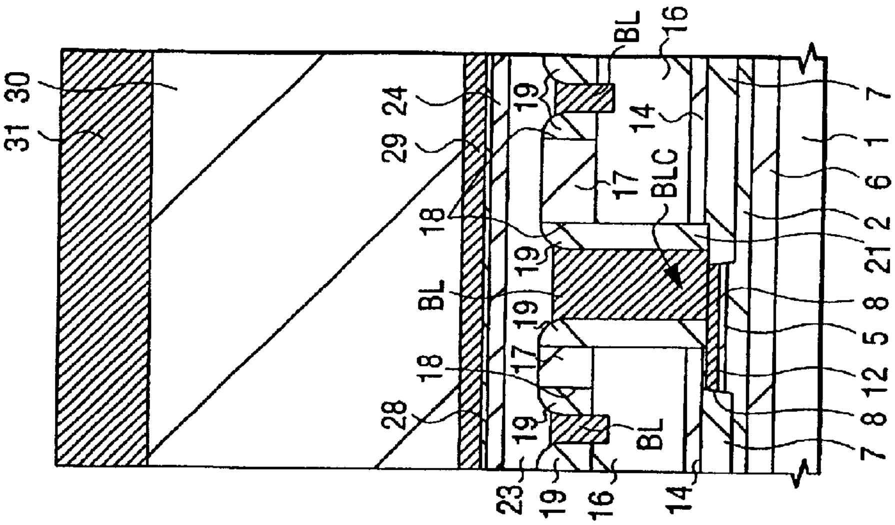
FIGS. 50(*a*) to 50(*c*) are cross-sectional views showing the portion of the memory cell in the DRAM region employed in the embodiment 2, wherein FIG. 50(*a*) illustrates a cross section taken along line A—A in FIG. 48, FIG. 50(*b*) shows a cross section taken along line D—D in FIG. 48, and FIG. 50(*c*) depicts a cross section taken along line B—B in FIG. 48.
Figure 50B:
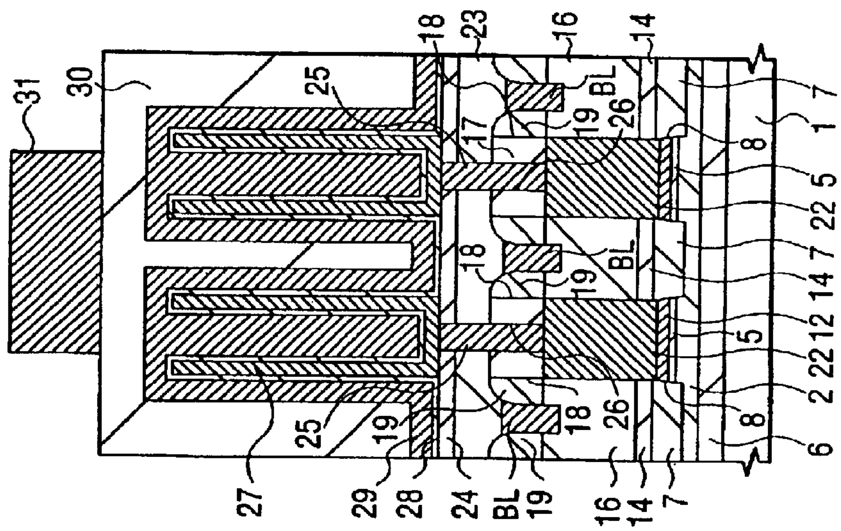
Figure 50A:
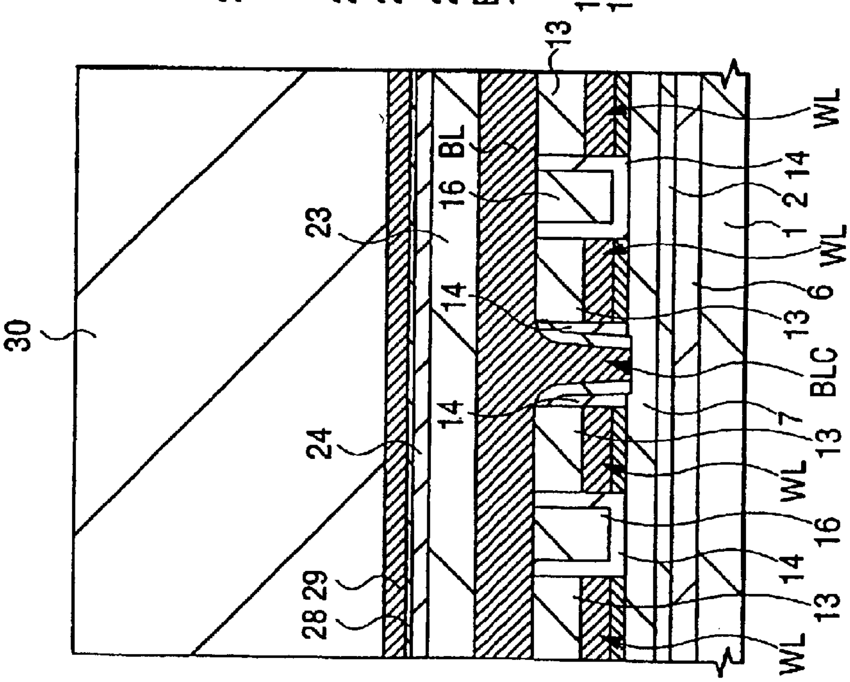
Figure 51:
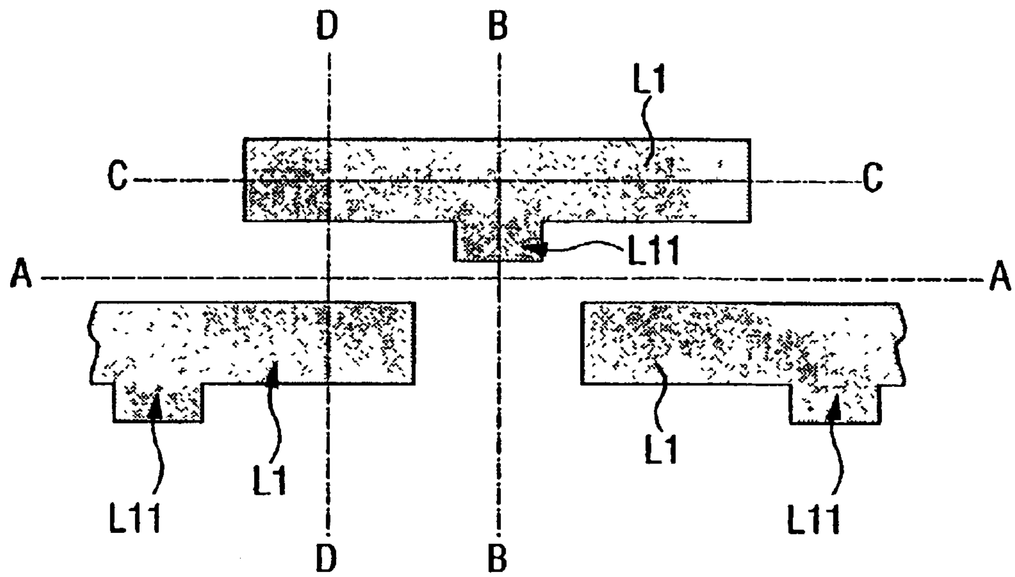
FIGS. 51, 53, 55, 56 and 60 are respectively process-by-process plan views of each memory cell of the DRAM according to the embodiment 2.

FIG. 48 is an enlarged plan view of a part of a memory array MARY of a DRAM according to a second embodiment. FIG. 49 is a cross-sectional view showing a portion (region A) of a memory cell and a part (region B) of a peripheral circuit lying in a DRAM region employed in the present embodiment and shows a cross section taken along line C—C in FIG. 48. FIG. 50(*a*) shows a cross section taken along line A—A in FIG. 48, FIG. 50(*b*) illustrates a cross section taken along line D—D in FIG. 48, and FIG. 50(*c*) depicts a cross section taken along line B—B in FIG. 48, respectively.

The DRAM according to the present embodiment 2 is different from the DRAM according to the embodiment 1 only in portions for connecting bit lines BL and semiconductor regions 12 thereof to one another. Other configurations are substantially similar to those of the embodiment 1. Thus, only the different portions will be explained below and the description of similar components will be omitted.

In the DRAM according to the present embodiment 2, the semiconductor regions 12 lying in central portions of active regions L1 and the bit lines BL are not connected to one another through the connecting plugs 21 employed in the embodiment 1. The bit lines BL are directly connected to the semiconductor regions 12 through connecting portions BLC formed integrally with the bit lines BL, respectively. Thus, since there is a displacement in parallel position between a plane pattern of each bit line BL and a plane pattern of each active region L1, an extension region L11, which protrudes or extends out in the direction of each bit line BL, is provided in the active region L1 as shown in FIG. 48 to ensure mutually overlapped regions. The connecting portion BLC in the bit line BL is formed so as to extend out in the direction of each active region L1.

A method of manufacturing the DRAM according to the present embodiment 2 will next be described. FIGS. 51 through 60 are respectively cross-sectional views or plan views showing, in process order, one example of the method for manufacturing the DRAM according to the present embodiment 2. In each cross-sectional view, the view (a) shows a cross section taken along line C—C in FIG. 48 and a cross section of a peripheral circuit portion, the view (b) illustrates a cross section taken along line A—A in FIG. 48, the view (c) depicts a cross section taken along line D—D in FIG. 48, and the view (d) shows a cross section taken along line B—B in FIG. 48, respectively.

Separation regions 7 are first formed in a manner similar to the embodiment 1. The separation regions 7 are formed in patterns for the active regions L1 shown in FIG. 51 and have extension regions L11 respectively.

Figure 10:
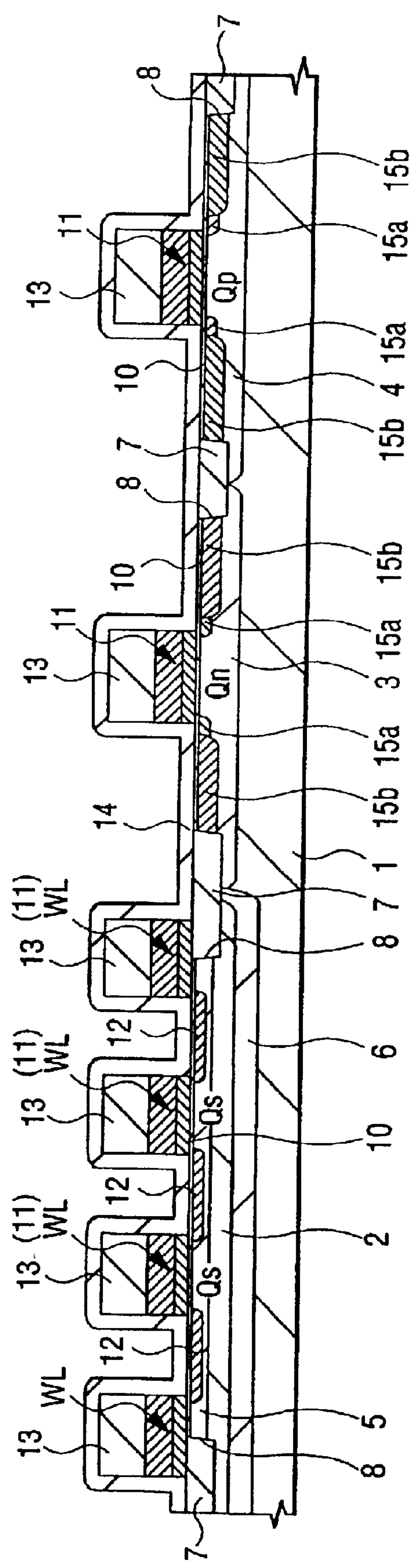
Figures 52A, 52B, 52C, 52D:
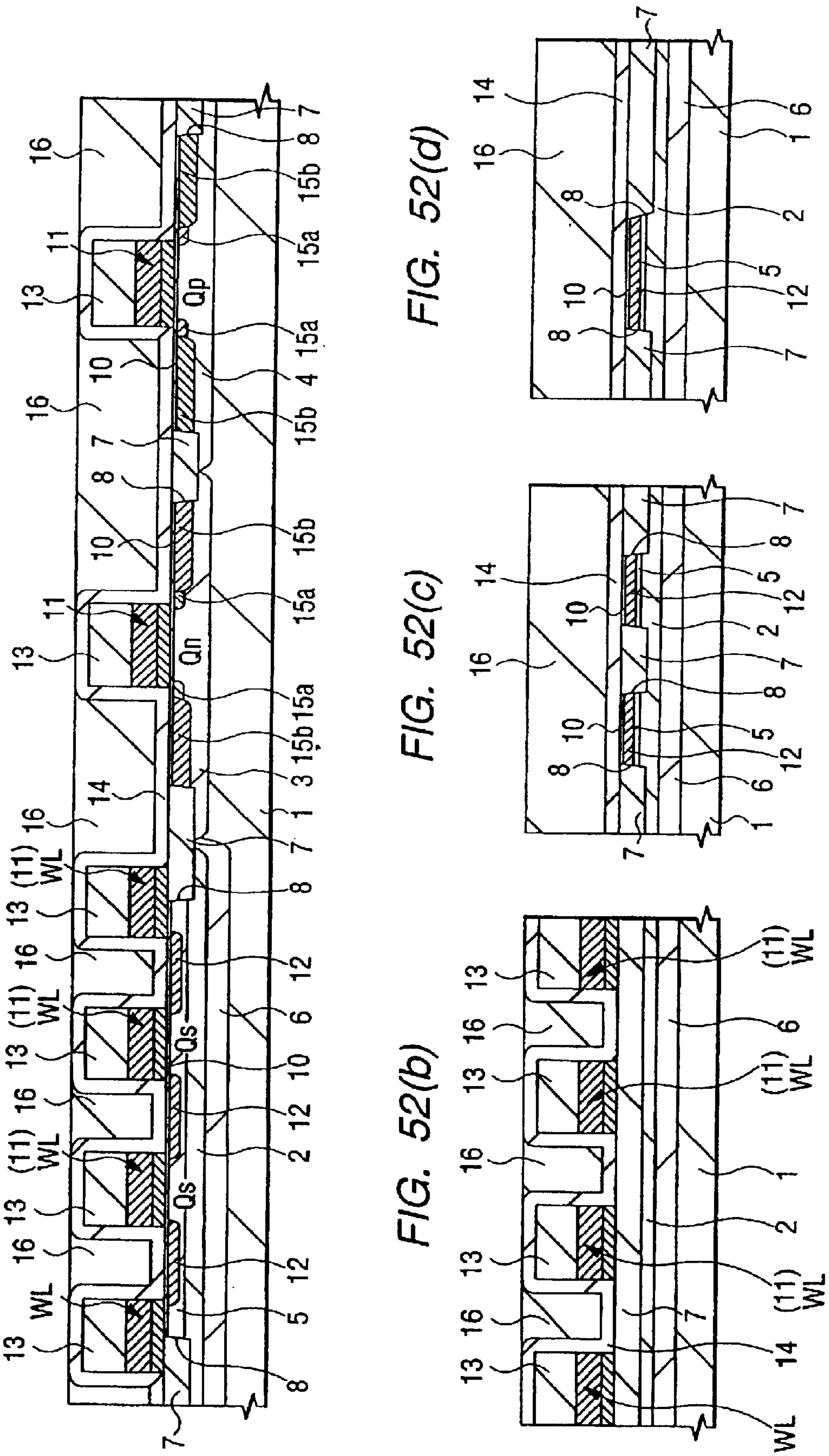
FIGS. 52(*a*), 54(*a*), 57(*a*), 58(*a*) and 59(*a*) are respectively process-by-process cross-sectional views showing the cross section corresponding to FIG. 49.
Figure 54A:
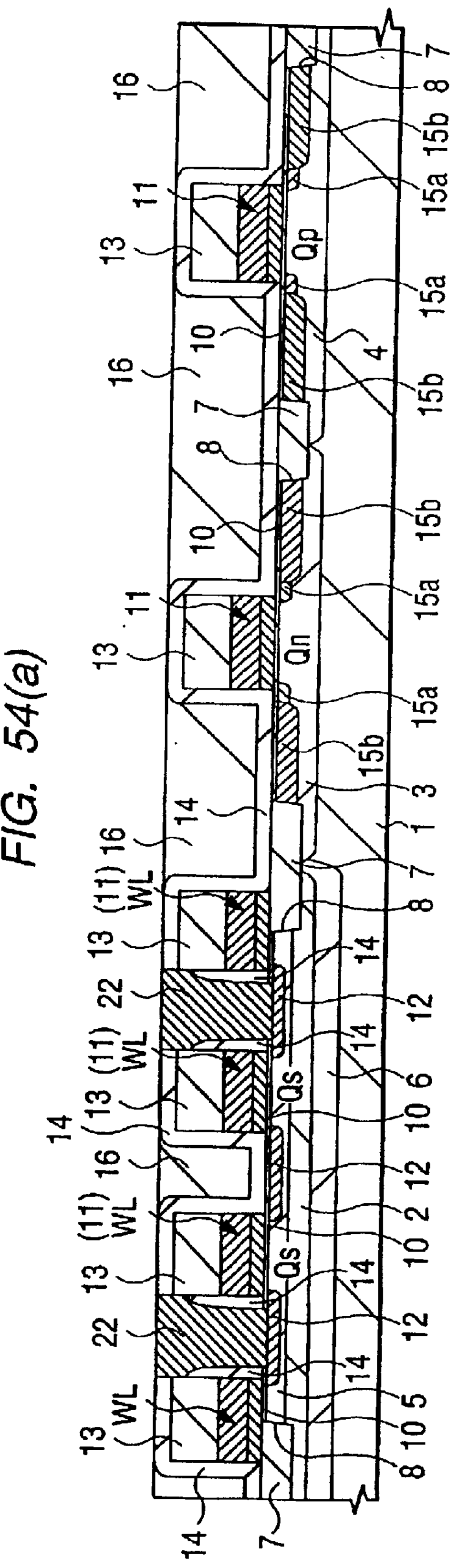
Figure 54B:
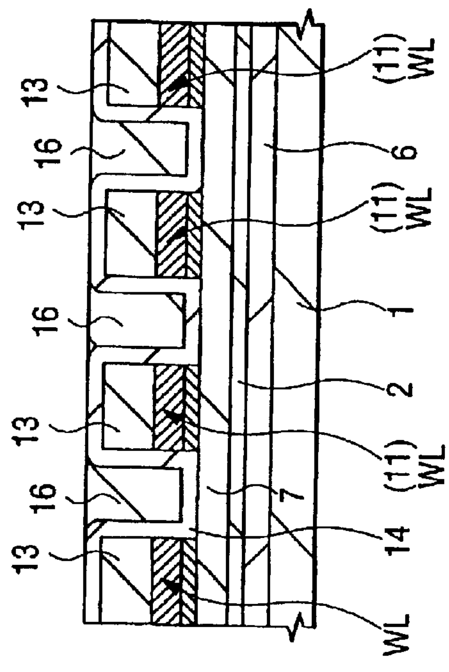
Figure 54C:
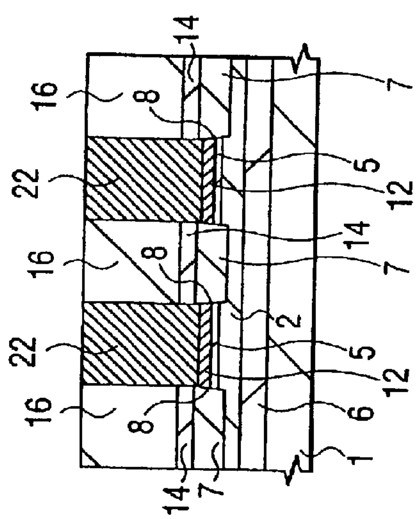
Figure 54D:
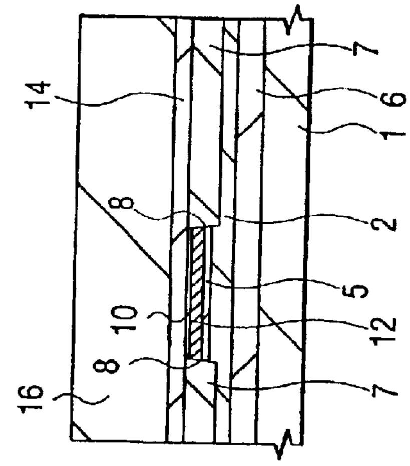

Next, respective members or elements are formed in a manner similar to the process steps up to FIG. 10 in the embodiment 1 and an insulating film 16 is formed in a manner similar to the embodiment 1 (see FIG. 52(*a*)).

Figure 53:
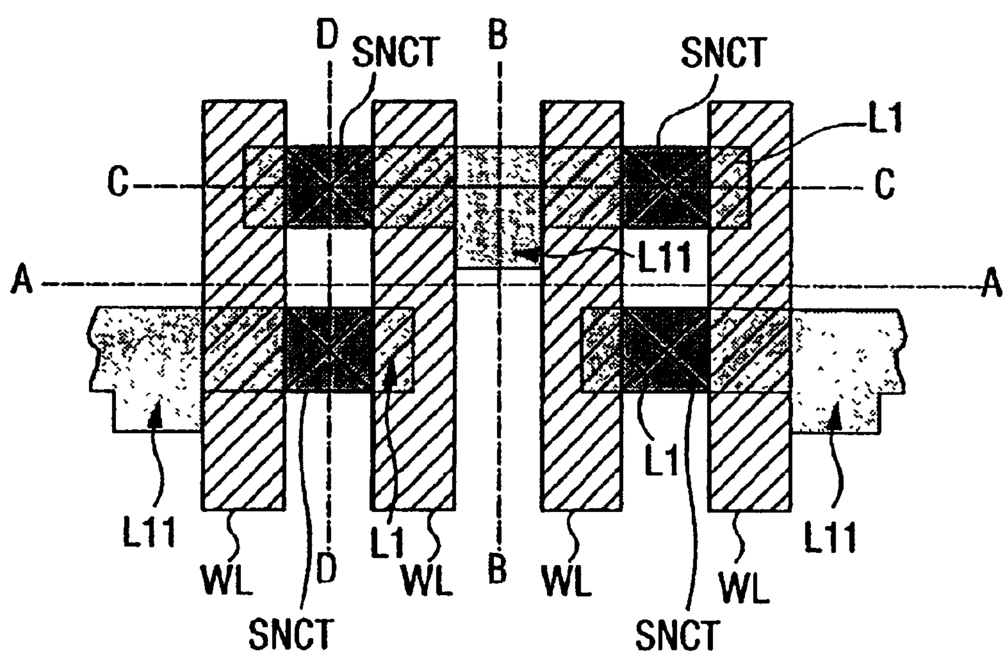

Connecting holes are next formed in patterns for SNCT shown in FIG. 53 and connecting plugs 22 are formed therein in a manner similar to the embodiment 1 (see FIG. 54(*a*)).

Figure 55:
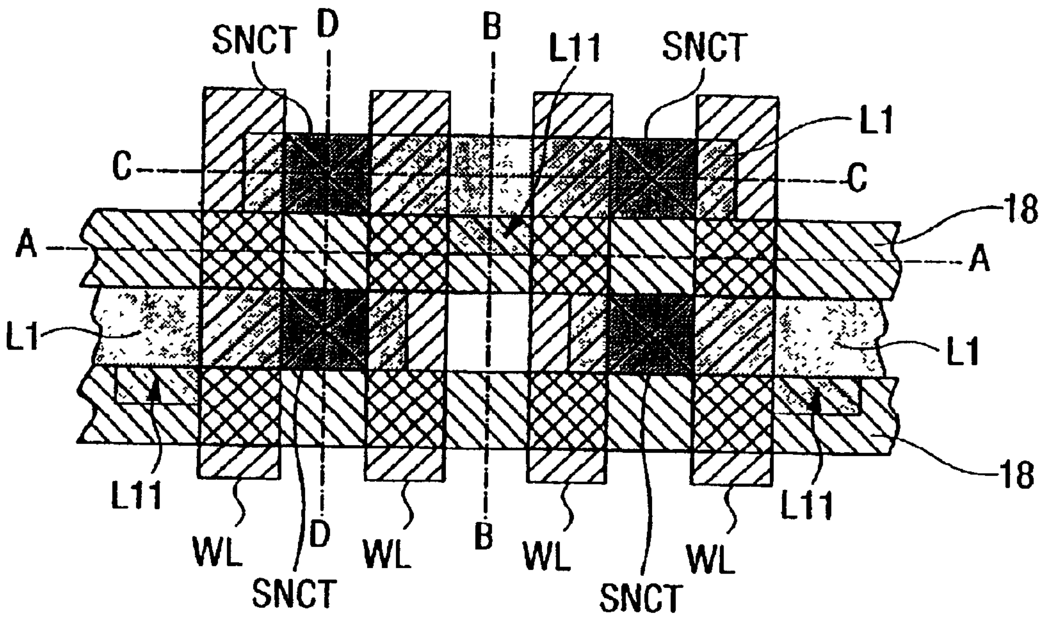

Next, an insulating film 17 for each wire formation is formed in a manner similar to the process step of FIGS. 13(*a*)–13(*d*) in the embodiment 1. Further, wiring grooves 18 are defined in the insulating film 17 in a manner similar to FIGS. 14(*a*)–14(*d*) in the embodiment 1. A plan view showing the state of formation of the wiring grooves 18 is shown in FIG. 55.

Figure 56:
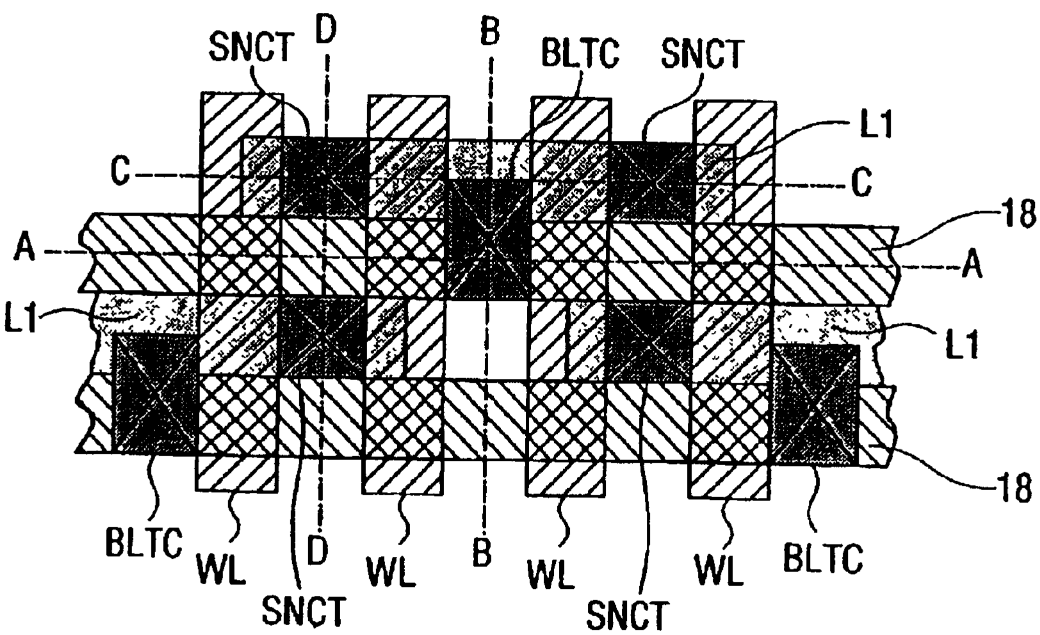
Figures 57A, 57B, 57C, 57D:
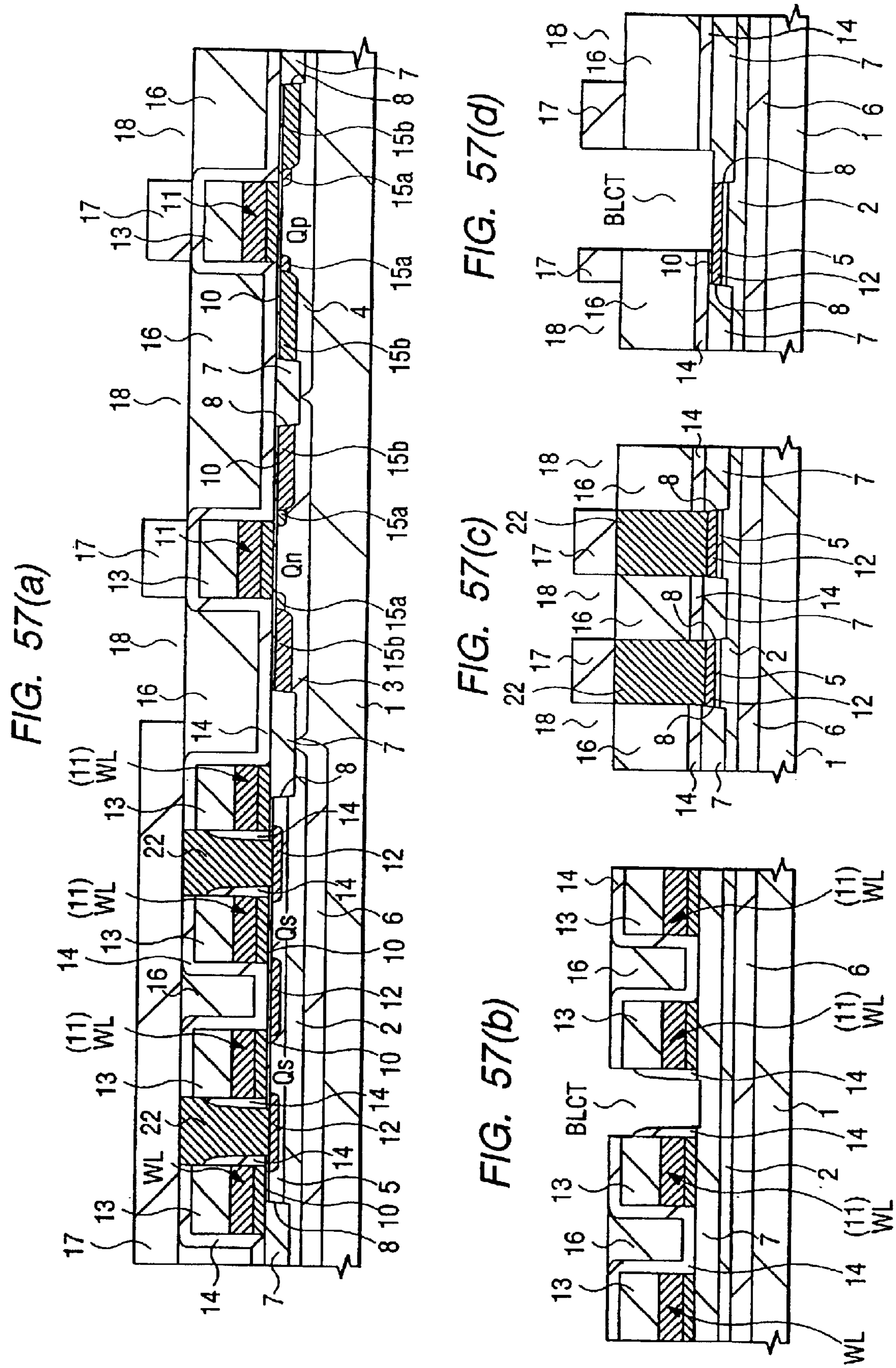

By using patterns for connecting holes BLCT shown in FIG. 56, the connecting holes BLCT are next defined so as to overlap with the wiring grooves 18 respectively (see FIG. 57(*a*)). The formation of the connecting holes BLCT can be done in a manner similar to the formation of the connecting holes in which the connecting plugs 22 are formed.

Figures 58A, 58B, 58C, 58D:
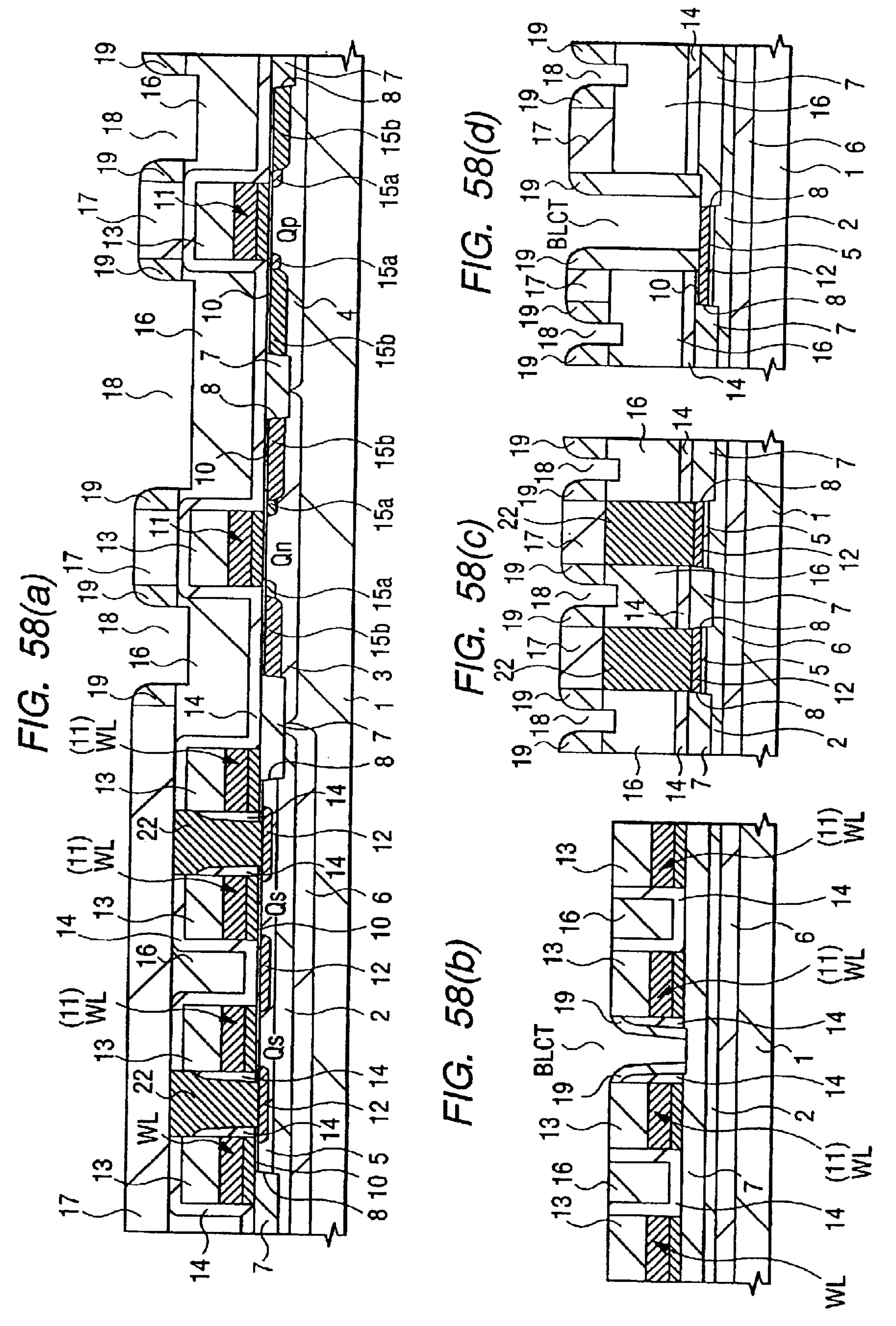
Figures 59A, 59B, 59C, 59D:
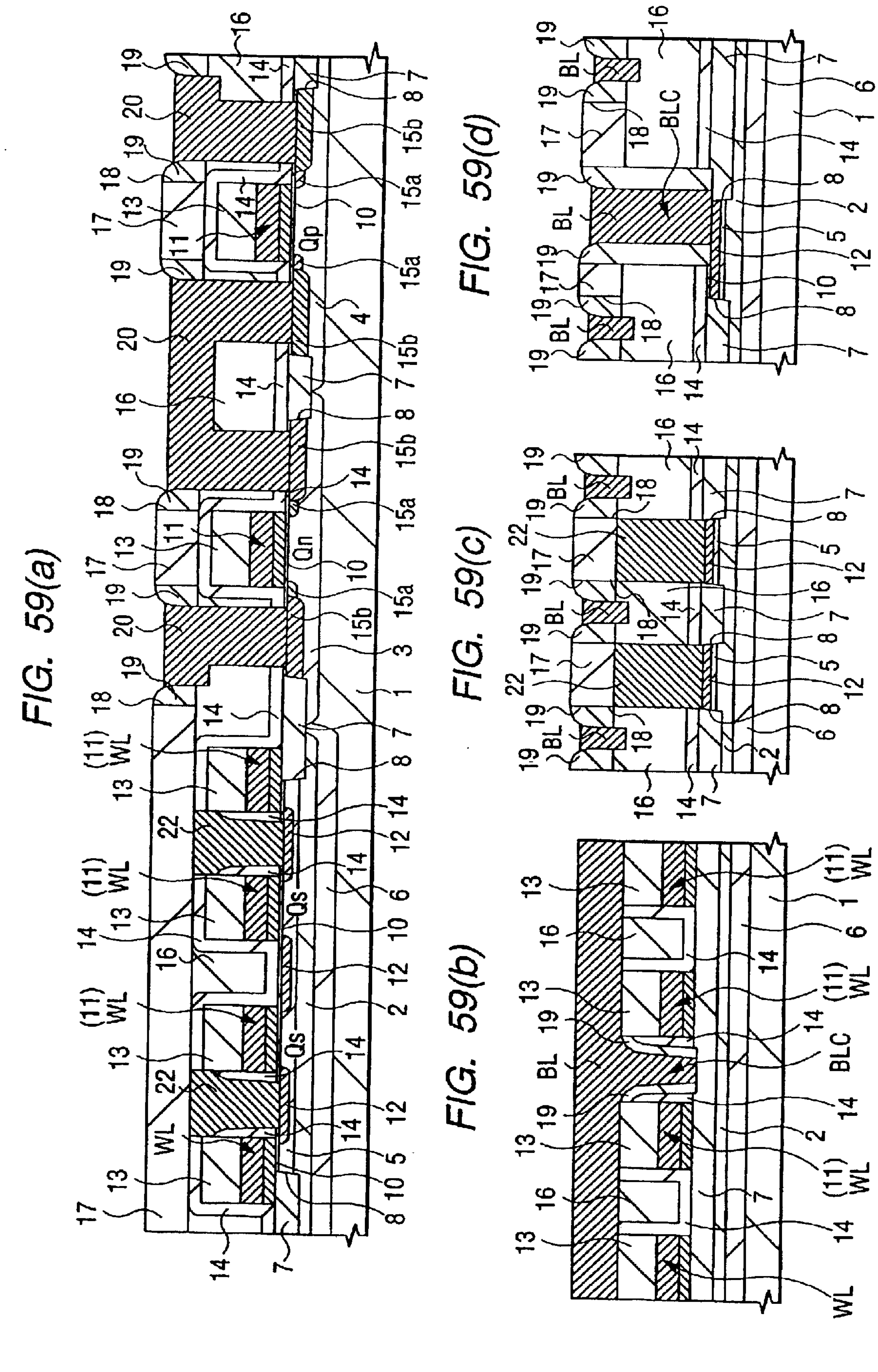

Next, an insulating film 33 is formed in a manner similar to the process step of FIGS. 16(*a*)–16(*d*) in the embodiment 1 and is subjected to anisotropic etching to thereby form sidewall spacers 19 on corresponding side walls of the wiring grooves 18 (see FIG. 58(*a*)). Since the insulating film 33 is formed up to the inside of each connecting hole BLCT at this time, the sidewall spacers 19 are formed even on the corresponding inner walls of the connecting holes BLCT.

Figure 60:
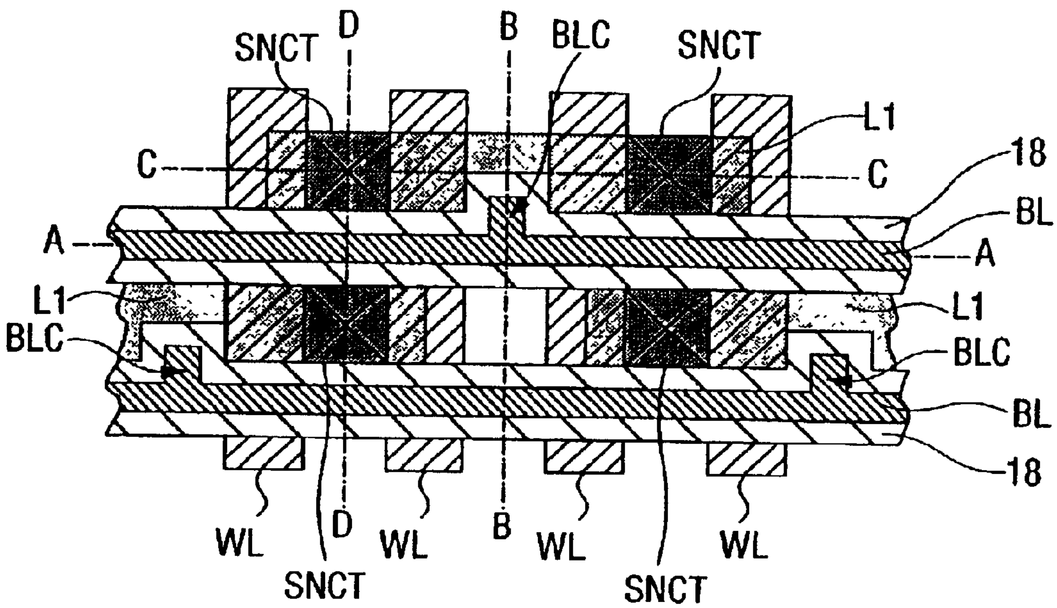

Next, bit lines BL and a first layer interconnection 20 are formed inside the wiring grooves 8 whose widths are narrowed by the sidewall spacers 19, in a manner similar to the process steps of FIGS. 19(*a*)–19(*d*) and 20(*a*)–20(*d*) in the embodiment 1 (see Fig. ). Incidentally, connecting portions BLC formed integrally with the bit lines BL are formed inside the connecting holes BLCT. A plan view indicative of this state is shown in FIG. 60.

Since the subsequent process steps are similar to those in the embodiment 1, their description will be omitted.

According to the DRAM of the present embodiment, since the bit lines BL and the connecting portions BLC connected to the semiconductor regions 12 of the semiconductor substrate 1 are formed integrally, the process can be simplified and the connecting resistance at each integrally-formed portion can be reduced, thereby making it possible to enhance the performance of the DRAM. It is needless to say that the present embodiment can obtain the effect of reducing the wiring width of each bit line BL, the effect of reducing the height of each cell and the effect of reducing the capacitance between the adjacent bit lines in a manner similar to the first embodiment 1.

Embodiment 3

Figure 61:
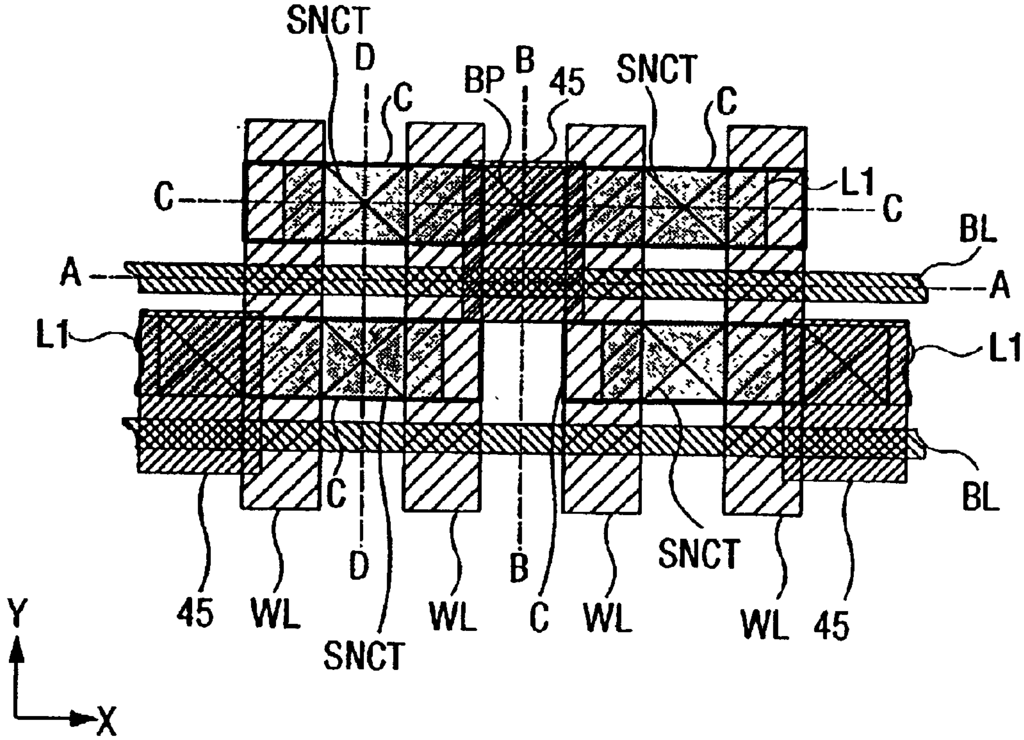
FIG. 61 is a plan view showing a part of a memory array MARY of a DRAM according to a third embodiment in enlarged form.
Figure 62:
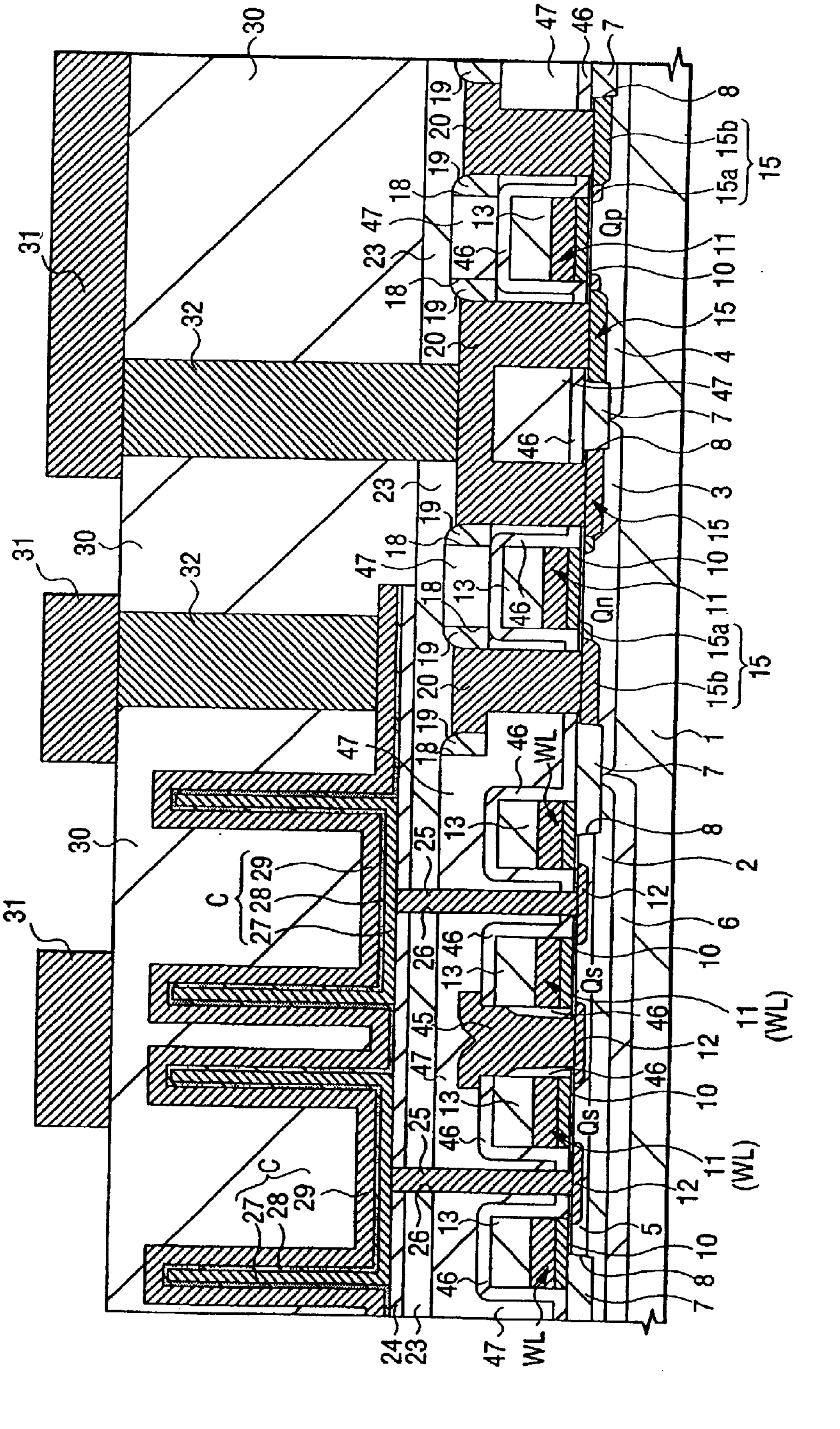
FIG. 62 is a cross-sectional view illustrating a portion of a memory cell and a part of a peripheral circuit both, lying in a DRAM area or region employed in the embodiment 3 and shows a cross section taken along line C—C in FIG. 61.
Figures 63A, 63B, 63C:
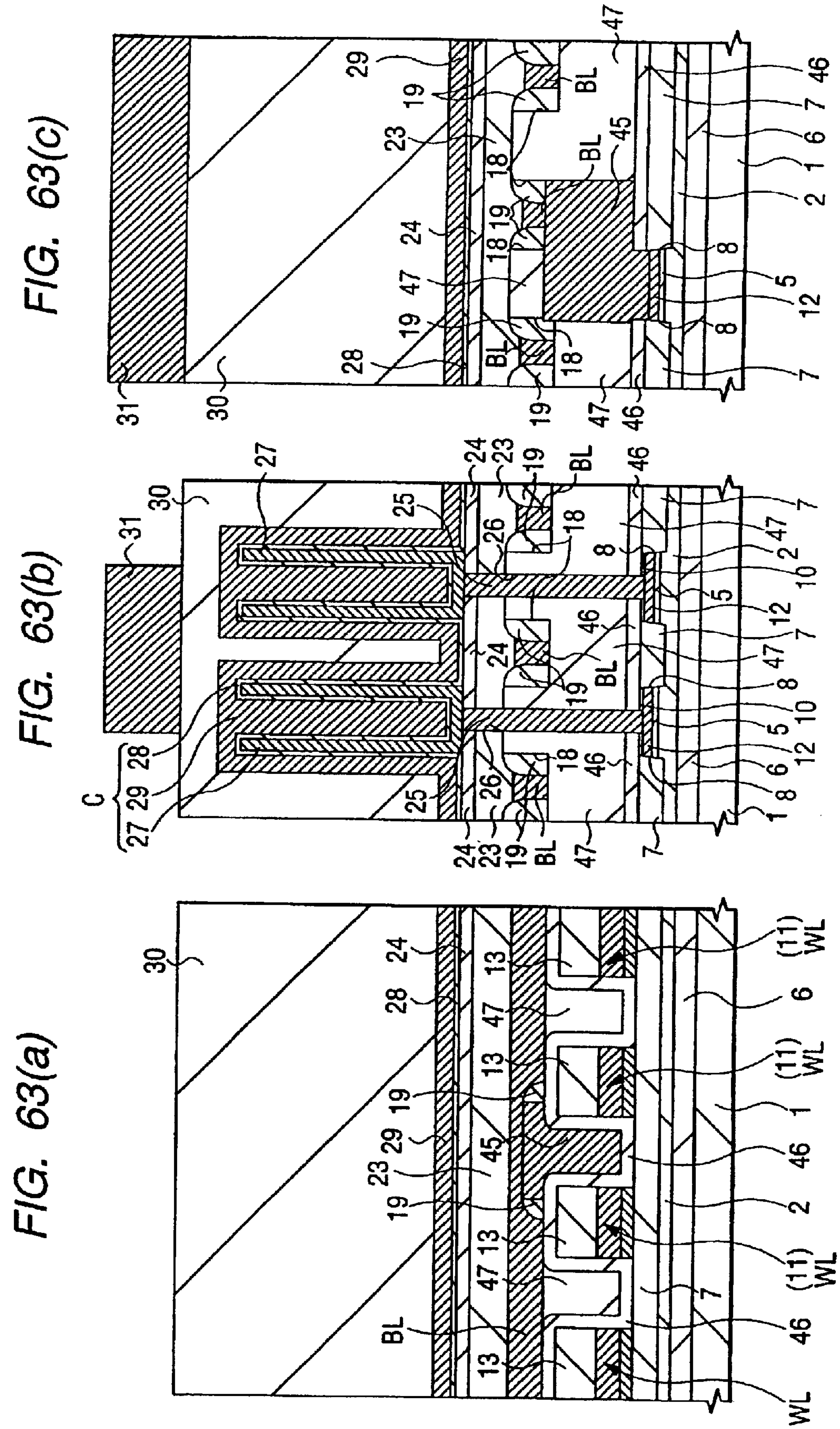
FIGS. 63(*a*) to 63(*c*) are cross-sectional views showing the portion of the memory cell in the DRAM region employed in the embodiment 3, wherein FIG. 63(*a*) illustrates a cross section taken along line A—A in FIG. 61, FIG. 63(*b*) shows a cross section taken along line D—D in FIG. 61, and FIG. 63(*c*) depicts a cross section taken along line B—B in FIG. 61.
Figure 64:
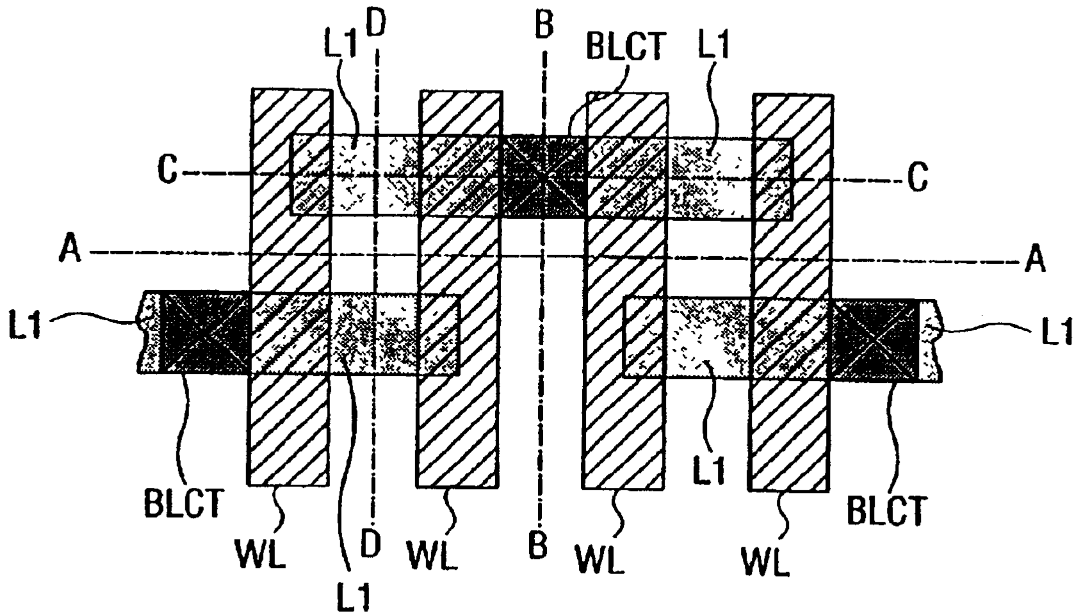
FIGS. 64 and 66 are respectively process-by-process plan views showing each memory cell of the DRAM according to the embodiment 3.
Figure 66:
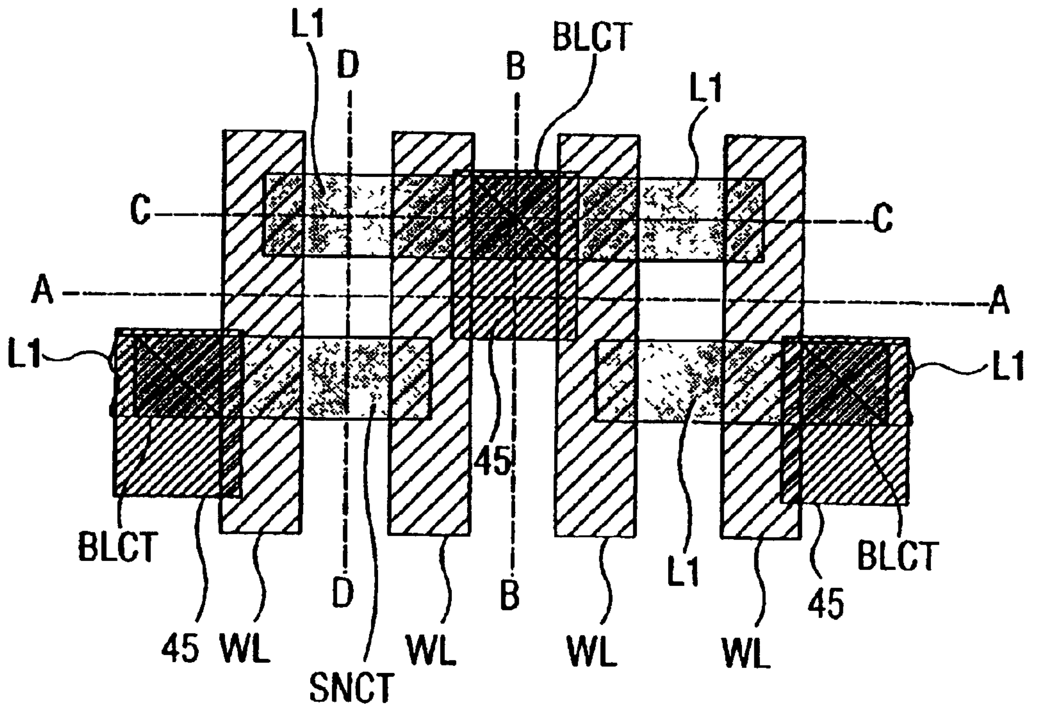
Figures 65A, 65B, 65C, 65D:
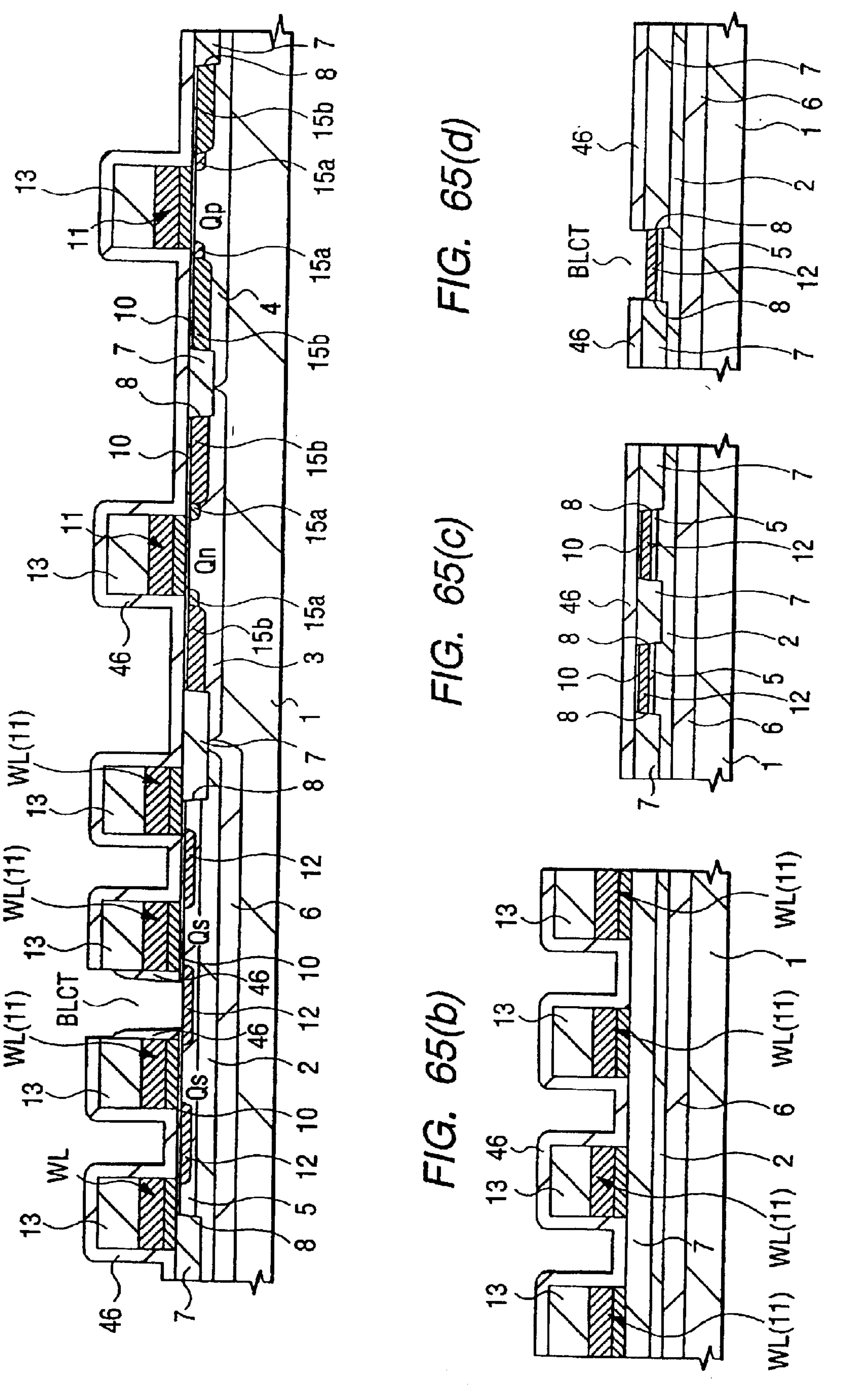
FIGS. 65(*a*), 67(*a*), 68(*a*) and 69(*a*) are respectively process-by-process cross-sectional views showing the cross section corresponding to FIG. 62.
Figures 67A, 67B, 67C, 67D:
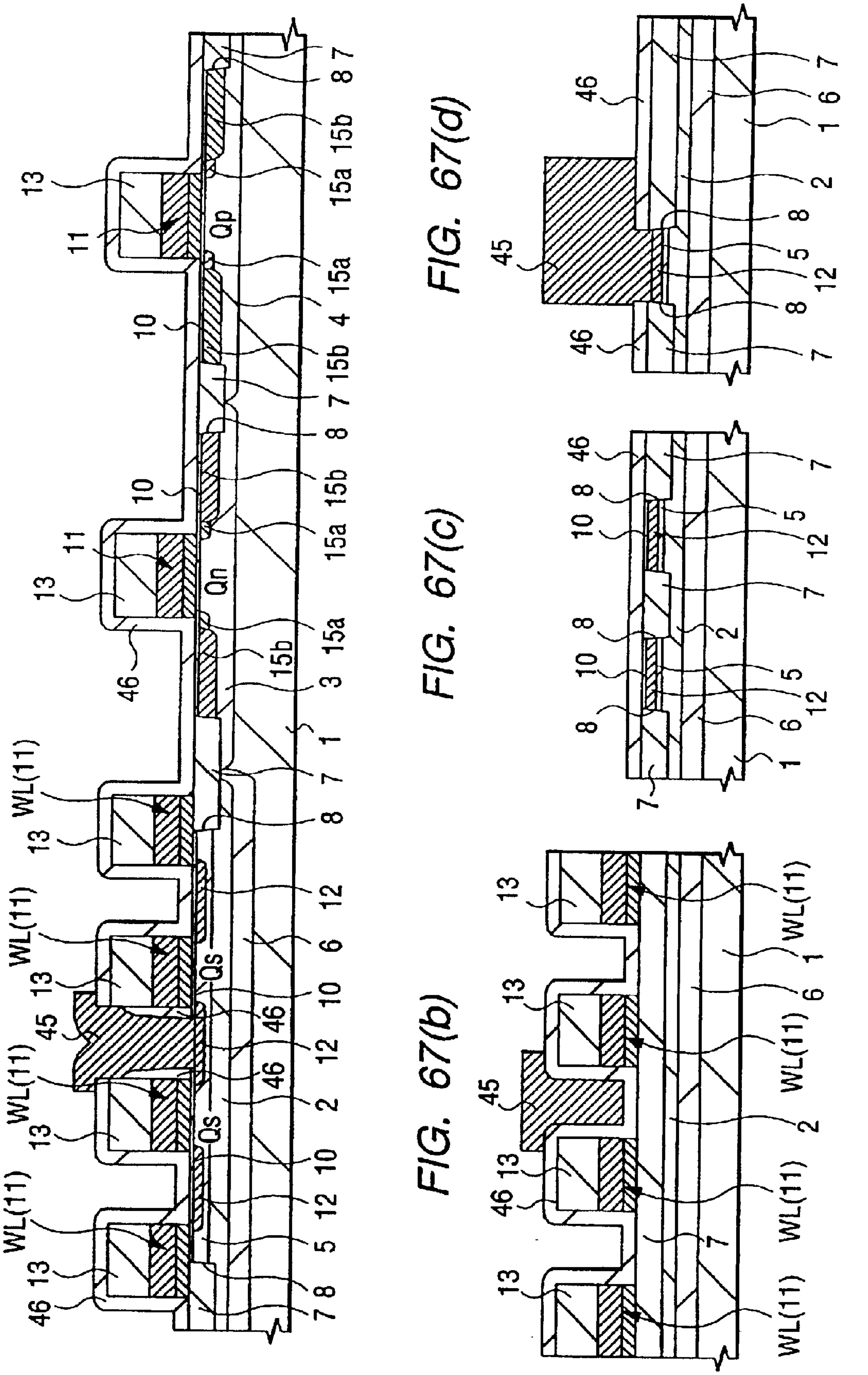

FIG. 61 is a plan view showing a part of a memory array MARY of a DRAM according to an embodiment 3 in enlarged form. FIG. 62 is a cross-sectional view showing a portion (region A) of a memory cell and a part (region B) of a peripheral circuit lying in a DRAM region employed in the present embodiment and shows a cross section taken along line C—C in FIG. 61. FIG. 63(*a*) shows a cross section taken along line A—A in FIG. 61, FIG. 63(*b*) illustrates a cross section taken along line D—D in FIG. 61, and FIG. 63(*c*) depicts a cross section taken along line B—B in FIG. 61, respectively.

The DRAM according to the present embodiment 3 is different from the DRAM according to the embodiment 1 only in portions for connecting bit lines BL and semiconductor regions 12 thereof to one another. Other configurations are substantially similar to those of the embodiment 1. Thus, only the different portions will be explained below and the description of similar components will be omitted.

In the DRAM according to the present embodiment 3, the semiconductor regions 12 lying in central portions of each active region L1 and the bit lines BL are not connected to one another through the connecting plugs 21 employed in the embodiment 1. They are connected to one another through each conductive film 45 formed in a pattern which covers the semiconductor regions 12 on a plan basis. The conductive film 45 is formed on an insulating film 46 and is composed of a polycrystalline silicon film in which an impurity such as phosphorus is introduced. The conductive film 45 is connected to the semiconductor regions 12 through connecting holes BLCT.

In the DRAM according to the present embodiment 3 as well, the semiconductor regions 12 at both ends of each active region L1 and lower electrodes 27 of information storage capacitative elements C are not connected to one another through the connecting plugs 22 and connecting plugs 25 employed in the embodiment 1, but are connected to one another through only the connecting plugs 25.

Since there is no need to effect the two-stage etching described in the embodiment 1 on an insulating film 46, it is unnecessary to form the insulating film 46 with a silicon nitride film. Thus, the insulating film 46 can be composed of a silicon oxide film. Further, since an insulating film 47 for defining each wiring groove 18 doubles as an insulating film for covering each gate electrode 11 in the DRAM according to the present embodiment 3, it is not necessary to separately form the insulating films 16 and 17, and the process can be reduced as will be described later.

A method of manufacturing the DRAM according to the present embodiment will next be explained. FIGS. 64 through 69 are respectively cross-sectional views or plan views showing, in process order, one example of the method for manufacturing the DRAM according to the present embodiment 3. In each cross-sectional view, the view (a) shows a cross section taken along line C—C in FIG. 61 and a cross section of a peripheral circuit portion, the view (b) illustrates a cross section taken along line A—A in FIG. 61, the view (c) depicts a cross section taken along line D—D in FIG. 61, and the view (d) shows a cross section taken along line B—B in FIG. 61, respectively.

The method of manufacturing the DRAM according to the present embodiment 3 is similar to the process steps up to FIG. 10 in the embodiment 1. However, an insulating film 46 is composed of a silicon oxide film formed by the CVD process, for example. Thereafter, connecting holes BLCT are respectively defined in the insulating film 46 in patterns for the connecting holes BLCT shown in FIG. 64 (see FIG. 65(*a*)). At this time, sidewall spacers of the insulating film 46 are formed on the corresponding side walls of gate electrodes 11.

Next, a polycrystalline silicon film in which, for example, phosphorus is introduced, is deposited over the entire surface of a semiconductor substrate 1. The polycrystalline silicon film is patterned in patterns for conductive films 45 shown in FIG. 66. Thus, the conductive films 45 are formed on the insulating film 46 (see FIG. 67(*a*)).

Next, an insulating film composed of a silicon oxide film formed by the CVD process, for example, is deposited over the entire surface of the semiconductor substrate 1. The insulating film is polished by the CMP process to thereby form an insulating film 47 for wire formation.

If the process steps used until now are compared with those employed in the embodiment 1, then the polishing process using the CMP method is needed twice upon formation of the insulating film 16 for forming the connecting plugs 21 and 22 and formation of the insulating film 17 for wire formation. On the other hand, the polishing process using the CMP method for forming the insulating film 46 for wire formation is required only once in the present embodiment 3. Thus, the polishing process using the CMP method can be performed with a smaller number of steps as compared with the embodiment 1. In the polishing process using the CMP method, the thickness of the insulating film inevitably increases from the viewpoint of the need to ensure the flatness of the semiconductor substrate 1 to some degree over the entire surface of the semiconductor substrate 1. Therefore, a semiconductor integrated circuit device manufactured by a method having many CMP process steps normally increases in height. With such an increase in height, conditions undesirable in terms of processing, such as an increase in the depth of each connecting hole for connecting each upper layer interconnection, etc. occur. In the present embodiment 3, however, the number of times that the CMP process is executed, is reduced as compared with the embodiment 1. Further, an increase in the height of each element is restrained as well as process simplification and reduction, thereby making it possible to facilitate the processing of upper layer interconnections and connecting members.

Figures 68A, 68B, 68C, 68D:
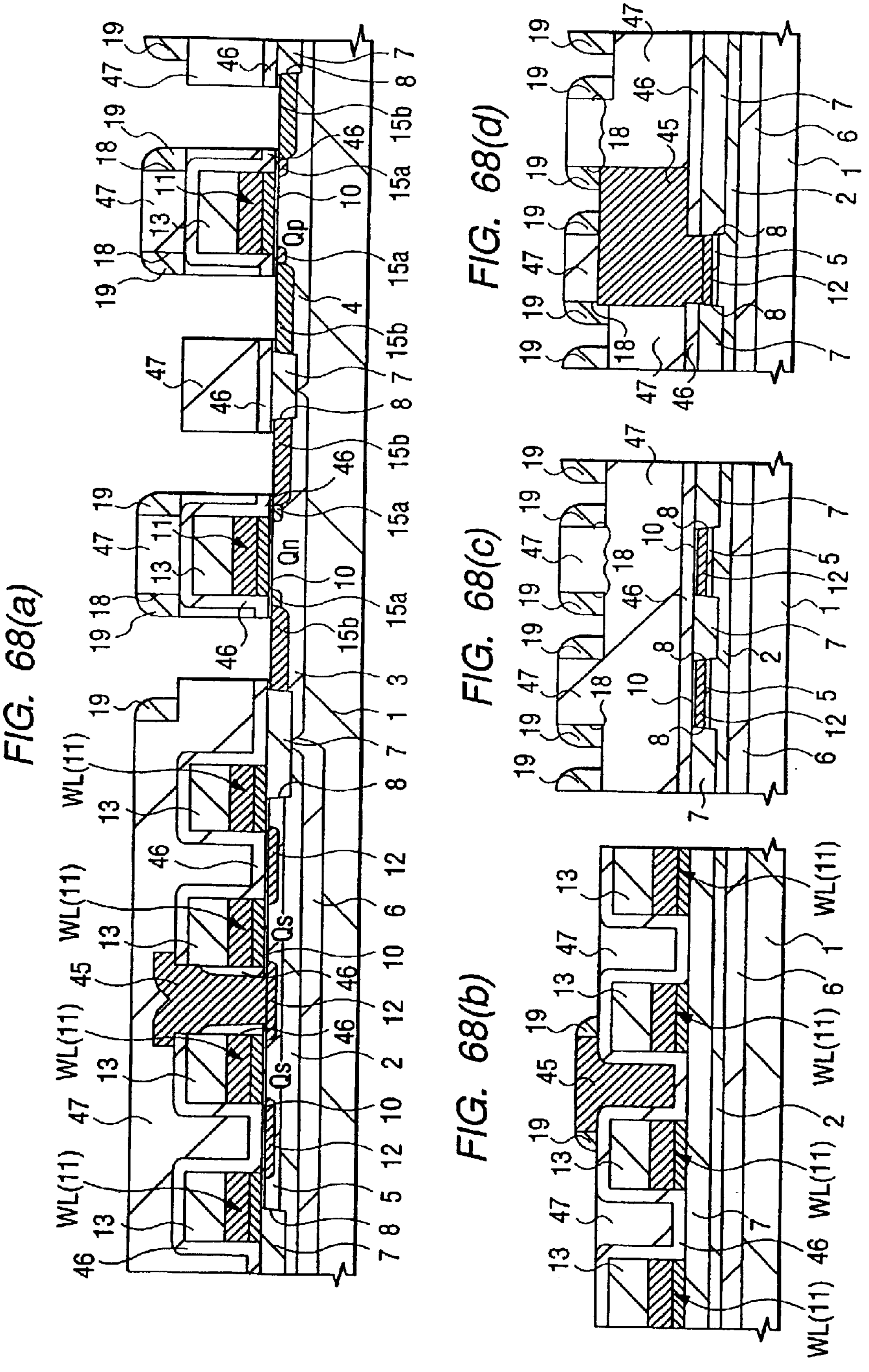

In a manner similar to the embodiment 1, wiring grooves 18 are next defined in the insulating film 47 and sidewall spacers 19 are formed on the corresponding side walls of the wiring grooves 18 (see FIG. 68(*a*)). Incidentally, FIGS. 68(*a*)–68(*d*) show steps in which connecting holes are defined in a region (region B) of a peripheral circuit.

Figures 69A, 69B, 69C, 69D:
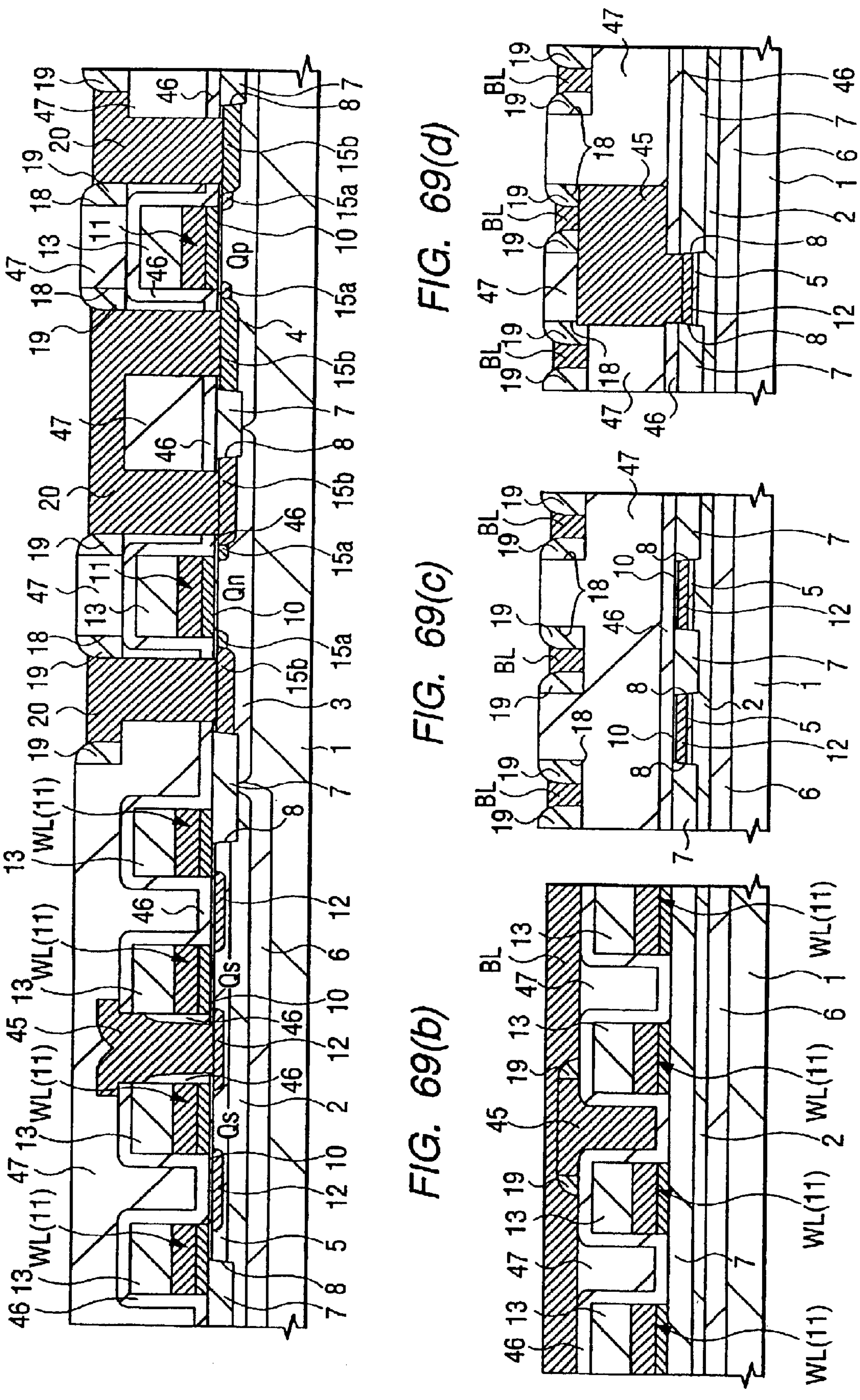

Next, bit lines BL and a first layer interconnection 20 are formed inside the wiring grooves 18 whose widths are narrowed by the sidewall spacers 19, in a manner similar to the process steps of FIGS. 19(*a*)–19(*d*) and 20(*a*)–20(*d*) in the embodiment 1 (see FIG. 69(*a*)).

Since the subsequent process steps are similar to those described in the embodiment 1, their description will be omitted. Since no connecting plugs 22 are formed in the DRAM according to the embodiment 3, capacitive-electrode connecting holes 26 are processed so as to reach semiconductor regions 12 of the semiconductor substrate 1. For example, a polycrystalline silicon film is formed inside the capacitive-electrode connecting holes 26 in a manner similar to the embodiment 1 to thereby form connecting plugs 25.

According to the DRAM representing the present embodiment, the bit lines BL and the semiconductor regions 12 are connected to one another through the conductive films 45, and the insulating film 47 can share the use of the insulating film for the wire formation and the insulating film used to embed the gate electrodes 11. Therefore, the process can be simplified and the number of the CMP process steps is reduced to allow control of the height of each element. It is needless to say that the present embodiment can obtain the effect of reducing the width of each bit line BL, the effect of lowering the height of each cell, and the effect of reducing the capacitance between the adjacent bit lines in a manner similar to the embodiment 1.

While the invention made by the present inventors has been described specifically with reference to various embodiments, the present invention is not necessarily limited to the above-described embodiments. It is needless to say that many changes can be made thereto within a scope not departing from the substance of the invention.

Figure 70:
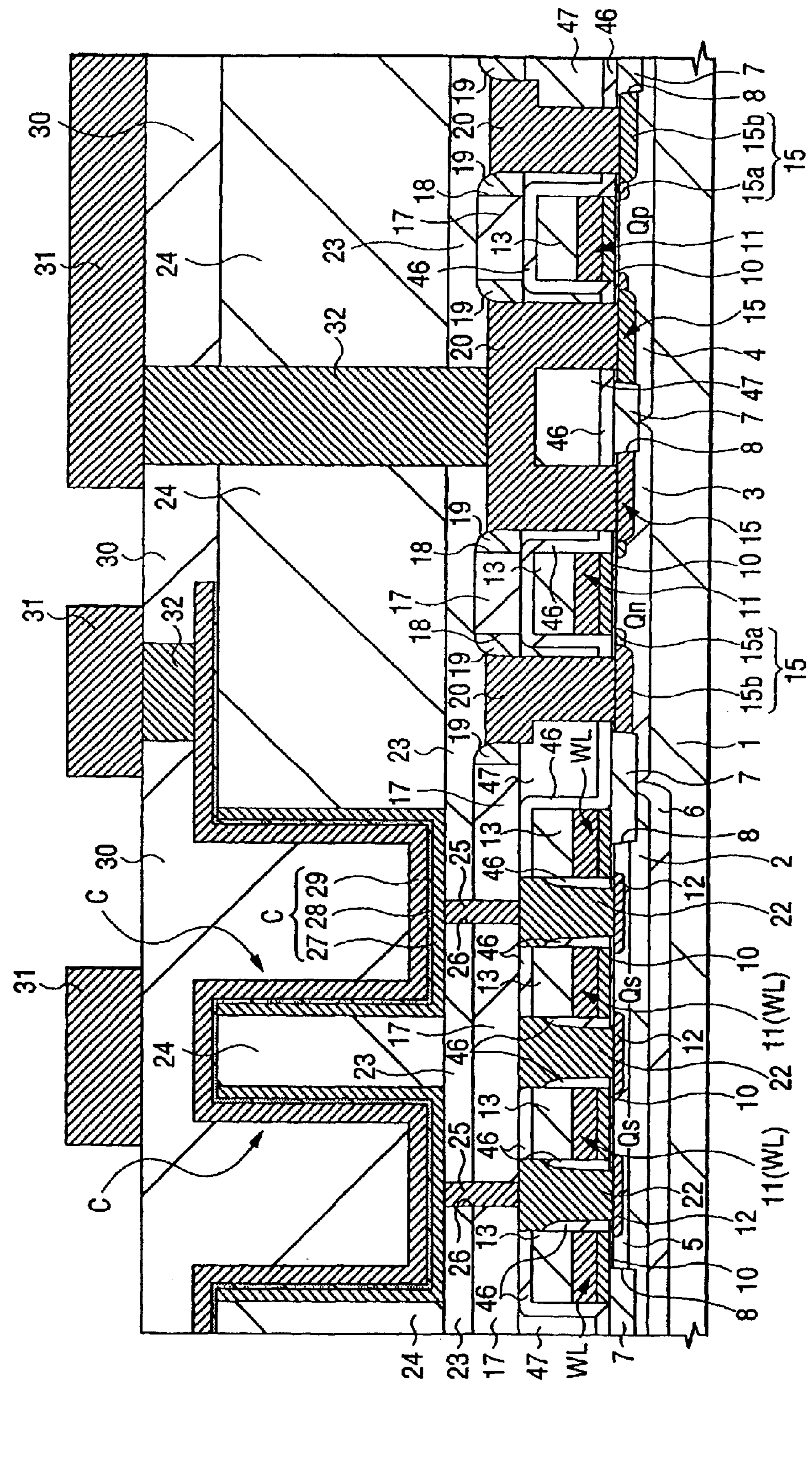
FIG. 70 is a cross-sectional view showing one example of a DRAM according to a further embodiment of the present invention.
Figure 71:
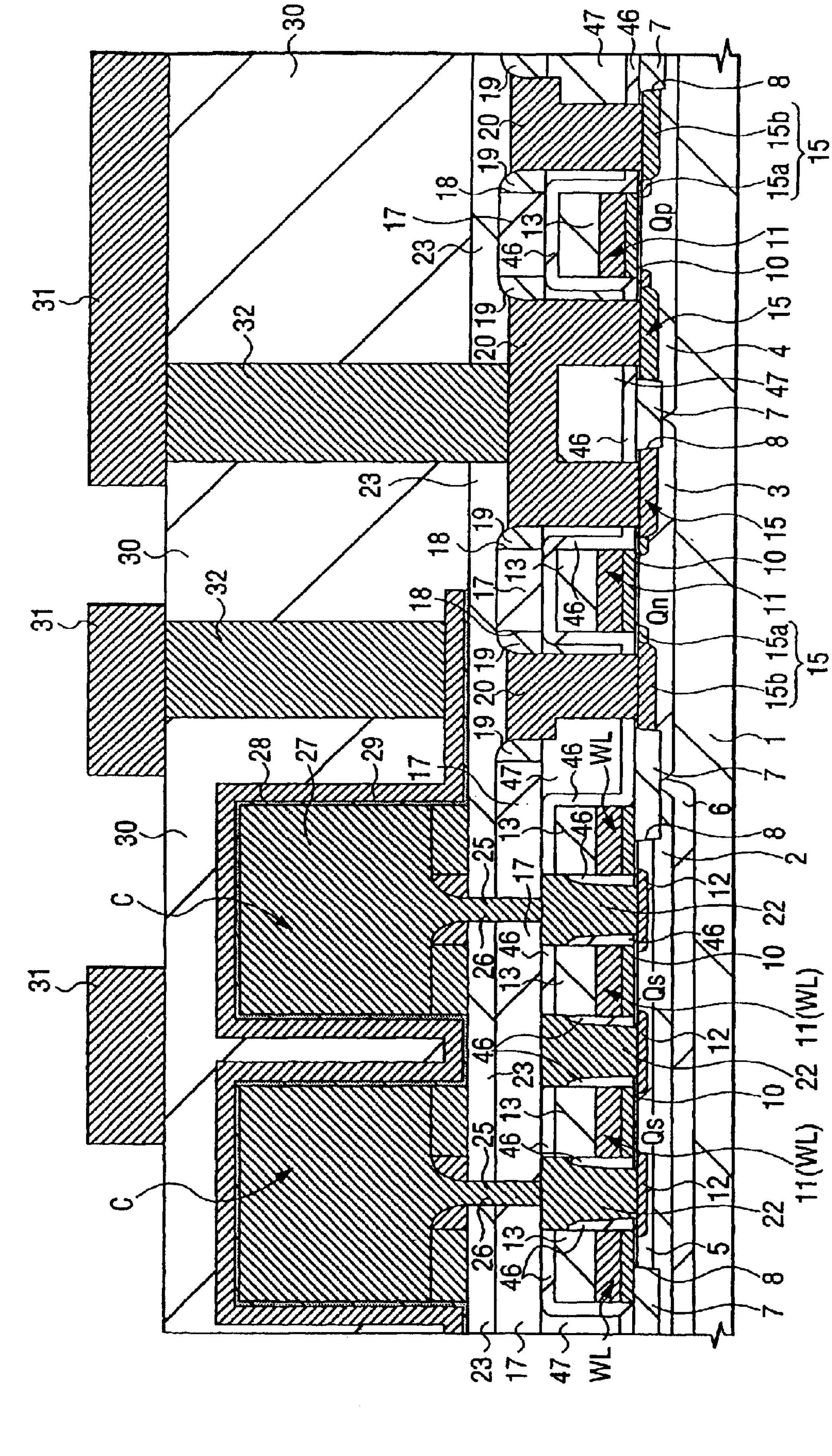
FIG. 71 is a cross-sectional view illustrating another example of the DRAM according to the further embodiment of the present invention.
Figure 72B:
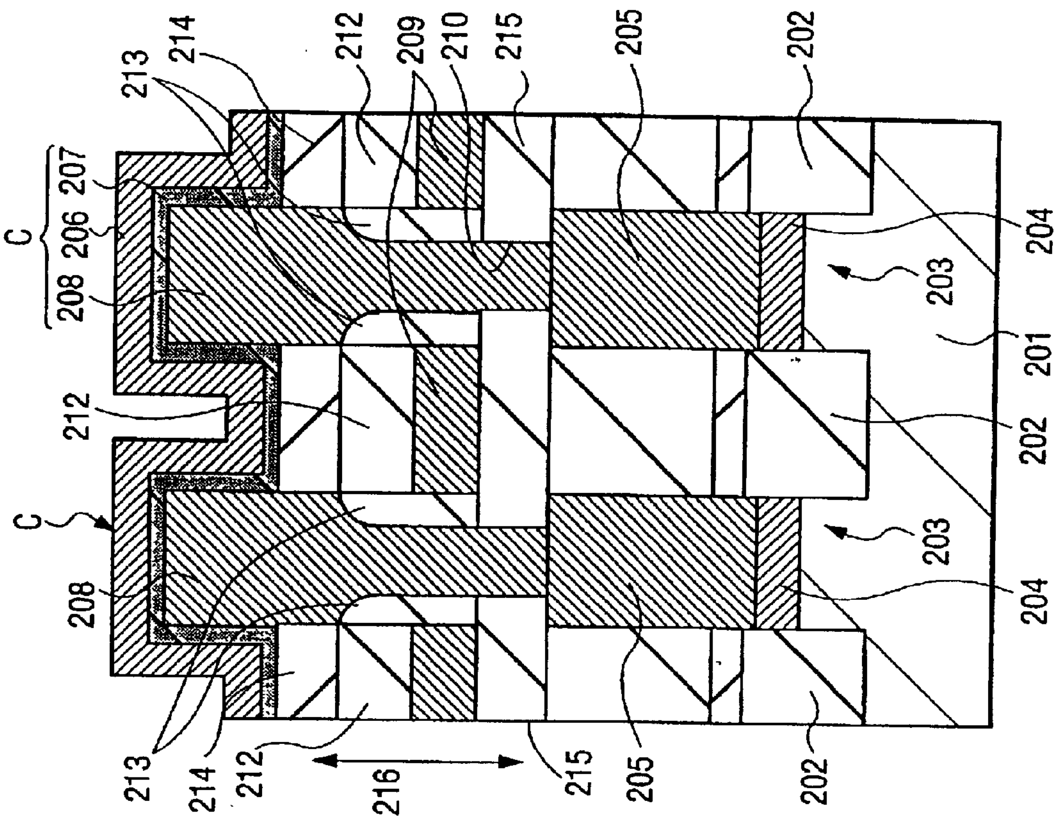
FIGS. 72(*a*) and 72(*b*) are, respectively, cross-sectional views for describing the problem of processing of capacitive-electrode connecting holes and show cross sections of memory cells as seen in directions orthogonal to bit-line extending directions respectively.
Figure 72A:
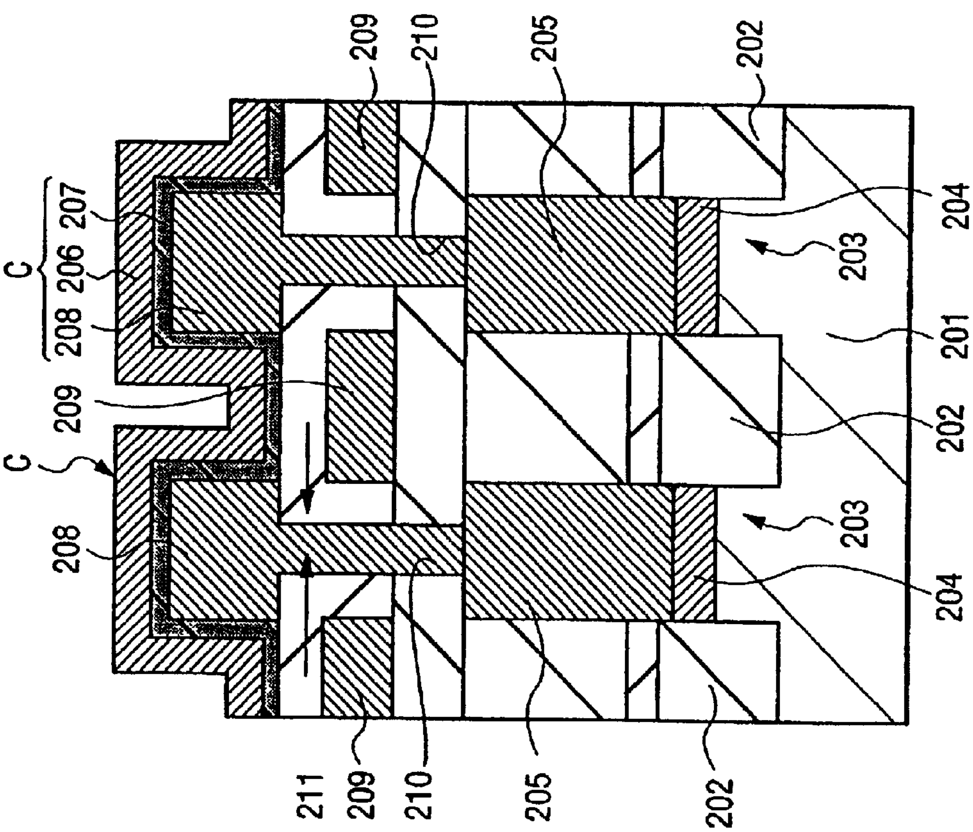

Although the embodiments 1 through 3 represent the case in which information storage capacitative elements having cylindrical lower electrodes with openings defined upward are used as information storage capacitative elements C, information storage capacitative elements of the type shown in FIG. 70 or 71 may be used.

Namely, FIG. 70 shows an example in which the lower electrodes are formed using the inner surface of the polycrystal silicon film 41 formed within the grooves 40 defined in the insulating film 39 employed in the embodiment 1 and the insulating film 39 is left behind without being removed by etching. In this case, the silicon nitride film 24 becomes unnecessary.

FIG. 71 shows an example in which lower electrodes each having a simple stacked structure are adopted. After the process step of FIGS. 26(*a*) to 26(*d*) in the embodiment 1, capacitive-electrode connecting holes 26 are buried and at the same time a polycrystal silicon film for forming each lower electrode is formed. The polycrystal silicon film and the polycrystal silicon film 36 employed in the embodiment 1 are subjected to patterning to thereby form the lower electrodes. Incidentally, sidewall spacers 38 are respectively configured as parts of the lower electrodes. Further, the silicon nitride film 24 is unnecessary even in the case of the present configuration.

Further, the method of forming the bit lines BL, according to the present embodiment, is not limited to a DRAM. The method can be applied to a logic circuit mixed with a DRAM, a flash memory built-in microcomputer with a DRAM, and other chips mixed with a system.

Effects obtained by a typical one of the features disclosed in the present application will be described briefly as follows:

(1) The width of an interconnection such as a bit line can be processed in a size reduced beyond the processing limit of photolithography.

(2) Short circuits in the bit line and the lower electrodes of the information storage capacitative elements can be prevented without increasing the height of each memory cell.

(3) The height of each memory cell can be reduced.

(4) A semiconductor integrated circuit device can be provided wherein the capacitance of each bit line is reduced, the sensitivity of detection is high and noise resistance is excellent.

(5) It is possible to provide a structure of a semiconductor integrated circuit device using simple flat or plane patterns suitable for photolithography and improve the processing margin.

(6) It is possible to provide a structure of a semiconductor integrated circuit device suitable for high integration of a DRAM and a method of manufacturing it, and improve reliability, yields and performance of the semiconductor integrated circuit device.

Incidentally, Japanese Patent Application Laid-Open No. Sho 6-338597 discloses a technique, which is related to the invention of the present application. The technique is for making bit lines of a DRAM thinner.

What is claimed is:

1. A method of manufacturing a semiconductor integrated circuit device, comprising the steps of:

(a) forming an MISFET having a gate electrode on a semiconductor substrate via a gate insulating film and semiconductor regions at both sides of said gate electrode in said semiconductor substrate;

(b) forming a first insulating film over said gate electrode and semiconductor regions, and forming a first groove in said first insulating film;

(c) forming a first conductive film in said first groove and over said first insulating film and removing said first conductive film over said first insulating film and leaving said first conductive film in said first groove in order to form a first conductive strip in said first groove, and said first conductive strip having an upper surface;

(d) forming a second insulating film over said first conductive strip and said first insulating film;

(e) etching said second insulating film to form a second groove;

(f) forming a third insulating film in said second groove and over said second insulating film;

(g) performing an anisotropic etching of said third insulating film and leaving a side spacer on said side wall of said second groove in order to form a third groove, wherein said upper surface of said first conductive strip is exposed in said third groove; and (h) forming a second conductive film in said third groove and over said second insulating film, then removing said second conductive film over said second insulating film and leaving said second conductive film in said third groove in order to form a second conductive strip, wherein said first insulating film is etched at the portion exposed from said sidewall spacer during said anisotropic etching step.

2. The method of manufacturing a semiconductor integrated circuit device according to claim 1, further comprising the step of, performing chemical mechanical polishing of a surface of said first insulating film after forming said first insulating film and before forming first groove.

3. The method of manufacturing a semiconductor integrated circuit device according to claim 1, further comprising the step of:

after step (d) and before step (e), performing chemical mechanical polishing of a surface of said second insulating film.

4. The method of manufacturing a semiconductor integrated circuit device according to claim 3 wherein, in step (h), said removing of said second conductive film over said second insulating film and leaving said second conductive film in said third groove in order to form a second conductive strip is accomplished by polishing said second conductive film.

5. The method of manufacturing a semiconductor integrated circuit device according to claim 1, further comprising the steps of:

(i) forming a fourth insulating film over said second conductive strip and said second insulating film;

(j) forming a third conductive strip over said fourth insulating film, wherein said third conductive strip is electrically connected to the other of said semiconductor regions;

(k) forming a dielectric film over said third conductive film; and (l) forming a fourth conductive strip over said dielectric film.

6. A method of manufacturing a semiconductor integrated circuit device, comprising the steps of:

(a) forming MISFETs each having a gate electrode on a semiconductor substrate via a gate insulating film and semiconductor regions at both sides of said gate electrode in said semiconductor substrate;

(b) forming a first insulating film over said gate electrode and semiconductor regions, and said first insulating film having first grooves;

(c) forming a first conductive film in said first grooves and over said first insulating film and removing said first conductive film over said first insulating film and leaving said first conductive film in said first grooves in order to form first conductive strips in said first grooves, and said first conductive strips each having an upper surface;

(d) forming a second insulating film over said first conductive strips and said first insulating film;

(e) etching said second insulating film to form a second groove, and said upper surfaces of said first conductive strips are exposed in said second groove;

(f) forming a third insulating film in said second groove and over said second insulating film;

(g) performing an anisotropic etching said third insulating film and leaving a side spacer on said side wall of said second groove in order to form a third groove, and said upper surfaces of said first conductive strips are exposed in said third groove;

(h) forming a second conductive film in said third groove and over said second insulating film removing said second conductive film over said second insulating film and leaving said second conductive film in said third groove in order to form a second conductive strip, wherein said first insulating film is etched at the portion exposed from said sidewall spacer during said anisotropic etching step.

7. A method of manufacturing a semiconductor integrated circuit device, comprising the steps of:

(a) forming an MISFET having a gate electrode on a semiconductor substrate via a gate insulating film and semiconductor regions at both sides of said gate electrode in said semiconductor substrate;

(b) forming a first insulating film over said gate electrode and semiconductor regions, and said first insulating film having an upper surface and a first groove;

(c) forming a first conductive film in said first groove and over said first insulating film and removing said first conductive film over said first insulating film and leaving said first conductive film in said first groove in order to form a first conductive strip in said first groove, and said first conductive strip having an upper surface;

(d) forming a second insulating film over said first conductive strip and said first insulating film;

(e) etching said second insulating film to form a second groove;

(f) forming a third insulating film in said second groove and over said second insulating film;

(g) performing an anisotropic etching of said third insulating film and leaving a side spacer on said side wall of said second groove in order to form a third groove having a bottom surface, wherein said upper surface of said first conductive strip are exposed in said third groove;

(h) forming a second conductive film in said third groove and over said second insulating film removing said second conductive film over said second insulating film and leaving said second conductive film in said third groove in order to form a second conductive strip, (i) wherein said first insulating film is etched at the portion exposed from said sidewall spacer during said anisotropic etching step.

* * * * *